United States Patent
Bergmann et al.

(10) Patent No.: US 9,634,197 B2
(45) Date of Patent: Apr. 25, 2017

(54) WAFER LEVEL PACKAGING OF MULTIPLE LIGHT EMITTING DIODES (LEDS) ON A SINGLE CARRIER DIE

(71) Applicant: Cree, Inc., Durham, NC (US)

(72) Inventors: Michael John Bergmann, Raleigh, NC (US); Kevin Haberern, Cary, NC (US); Alan Wellford Dillon, Bahama, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/801,743

(22) Filed: Mar. 13, 2013

(65) Prior Publication Data
US 2013/0264592 A1    Oct. 10, 2013

Related U.S. Application Data

(63) Continuation-in-part of application No. 13/608,397, filed on Sep. 10, 2012.
(Continued)

(51) Int. Cl.
*H01L 29/18* (2006.01)
*H01L 33/50* (2010.01)
(Continued)

(52) U.S. Cl.
CPC ............. *H01L 33/50* (2013.01); *H01L 24/14* (2013.01); *H01L 24/94* (2013.01); *H01L 33/0095* (2013.01); *H01L 33/22* (2013.01); *H01L 33/60* (2013.01); *H01L 24/81* (2013.01); *H01L 33/0079* (2013.01); *H01L 33/405* (2013.01); *H01L 33/62* (2013.01); *H01L 33/64* (2013.01);
(Continued)

(58) Field of Classification Search
CPC . H01L 2933/0041; H01L 24/14; H01L 24/94; H01L 2224/13008; H01L 2224/1403; H01L 2224/1607; H01L 2224/16112; H01L 2224/1613; H01L 2224/16135; H01L 2224/16165; H01L 2224/81193; H01L 2224/94
USPC ..................................................... 257/91, 98
See application file for complete search history.

(56) References Cited

U.S. PATENT DOCUMENTS 6,791,119 B2   9/2004   Slater, Jr. et al.
6,889,902 B2   5/2005   Rumsey
(Continued)

OTHER PUBLICATIONS

Lowes et al., "LED Package With Encapsulant Having Planar Surfaces", U.S. Appl. No. 13/649,052, filed Oct. 10, 2012.
(Continued)

*Primary Examiner* — Matthew Landau
*Assistant Examiner* — Mark Hatzilambrou
(74) *Attorney, Agent, or Firm* — Myers Bigel, P.A.

(57) ABSTRACT

An LED wafer includes LED dies on an LED substrate. The LED wafer and a carrier wafer are joined. The LED wafer that is joined to the carrier wafer is shaped. Wavelength conversion material is applied to the LED wafer that is shaped. Singulation is performed to provide multiple LED dies that are joined to a single carrier die. The multiple LED dies on the single carrier die are connected in series and/or in parallel by interconnection in the LED dies and/or in the single carrier die. The singulated devices may be mounted in an LED fixture to provide high light output per unit area. Related devices and fabrication methods are described.

16 Claims, 65 Drawing Sheets

Related U.S. Application Data

(60) Provisional application No. 61/621,746, filed on Apr. 9, 2012, provisional application No. 61/727,524, filed on Nov. 16, 2012.

(51) Int. Cl.
*H01L 33/60* (2010.01)
*H01L 23/00* (2006.01)
*H01L 33/22* (2010.01)
*H01L 33/00* (2010.01)
*H01L 33/40* (2010.01)
*H01L 33/62* (2010.01)
*H01L 33/64* (2010.01)

(52) U.S. Cl.
CPC .......... *H01L 2224/131* (2013.01); *H01L 2224/13013* (2013.01); *H01L 2224/13014* (2013.01); *H01L 2224/13147* (2013.01); *H01L 2224/13639* (2013.01); *H01L 2224/1403* (2013.01); *H01L 2224/1411* (2013.01); *H01L 2224/14051* (2013.01); *H01L 2224/14131* (2013.01); *H01L 2224/14155* (2013.01); *H01L 2224/14177* (2013.01); *H01L 2224/81193* (2013.01); *H01L 2224/81203* (2013.01); *H01L 2224/81805* (2013.01); *H01L 2224/81895* (2013.01); *H01L 2224/94* (2013.01); *H01L 2924/01322* (2013.01); *H01L 2924/12041* (2013.01); *H01L 2924/12042* (2013.01)

(56) References Cited

U.S. PATENT DOCUMENTS

| | | | |
|---|---|---|---|
| 7,009,199 | B2 | 3/2006 | Hall |
| 7,329,905 | B2 | 2/2008 | Ibbetson et al. |
| 7,858,403 | B2 | 12/2010 | Hiller et al. |
| 7,977,686 | B2 | 7/2011 | Ibbetson et al. |
| 8,575,493 | B1 * | 11/2013 | Xu .................. H01L 24/13 174/255 |
| 2002/0068373 | A1 | 6/2002 | Lo et al. |
| 2003/0077875 | A1 | 4/2003 | Mandelman et al. |
| 2004/0227148 | A1 * | 11/2004 | Camras et al. .......... 257/99 |
| 2004/0229418 | A1 | 11/2004 | Hashimoto |
| 2004/0245633 | A1 * | 12/2004 | Alter .................. H01L 23/3114 257/738 |
| 2006/0189098 | A1 | 8/2006 | Edmond |
| 2006/0243986 | A1 | 11/2006 | Wall |
| 2007/0114557 | A1 | 5/2007 | Shelton et al. |
| 2007/0211449 | A1 | 9/2007 | Holman et al. |
| 2008/0006838 | A1 | 1/2008 | Hattori et al. |
| 2008/0179611 | A1 | 7/2008 | Chitnis et al. |
| 2009/0057690 | A1 | 3/2009 | Chakraborty |
| 2009/0179207 | A1 | 7/2009 | Chitnis et al. |
| 2009/0242897 | A1 | 10/2009 | Bergmann et al. |
| 2009/0283787 | A1 * | 11/2009 | Donofrio ............. H01L 33/405 257/98 |
| 2009/0321748 | A1 | 12/2009 | Lee |
| 2009/0321769 | A1 * | 12/2009 | Keller et al. ............ 257/98 |
| 2010/0067241 | A1 | 3/2010 | Lapatovich et al. |
| 2010/0120183 | A1 * | 5/2010 | Kim et al. .............. 438/29 |
| 2010/0224904 | A1 | 9/2010 | Lee et al. |
| 2010/0244060 | A1 * | 9/2010 | Lee et al. ............... 257/88 |
| 2010/0244078 | A1 * | 9/2010 | Hsu et al. ............... 257/98 |
| 2010/0276706 | A1 | 11/2010 | Herrmann |
| 2010/0283077 | A1 | 11/2010 | Slater, Jr. et al. |
| 2011/0018013 | A1 | 1/2011 | Margalith et al. |
| 2011/0031502 | A1 | 2/2011 | Bergmann et al. |
| 2011/0051448 | A1 * | 3/2011 | Owada .................. 362/520 |
| 2011/0063849 | A1 | 3/2011 | Alexander et al. |
| 2011/0068701 | A1 | 3/2011 | van de Ven et al. |
| 2011/0073881 | A1 | 3/2011 | Chakraborty |
| 2011/0198648 | A1 | 8/2011 | Jung |
| 2011/0215360 | A1 | 9/2011 | Wang |
| 2011/0233574 | A1 | 9/2011 | Lee et al. |
| 2011/0266569 | A1 | 11/2011 | Basin et al. |
| 2011/0286214 | A1 | 11/2011 | Quinlan et al. |
| 2012/0217530 | A1 | 8/2012 | Edmond et al. |
| 2013/0052759 | A1 | 2/2013 | Odnoblyudov et al. |
| 2013/0175560 | A1 | 7/2013 | Odnoblyudov et al. |
| 2013/0193468 | A1 | 8/2013 | Hussell et al. |
| 2013/0329425 | A1 | 12/2013 | Lowes et al. |

OTHER PUBLICATIONS

Cree, Inc., "Cree® XLamp® XT-E LEDs", Product Family Data Sheet #CLD-DS41 Rev 6, 2011-2012, 16 pp.
Cree, Inc., "Cree® XLamp® XM-L HVW LEDs", Product Family Data Sheet #CLD-DS44 Rev, 2011-2012, 10 pp.
Cree, Inc., "Cree® XLamp® XB-D White LEDs", Product Family Data Sheet #CLD-DS45 Rev 4, 2011-2012, 12 pp.
Cree, Inc. "XLamp XP-E High-Efficiency White", downloaded Nov. 15, 2012 from http://www.cree.com/led-components-and-modules/products/xlamp/discrete-nondirectional/xlamp-xpe-hew, 2 pp.
Cree, Inc., "Cree® XLamp® XP-E High-Efficiency White LEDs", Product Family Data Sheet #CLD-DS34 Rev 3A, 2010-2012, 13 pp.
McClear, "An Integrated Approach to SSL Manufacturing" [PowerPoint Presentation], Jun. 24, 2009, 21 pp.
Welsh, "Solid State Lighting Manufacturing Roadmap" [PowerPoint Presentation], 2009 *DOE Solid-State Lighting Manufacturing Workshop*, Vancouver, WA, Jun. 24, 2009, 19pp.
Yole, "LED Cost and Technology Trends: How to enable massive adoption in general lighting" [PowerPoint Presentation], *Semicon West 2011*, Moscone Center, San Francisco, Jun. 13, 2011, 31 pp.
U.S. Appl. No. 61/658,271, filed Jun. 11, 2012.
U.S. Appl. No. 61/660,231, filed Jun. 15, 2012.
International Search Report and Written Opinion Corresponding to International Application No. PCT/US2013/033685; Date of Mailing: Jun. 18, 2013; 15 Pages.
International Search Report and Written Opinion Corresponding to International Application No. PCT/US2013/033696; Date of Mailing: Aug. 2, 2013; 12 Pages.

* cited by examiner

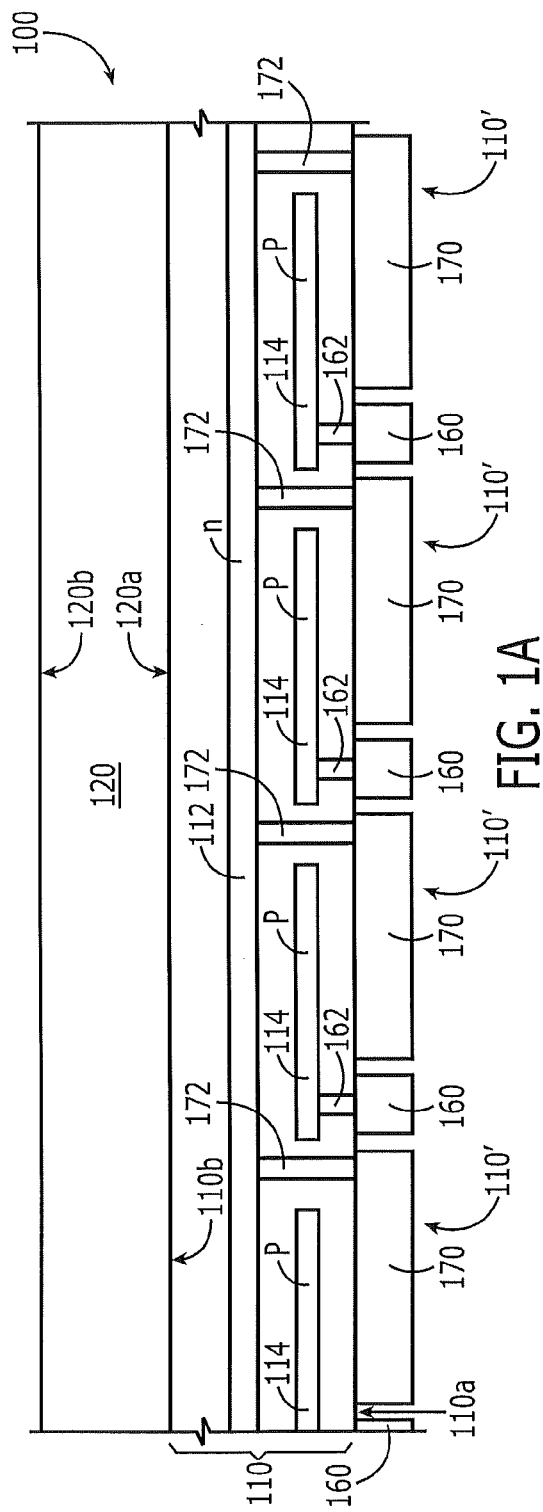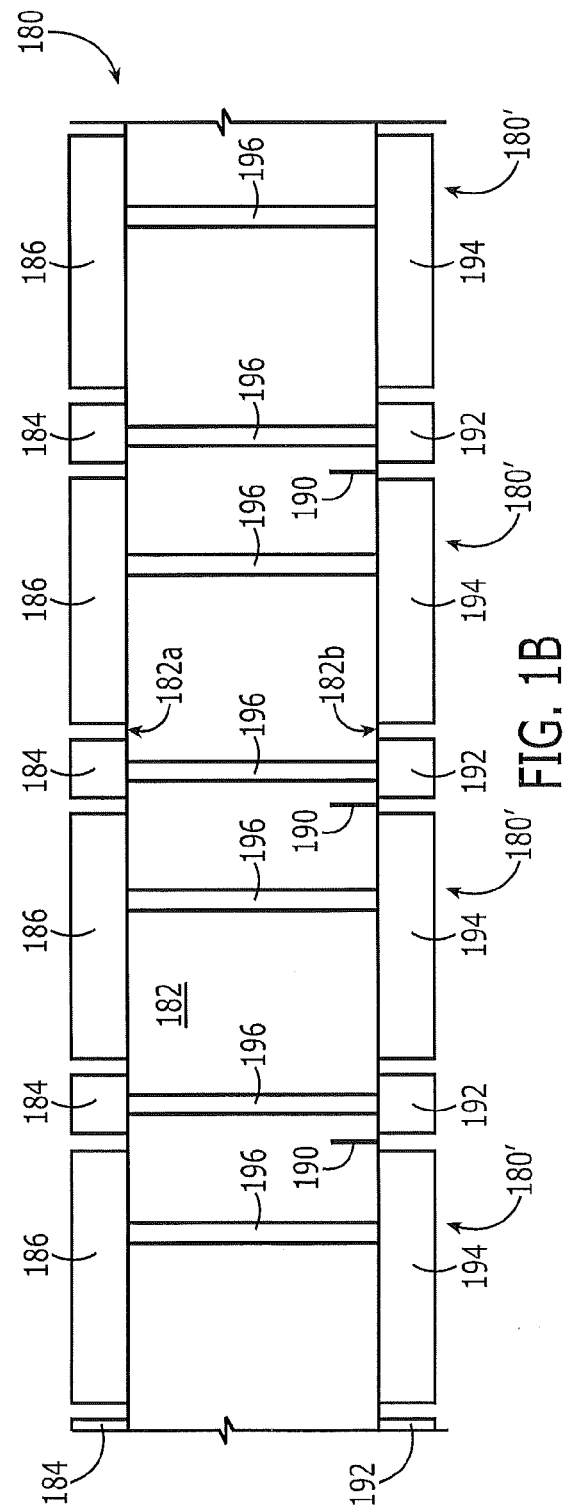

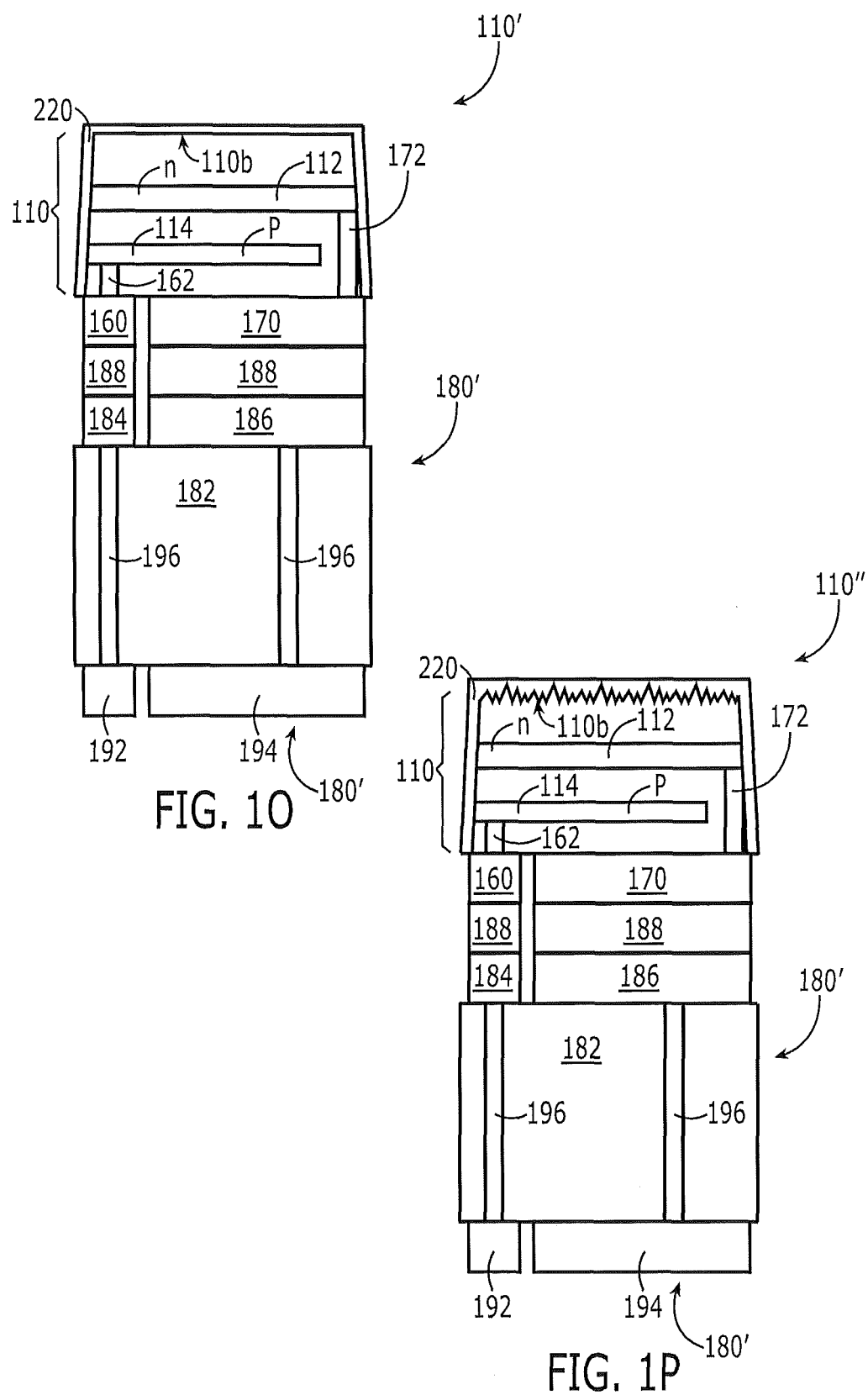

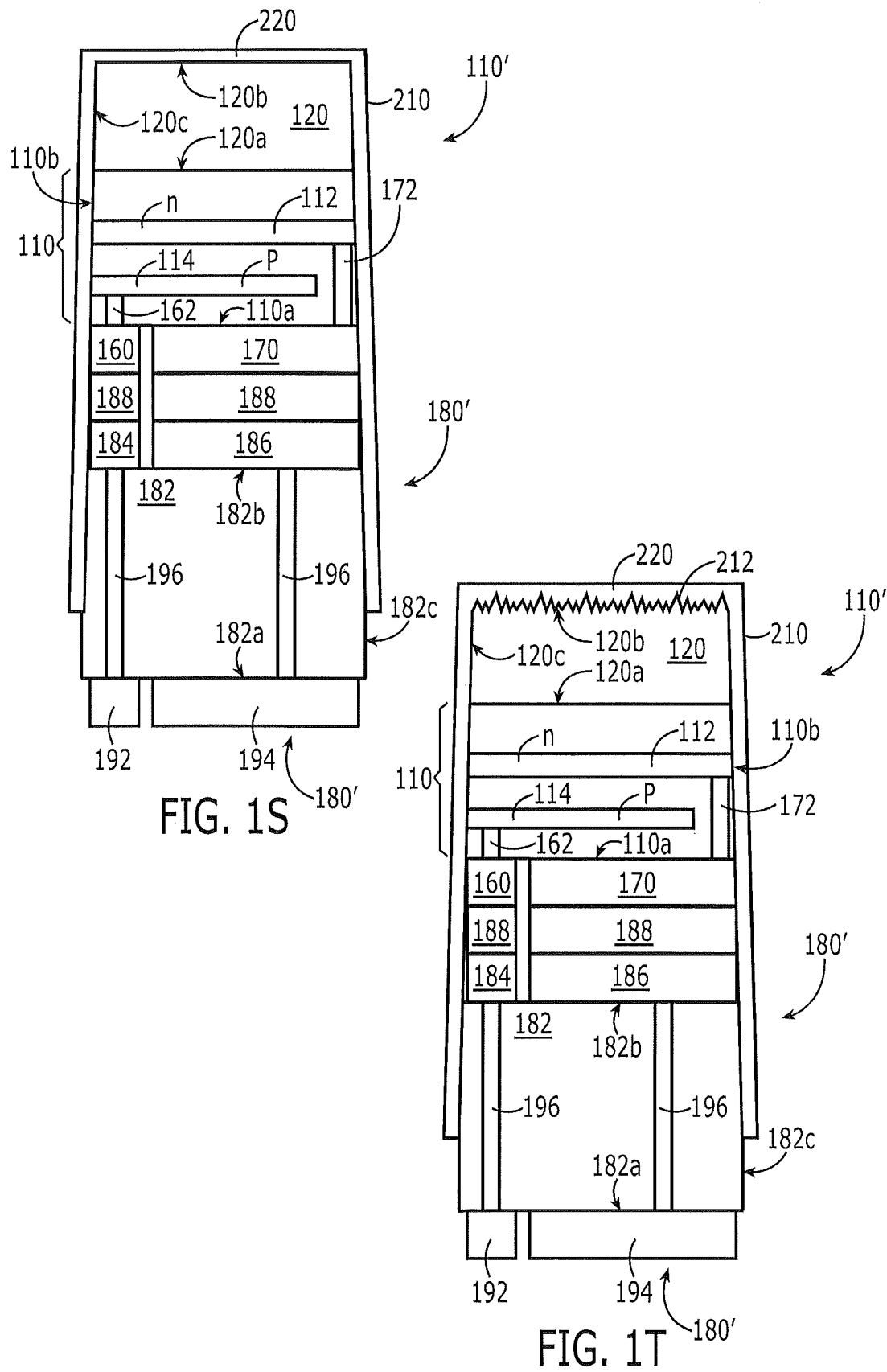

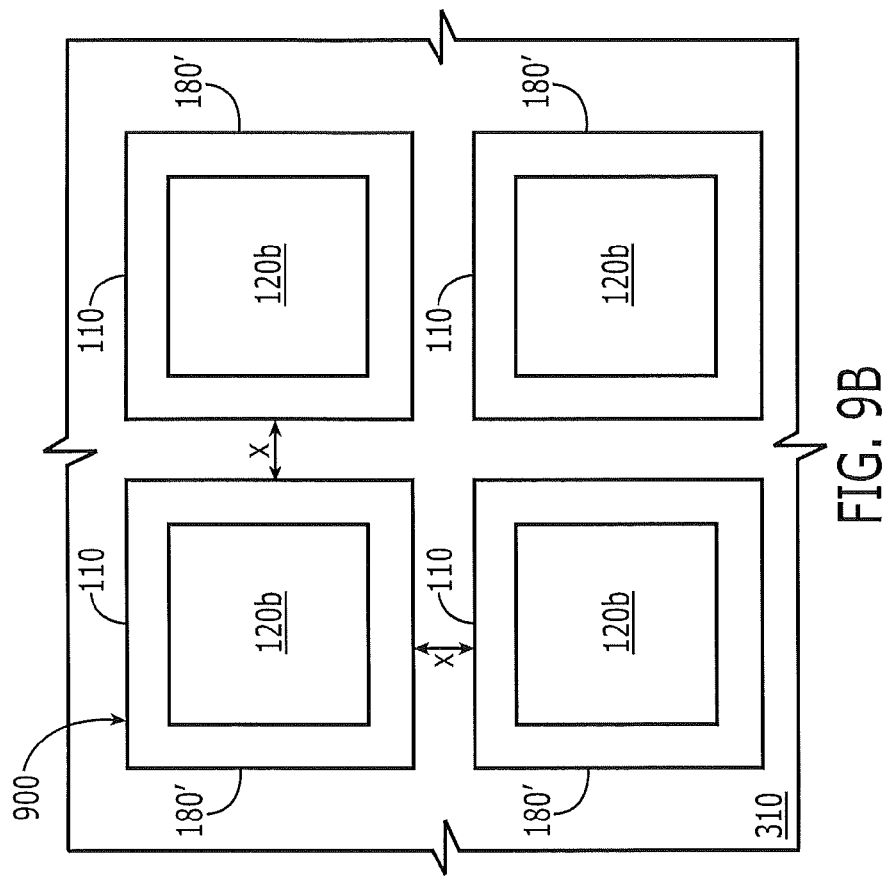
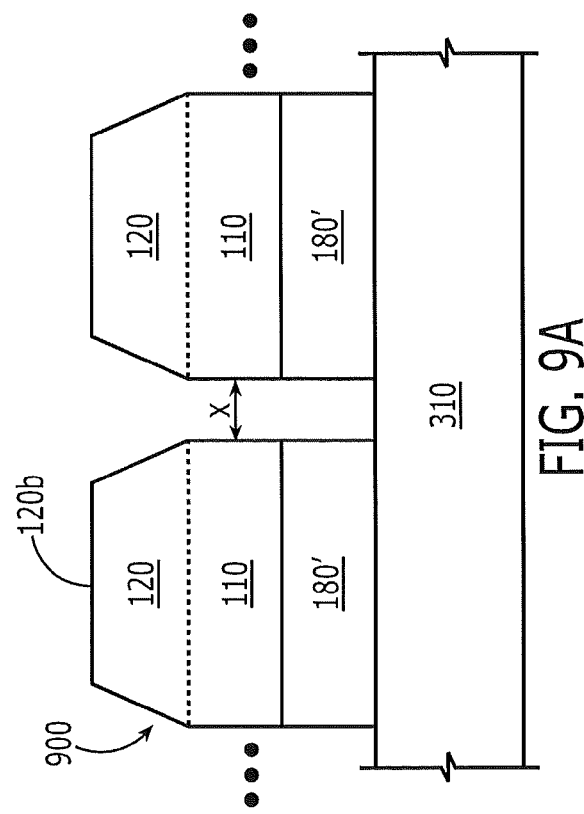
FIG. 9B
FIG. 9A 0.7mm

Carrier ~100um

FIG. 33
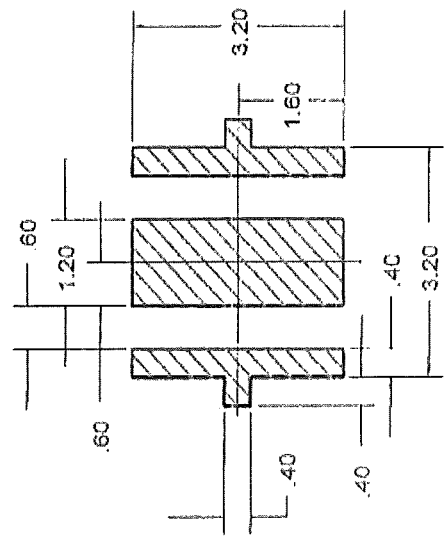
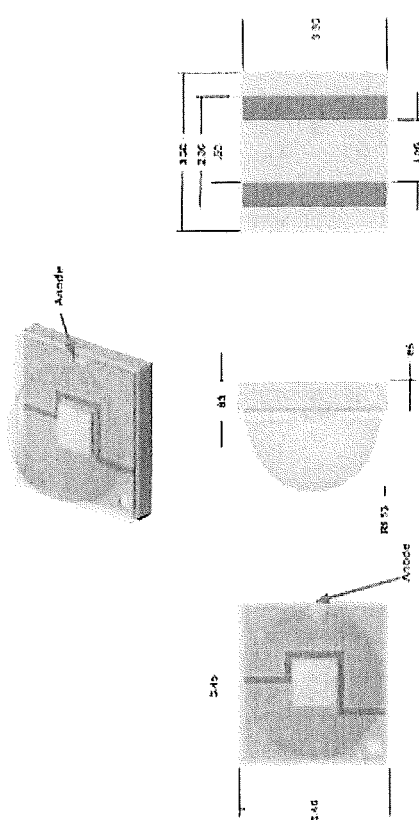
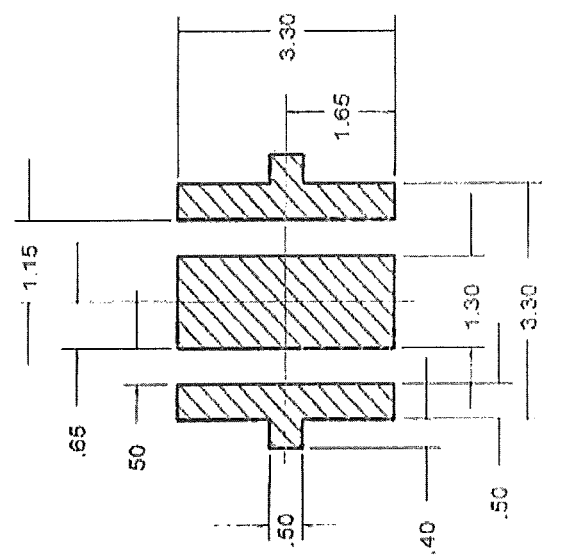

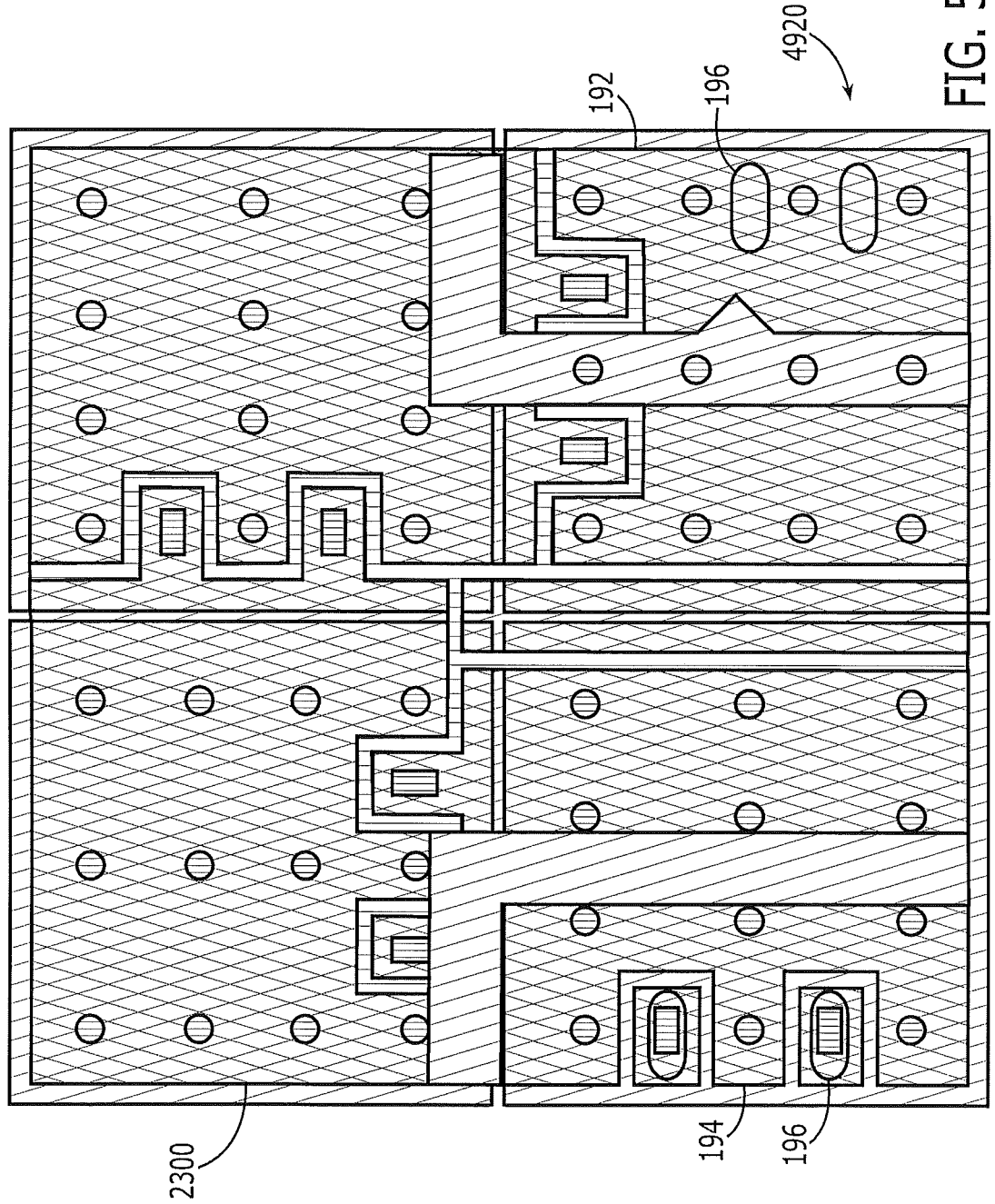

WAFER LEVEL PACKAGING OF MULTIPLE LIGHT EMITTING DIODES (LEDS) ON A SINGLE CARRIER DIE

CROSS-REFERENCE TO RELATED APPLICATIONS

This application is a continuation-in-part of U.S. patent application Ser. No. 13/608,397, filed Sep. 10, 2012, entitled Wafer Level Packaging of Light Emitting Diodes (LEDs), which itself claims the benefit of provisional Patent Application No. 61/621,746, filed Apr. 9, 2012, entitled Wafer Level Packaging of Light Emitting Diodes (LEDs), assigned to the assignee of the present invention, the disclosures of both of which are hereby incorporated herein by reference in their entirety as if set forth fully herein. This application also claims the benefit of provisional Patent Application No. 61/727,524, filed Nov. 16, 2012, entitled Wafer Level Packaging of Multiple Light Emitting Diodes (LEDs) on a Single Carrier Die, assigned to the assignee of the present invention, the disclosure of which is hereby incorporated herein by reference in its entirety as if set forth fully herein.

BACKGROUND

This invention relates to light emitting devices and assemblies and methods of manufacturing the same, and more particularly, to Light Emitting Diodes (LEDs) and assemblies thereof.

LEDs are widely known solid-state lighting elements that are capable of generating light upon application of voltage thereto. LEDs generally include a diode region having first and second opposing faces, and include therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. Finally, the light radiated by the LED may be in the visible or ultraviolet (UV) regions, and the LED may incorporate wavelength conversion material such as phosphor.

LEDs are increasingly being used in lighting/illumination applications, with a goal being to provide a replacement for the ubiquitous incandescent light bulb.

SUMMARY

Various embodiments described herein provide methods of fabricating a plurality of Light Emitting Diodes (LEDs). An LED wafer is provided that includes a plurality of LED dies on an LED substrate, the plurality of LED dies including anode and cathode contacts on a face thereof that is remote from the LED substrate. A carrier wafer is also provided. The LED wafer and the carrier wafer are joined, so that the anode and cathode contacts are adjacent the carrier wafer and the LED substrate is remote from the carrier wafer. The LED wafer that is joined to the carrier wafer is shaped. Wavelength conversion material is applied to the LED wafer that is shaped. Finally, singulation is performed on the carrier wafer and the LED wafer, to provide a plurality of LED dies, a respective one of which is joined to a respective carrier die, and having a length and width similar to the carrier die to which it is joined.

In some embodiments, the carrier wafer is scribed to define the plurality of carrier dies that are of similar length and width as the plurality of LED dies. The scribing may be performed before or after the joining. In other embodiments, the shaping comprises beveling the LED substrate. In still other embodiments, the shaping comprises texturing the LED substrate. In yet other embodiments, the shaping comprises thinning or removing the LED substrate, and the thinning or removing may be followed by texturing the LED dies. In yet other embodiments, the shaping comprises beveling the LED dies.

In some embodiments, singulating is followed by removing the respective carrier die. In other embodiments, singulating is followed by mounting at least one of the LED chips directly on a light fixture mounting board and mounting the light fixture mounting board including the at least one of the LED chips mounted directly thereon, in a light fixture housing to provide a light fixture. In still other embodiments, the mounting at least one of the LED dies directly on a light fixture mounting board and the mounting the light fixture mounting board in a light fixture housing are performed without providing a dome on the at least one of the LED dies.

In still other embodiments, the carrier wafer includes arrays of contacts on opposing faces thereof and an array of through-vias that electrically connect respective contacts on the opposing faces to one another. In other embodiments, the arrays of contacts on the opposing faces have different dimensions therebetween.

LEDs according to various other embodiments described herein may include a semiconductor LED die that includes an LED epi region and a carrier die that is electrically connected to the LED die, wherein the LED epi region and the carrier die have sides that are within 100 μm of one another in length. In some embodiments, the LED epi region and the carrier die have same side lengths. In other embodiments, the LED produces at least 100, and in some embodiments at least 150, and in yet other embodiments at least about 200 lumens, of cool white light in some embodiments, per watt per square millimeter. In other embodiments, the LED produces at least 30 and in some embodiments at least 70, and in yet other embodiments at least about 140 lumens of warm white light per watt per square millimeter. In some embodiments, an anode and a cathode are both provided on the carrier die, remote from the LED die, and in other embodiments, the LED die further includes a substrate.

Light emitting diodes according to other embodiments can comprise a semiconductor LED die that includes an LED epi region and a carrier die that is electrically connected to the LED die, wherein the LED epi region and the carrier dies have sides that are within about 15% of one another in length. In other embodiments, the LED epi region and carrier die have areas that are within 70% of one another, within 85% of one another, or have same areas. In some embodiments, the LED epi region and the carrier die have the same side lengths. In still other embodiments, the LED may produce at least 45, and in some embodiments at least 100, and in other embodiments at least about 200 lumens, of cool white light in some embodiments, per watt per square millimeter. In still other embodiments, the LED may produce at least 30, and in some embodiments at least 70, and in other embodiments at least about 140 lumens of warm white light. In some embodiments, an anode and a cathode are both provided on the carrier die, remote from the LED die, and in other embodiments, the LED die further includes a substrate.

In still other embodiments, an LED comprises a semiconductor LED die and a carrier die that is electrically connected to the LED die, wherein the LED produces at least 45 lumens, of cool white light in some embodiments, per watt per square millimeter of area of the carrier die. In some embodiments, the LED produces at least 100 lumens, and in other embodiments at least about 200 lumens, of cool white light in some embodiments, per watt per square millimeter of the area of the carrier die. In still other embodiments, the LED produces at least 30 lumens, and in other embodiments at least 70 lumens, and in still other embodiments at least about 140 lumens of warm white light per square millimeter of area of the carrier die. In still other embodiments, the LED produces at least 45 lumens, and in some embodiments at least 100 lumens, and in other embodiments at least about 200 lumens, of cool white light in some embodiments, per watt per cubic millimeter of volume of the LED. In yet other embodiments, the LED produces at least 30 lumens, and in some embodiments at least 70 lumens, and in other embodiments at least about 140 lumens of warm white light per cubic millimeter of volume of the LED. In some embodiments, an anode and a cathode are both provided on the carrier die, remote from the LED die, and in other embodiments, the LED die further includes a substrate.

LEDs according to other embodiments include a semiconductor LED die and a carrier die that is electrically connected to the LED die, wherein the carrier die has an area of less than about 2 square millimeters, and in some embodiments less than about 1 square millimeter, and in other embodiments, an area of about 0.5 square millimeter or less. In any of these embodiments, the LED may have a height of about one millimeter. In still other embodiments, an LED comprises a semiconductor LED die and a carrier die that is electrically connected to the LED die, wherein the LED has a height of less than about 1.5 millimeters, and in some embodiments less than about 1 millimeter.

LEDs according to still other embodiments may include a semiconductor LED die that includes inner and outer faces and a plurality of sidewalls therebetween, and a carrier die that includes inner and outer faces and a plurality of sidewalls therebetween, wherein the inner face of the LED die is electrically connected to the inner face of the carrier die. A phosphor layer extends directly on the outer face of the LED die, directly on the plurality of sidewalls of the LED die and directly on the plurality of sidewalls of the carrier die. In some embodiments, the phosphor layer covers the outer face of the LED die and the plurality of sidewalls of the LED die and partially covers the plurality of sidewalls of the carrier die. In yet other embodiments, the phosphor layer protrudes beyond the carrier die in a direction along the faces of the carrier die.

Yet other embodiments may include a protective layer on the phosphor layer, remote from the LED die and the carrier die. In some embodiments, the phosphor layer comprises phosphor particles in a silicone binder, and the protective layer comprises a silicon layer that is free of the phosphor particles therein.

In still other embodiments, the outer face of the carrier die is configured for surface mounting of the LED. Moreover in some embodiments, the outer face of the carrier die includes a feature, such as a notch in a contact, configured to allow identification of an orientation of the LED.

LEDs according to still other embodiments may include a carrier, an LED epi region, a primary optic distinct from the LED epi region and a phosphor layer, wherein the carrier, LED epi region, primary optic and phosphor layer have outer edges that are within 100 μm of one another, and in other embodiments have same size outer edges. As used herein, a "primary optic" means an optical element that causes the luminous flux from the LED to assume a specific illumination pattern. In some embodiments described herein, a substrate of the LED epi region may assume the role of a primary optic.

LEDs according to any of the embodiments described herein may be combined with a light fixture mounting board on which the carrier die is directly mounted and a light fixture housing in which the light fixture mounting board is mounted, to provide a light fixture. The light fixture is free of a dome between the carrier die and the light fixture housing.

An LED light fixture according to various embodiments described herein may include a light fixture mounting board, a plurality of LEDs directly mounted on the light fixture mounting board and a light fixture housing in which the light fixture mounting board including the plurality of LEDs thereon is mounted. The light fixture is free of a dome between a respective LED and the light fixture housing. The plurality of LEDs may comprise a plurality of semiconductor LED dies that are directly mounted on the light fixture mounting board without a carrier die therebetween.

Finally, methods of manufacturing LED light fixtures according to other embodiments described herein may include fabricating a plurality of LED wafers including wavelength converting material thereon at chip factory, dicing the LED wafers including the wavelength converting material thereon to produce a plurality of LED dies, and mounting the LED dies on a light fixture mounting board at a module factory or at a fixture factory and mounting the light fixture mounting board in a light fixture at a fixture factory. The fabricating, the dicing and the mounting bypass LED packaging factories. In these embodiments, the chip, module and fixture factories do not perform an operation of providing domes on the plurality of LED dies.

LED chips may be fabricated according to other embodiments described herein by providing an LED wafer that includes a plurality of LED dies, the plurality of LED dies including anode and cathode contacts on a face thereof, and providing a carrier wafer having first and second opposing faces, a plurality of internal contacts on the first face that are configured to electrically connect the anode and cathode contacts of at least two of the LED dies in series and/or in parallel when the carrier wafer is joined to the LED wafer, and a plurality of external anode contacts and a plurality of external cathode contacts. The LED wafer and the carrier wafer are joined so that the anode and cathode contacts of the LED dies are adjacent the first face of the carrier wafer and the plurality of internal contacts on the first face electrically connect the anode and cathode contacts of the at least two of the LED dies in series and/or in parallel. The LED wafer and the carrier wafer that have been joined are singulated to provide a plurality of LED chips, a respective one of which includes a single carrier die, a respective single carrier die including a plurality of LED dies thereon that are electrically connected in series and/or in parallel, at least one of the plurality of the external anode contacts and at least one of the plurality of external cathode contacts.

In some embodiments, the LED wafer includes the plurality of LED dies on an LED substrate. Moreover, at least a portion of the LED substrate may be removed in some embodiments. In other embodiments, the LED wafer that is joined to the carrier wafer is shaped before the singulating. In still other embodiments, wavelength conversion material is applied to the LED wafer between the joining and the singulating. In yet other embodiments, the singulating is followed by mounting at least one of the LED chips directly on a light fixture mounting board, and mounting the light fixture mounting board including the at least one of the LED chips mounted directly thereon in a light fixture housing to provide a light fixture. The housing may be vehicle having headlight or taillight housing. Finally, in any of the above embodiments, the carrier wafer may further comprise at least one external thermal contact on the second face that is not electrically connected to the external anode contact or to the external cathode contact.

LED chips according to various embodiments, described herein may include a plurality of dies, a respective one of which includes an anode contact and a cathode contact on a face thereof. A carrier die is also provided having first and second opposing faces, a plurality of internal contacts on the first face that are configured to electrically connect the anode and cathode contacts of the plurality of LED dies in series and/or in parallel when the carrier die is electrically connected to the plurality of LED dies, and an external anode contact and an external cathode contact on the second face. The plurality of LED dies and the carrier die are joined to one another so that the anode and cathode contacts of the LED dies are adjacent the first face of the carrier die and the plurality of internal contacts on the first face electrically connect the anode and cathode contacts of the plurality of LED dies in series and/or in parallel.

In some embodiments, a respective LED die includes an LED epi region on an LED substrate. Moreover, a respective LED may include a sidewall, at least a portion of which is oblique to the face of the LED die. In other embodiments, a face of a respective LED die that is opposite the anode and cathode contacts includes a textured surface. In still other embodiments, a face of a respective LED die that is opposite the anode and cathode contacts includes a wavelength conversion material thereon. In yet other embodiments, a face of a respective LED die that is opposite the anode and cathode contacts includes a protective material thereon. Various combinations and sub combinations of texturing, wavelength conversion material and protective material may be provided. In still other embodiments, a mounting substrate is provided on the carrier die, remote from the plurality of LED dies. A dome is also provided that extends from a face of the mounting substrate, across the carrier die and the plurality of LED dies. Multiple domes also may be provided, a respective one of which is on a respective LED die, remote from the anode and cathode contacts thereof. Multiple lenses may also be provided on a respective die, remote from the anode and cathode contacts thereof. The LED chip may be combined with a light fixture housing, as was described above. Finally, in any of the embodiments described herein, the carrier die may comprise silicon.

LED chips according to various other embodiments described herein can electrically connect a plurality of LED dies in series and/or in parallel using a patterned internal interconnection layer that is in the LED substrate. LED chips according to these embodiments may comprise an LED substrate including a plurality of LED dies, a respective LED die including an anode and a cathode. A patterned internal interconnection layer is provided in the plurality of LED dies that is configured to selectively electrically connect the anodes and cathodes of the plurality of LED dies in series and/or in parallel. An LED die anode contact is electrically connected to at least one of the anodes. An LED die cathode contact is electrically connected to at least one of the cathodes. In some embodiments, the patterned internal interconnection layer comprises a patterned internal metal layer that selectively extends between the plurality of LED dies to selectively electrically connect the anodes and cathodes of the plurality of LED dies in series and/or in parallel.

In some embodiments, the LED substrate includes beveled sidewalls between adjacent LED dies. Moreover, the LED substrate may include a beveled edge at a periphery thereof. A wavelength conversion material may be provided on the LED substrate remote from the carrier substrate, and extending onto the beveled sidewalls between adjacent LED dies. The wavelength conversion material layer may also extend onto the beveled edge at the periphery of the LED substrate. In other embodiments, the wavelength conversion material layer further extends onto a sidewall of the LED die at the periphery of the LED substrate.

LED chips according to any of the embodiments described above may also include a carrier die having first and second opposing faces, the carrier die having a first anode contact and a first cathode contact on the first face and a second anode contact and a second cathode contact on the second face. The carrier die is joined to the LED substrate so that the plurality of LED dies are adjacent the first face, the first anode contact is electrically connected to the LED die anode contact and the first cathode contact is electrically connected to the LED die cathode contact. A mounting substrate may also be provided on the second face of the carrier die and electrically connected to the second anode contact and the second cathode contact. The LED chip may also be combined with a light fixture housing in which the carrier die is mounted to provide a light fixture. The carrier die may also comprise at least one external thermal contact on the first and/or second face. The carrier die may comprise silicon in some embodiments and may also include a reflector in other embodiments.

A plurality of LED chips may be fabricated according to various embodiments described herein by providing an LED wafer that includes a plurality of LED dies, a respective LED die including an anode and a cathode. The LED wafer further includes a patterned internal interconnection layer in the plurality of LED dies that is configured to selectively electrically connect the respective anodes and cathodes of at least two of the LED dies in series and/or in parallel. The LED wafer further includes a plurality of LED die anode contacts and a plurality of LED die cathode contacts, a respective pair of which is electrically connected to a respective anode and cathode of a respective at least two of the LED dies that are connected in series and/or in parallel. A carrier wafer is also provided, the carrier wafer having first and second opposing faces, a plurality of first contacts on the first face, a respective pair of which is configured to electrically connect to a respective pair of the ED die anode and cathode contacts of the respective at least two of the LED dies that are connected in series and/or in parallel when the carrier wafer is joined to the LED wafer, and a plurality of second contacts on the second face, a respective pair of which is electrically connected to a respective pair of the first contacts. The LED wafer and the carrier wafer are joined so that the LED die anode and cathode contacts are adjacent the first face of the carrier wafer and the respective pairs of the LED die anode and cathode contacts are electrically connected to a respective pair of the first contacts on the first face. The LED wafer and the carrier wafer that have been joined are then singulated to provide a plurality of LED chips, a respective one of which includes a single carrier die, a respective single carrier die including a plurality of LED dies thereon that are electrically connected in series and/or in parallel.

In some embodiments, the LED wafer includes a plurality of LED dies on a substrate, and the substrate is shaped between the joining and the singulating. In other embodiments, after the shaping, a wavelength conversion material is applied to the LED wafer that is joined to the carrier wafer, prior to singulating. In other embodiments, singulating may be followed by mounting at least one of the LED chips directly on a light fixture mounting board and mounting the light fixture mounting board including the at least one of the LED chips mounted directly thereon in a light fixture housing to provide a light fixture.

In some embodiments, the shaping of the substrate comprises beveling the substrate between adjacent ones of the LED dies. In some embodiments, the LED wafer includes a plurality of first trenches between adjacent LED dies that are connected in series and/or in parallel and a plurality of second trenches between groups of adjacent LEDs that are connected in series or in parallel, wherein the second trenches are deeper than the first trenches. In these embodiments, the beveling may expose the plurality of second trenches, but not expose the plurality of first trenches. Moreover, in these embodiments, the beveling may be followed by applying wavelength conversion material to the substrate that was beveled so that the wavelength conversion material extends on a face of the substrate that is remote from the carrier wafer, onto beveled surfaces of the substrate that were exposed by the beveling and onto the plurality of second trenches that were exposed. The wavelength conversion material may be applied by spraying in some embodiments.

The LED wafer itself may be fabricated by fabricating a plurality of the anodes and cathodes for the plurality of LED dies on the LED wafer, forming a first insulating layer on the plurality of anodes and cathodes, forming the patterned internal interconnection layer on the first insulating layer that is configured to selectively electrically connect the respective anodes and cathodes of at least two of the LED dies in series and/or in parallel, forming a second insulating layer on the patterned internal interconnection layer and forming the plurality of LED die anode contacts and LED die cathode contacts on the second insulating layer.

Moreover, prior to forming of the patterned internal interconnection layer, a plurality of first trenches may be formed between adjacent LED dies that are connected in series and/or in parallel. In these embodiments, the patterned internal interconnection layer may be formed to extend across the first trenches between the anodes and the cathodes of the at least two of the LED dies that are selectively connected in series and/or in parallel. In other embodiments, a plurality of second trenches are also formed between groups of LED dies that are connected in series and/or in parallel. Moreover, in other embodiments, the plurality of second trenches between the groups of LED dies that are connected in series and/or in parallel are formed deeper than the plurality of first trenches between adjacent LED dies that are connected in series and/or in parallel.

In general, methods of fabricating LED chips according to various embodiments described herein can comprise providing an LED wafer that includes a plurality of LED dies, the plurality of LED dies including anode and cathode contacts on a face thereof; and providing a carrier wafer having first and second opposing faces, a plurality of internal contacts on the first face and at least one external anode contact and external cathode contact on the second face, wherein the LED wafer and/or the carrier wafer are configured to electrically connect the anode and cathode contacts of at least two of the LED dies in series and/or in parallel. The LED wafer and the carrier wafer are joined so that the anode and cathode contacts of the LED dies are adjacent the first face of the carrier wafer. The LED wafer and the carrier wafer that have been joined are then singulated to provide a plurality of LED chips, a respective one of which includes a single carrier die, a respective single carrier die including a plurality of LED dies thereon that are electrically connected in series and/or in parallel, an external anode contact and an external cathode contact. In some embodiments, the plurality of LED dies includes a patterned internal interconnection layer that is configured to selectively electrically connect the anode and cathode contacts of the at least two of the LED dies in series and/or in parallel. In other embodiments, the carrier wafer includes a plurality of contacts that are configured to selectively electrically connect the anode and cathode contacts of the at least two of the LED dies in series and/or in parallel.

Moreover, in general, LED chips according to various embodiments described herein include a plurality of LED dies in a common substrate, a respective one of which includes an anode contact and a cathode contact on a face thereof; and a carrier die having first and second opposing faces, a plurality of internal contacts on the first face and an external anode contact and an external cathode contact on the second face, wherein the plurality of LED dies in the common substrate and/or the carrier die is configured to electrically connect the anode and cathode contacts of the plurality of LED dies in series and/or in parallel. The plurality of LED dies and the carrier die are joined to one another so that the anode and cathode contacts of the LED dies are adjacent the first face of the carrier die and the anode and cathode contacts of the plurality of LED dies are connected in series and/or in parallel. In some embodiments, the plurality of LED dies includes a patterned internal interconnection layer that is configured to selectively electrically connect the anode and cathode contacts of the at least two of the LED dies in series and/or in parallel. In other embodiments, the carrier wafer includes a plurality of contacts that are configured to selectively electrically connect the anode and cathode contacts of the at least two of the LED dies in series and/or in parallel.

BRIEF DESCRIPTION OF THE DRAWINGS

FIG. 9A is a cross-section of a mounting board and a plurality of LED dies mounted thereon according to various embodiments described herein.

FIG. 9B is a plan view of FIG. 9A.

FIG. 33 includes photographs of a packaged LED component.

FIGS. 50 and 52 are bottom views of LED chips according to various embodiments described herein.

DETAILED DESCRIPTION

Figure 1C:
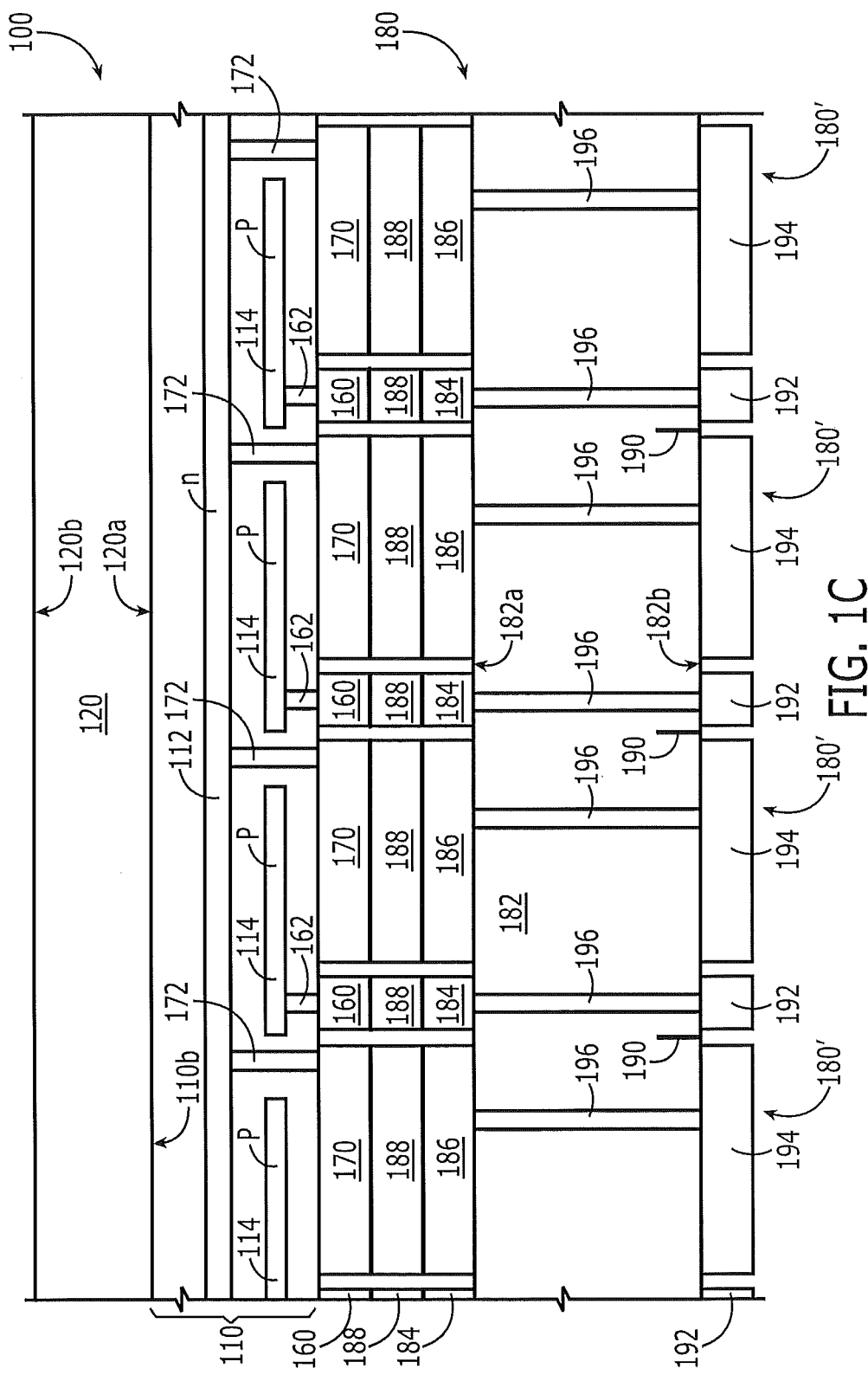
FIGS. 1A-1P and 1S-1U are cross-sections of one or more LEDs during intermediate and final wafer level packaging, according to various embodiments described herein.
FIGS. 1Q and 1R are bottom views of a carrier substrate of FIG. 1K.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Some embodiments now will be described generally with reference to gallium nitride (GaN)-based light emitting diodes on silicon carbide (SiC)-based growth substrates for ease of understanding the description herein. However, it will be understood by those having skill in the art that other embodiments of the present invention may be based on a variety of different combinations of growth substrate and epitaxial layers. For example, combinations can include AlGaInP diodes on GaP growth substrates; InGaAs diodes on GaAs growth substrates; AlGaAs diodes on GaAs growth substrates; SiC diodes on SiC or sapphire ($Al_2O_3$) growth substrates and/or a Group III-nitride-based diode on gallium nitride, silicon carbide, aluminum nitride, sapphire, zinc oxide and/or other growth substrates. Moreover, in other embodiments, a growth substrate may not be present in the finished product. For example, the growth substrate may be removed after forming the light emitting diode, and/or a bonded substrate may be provided on the light emitting diode after removing the growth substrate. In some embodiments, the light emitting diodes may be gallium nitride-based LED devices manufactured and sold by Cree, Inc. of Durham, N.C.

Various embodiments described herein can increase the lumen/dollar performance of LEDs by performing packaging-like process steps at the wafer level, to allow reduction of handling and assembling of discrete level LED dies or chips into a package. Thus, various embodiments described herein can merge chip or die fabrication and packaging into fewer steps, to thereby allow leveraging of the parallel process cost reduction available by performing wafer level processing of the die rather than component level processing. Various embodiments described herein can move die and component singulation to the end of the LED lamp manufacturing line. Moreover, various embodiments described herein can also reduce redundant characterization steps between the LED die and LED package testing, which can allow further reduction in manufacturing costs, such as labor, work-in-process time and capital expense. Finally, various embodiments described herein can tightly pack LED dies on a mounting board to allow increased luminous efficiency.

Various embodiments described herein may arise from recognition that, conventionally, LED dies are singulated and sorted, and placed upon die sheets, which are shipped to a components factory, only to have the dies removed from the die sheets and repopulated onto panels. Accordingly, conventional LED manufacturing begins with a wafer, singulates the wafer and then basically reassembles the wafer, only to repeat the process of singulation followed by testing and measurements again. Various embodiments described herein can provide methods of fabricating LEDs and methods of manufacturing LED light fixtures that can at least partially reduce or eliminate these redundancies. Moreover, various embodiments described herein can provide LEDs and LED light fixtures so manufactured.

FIG. 1A is a cross-sectional view of an LED wafer including a plurality of LED dies. Referring to FIG. 1A, the LED wafer 100 includes diode regions 110 having first and second opposing faces 110*a*, 110*b*, respectively, and including therein an n-type layer 112 and a p-type layer 114. Other layers or regions may be provided, which may include quantum wells, buffer layers, etc., that need not be described herein. Moreover, the n-type layer 112 and the p-type layer 114 may be adjacent one another to form a p-n junction or may be spaced apart from one another. Either or both layers may be at a surface of the diode region 110 or may be buried within the diode region. Anode contacts 160 ohmically contact the p-type layer 114 and extends on the first face 110*a*. The anode contacts 160 may directly ohmically contact the p-type layer 114, or may ohmically contact the p-type layer 114 by way of one or more conductive vias 162 and/or other intermediate layers. Cathode contacts 170 ohmically contact the n-type layer 112 and also extend on the first face 110*a*. The cathode contacts may directly ohmically contact the n-type layer 112, or may ohmically contact the n-type layer 112 by way of one or more conductive vias 172 and/or other intermediate layers. As illustrated in FIG. 1A, the anode contacts 160 and the cathode contacts 170 that both extend on the first face 110*a* are coplanar.

The diode region 110 also may be referred to herein as an "LED epi region" or simply as an "LED epi", because it is typically formed epitaxially on a substrate 120. For example, a Group III-nitride based LED epi 110 may be formed on a silicon carbide growth substrate. In some embodiments, the growth substrate may be present in the finished product. In other embodiments, the growth substrate may be thinned or removed. In still other embodiments, another substrate may be provided that is different from the growth substrate, and the other substrate may be bonded to the LED after removing the growth substrate. The LED epi 110 defines a plurality of LED dies 110'.

As also shown in FIG. 1A, a substrate 120, such as a transparent silicon carbide growth substrate or a transparent sapphire growth substrate, is included on the second face 110*b* of the diode region 110. The substrate 120 includes an inner face 120*c* adjacent the second face 110*b* of the diode region 110 and an outer face 120*b*, remote from the inner face 120*c*.

FIG. 1B illustrates a carrier wafer 180 that includes a body 182 that may comprise aluminum nitride (AlN), silicon and/or aluminum oxide. In other embodiments, metal core substrates, printed circuit boards and/or other carrier wafers may be used. The carrier wafer 180 includes a carrier wafer face 182a, and an anode pad 184 and a cathode pad 186 thereon. The anode and cathode pads may comprise silver-plated copper and/or other conductive materials. A packaged device anode 192 and a packaged device cathode 194 may be provided on a second face 182b of the body 182, and may be connected to the anode pad 184 and cathode pad 186, respectively, using internal vias and/or conductive layers 196 that extend in and/or around the body 182. The carrier wafer 180 may also include electrostatic discharge protection devices therein. In some embodiments, the body 182 comprises silicon and the vias 196 may be fabricated using conventional Through Silicon Via (TSV) technology. In some embodiments, the carrier wafer 180 is about 100 µm thick, and in other embodiments, the carrier wafer may be between about 30 µm and about 500 µm thick. The anode and cathode pads and the packaged device anode and cathode may be less than about 10 µm thick, in some embodiments.

In FIG. 1B, the anode pad 184 and the packaged device anodes 192 are of approximately the same size and shape. Moreover, the cathode pads 186 and the packaged device cathodes 194 are also of approximately the same size and shape. However, this need not be the case. For example, as shown in FIG. 1K, the packaged device anodes 192 and/or the packaged device cathodes 194 may be smaller than the corresponding anode pads 184 and cathode pads 186. Thus, more separation may be provided between the packaged device anodes 192 and cathodes 194 to provide a more package-friendly environment, since the placement ability at the packaging manufacturing level may be lower. As illustrated in FIG. 1K, a wider gap between the packaged device anode 192 and the packaged device cathode 194 may be provided. Thus, the packaged device anodes 192 and/or the packaged device cathodes 194 may be configured for surface mounting. Accordingly, FIGS. 1B and 1K illustrate a carrier wafer that includes arrays of contacts on opposing faces thereof, and an array of through vias that electrically connect a respective contact on the opposing faces to one another. Moreover, FIG. 1K illustrates embodiments wherein the corresponding contacts in the arrays of contacts on the opposing faces have different dimensions therebetween.

Figure 1D:
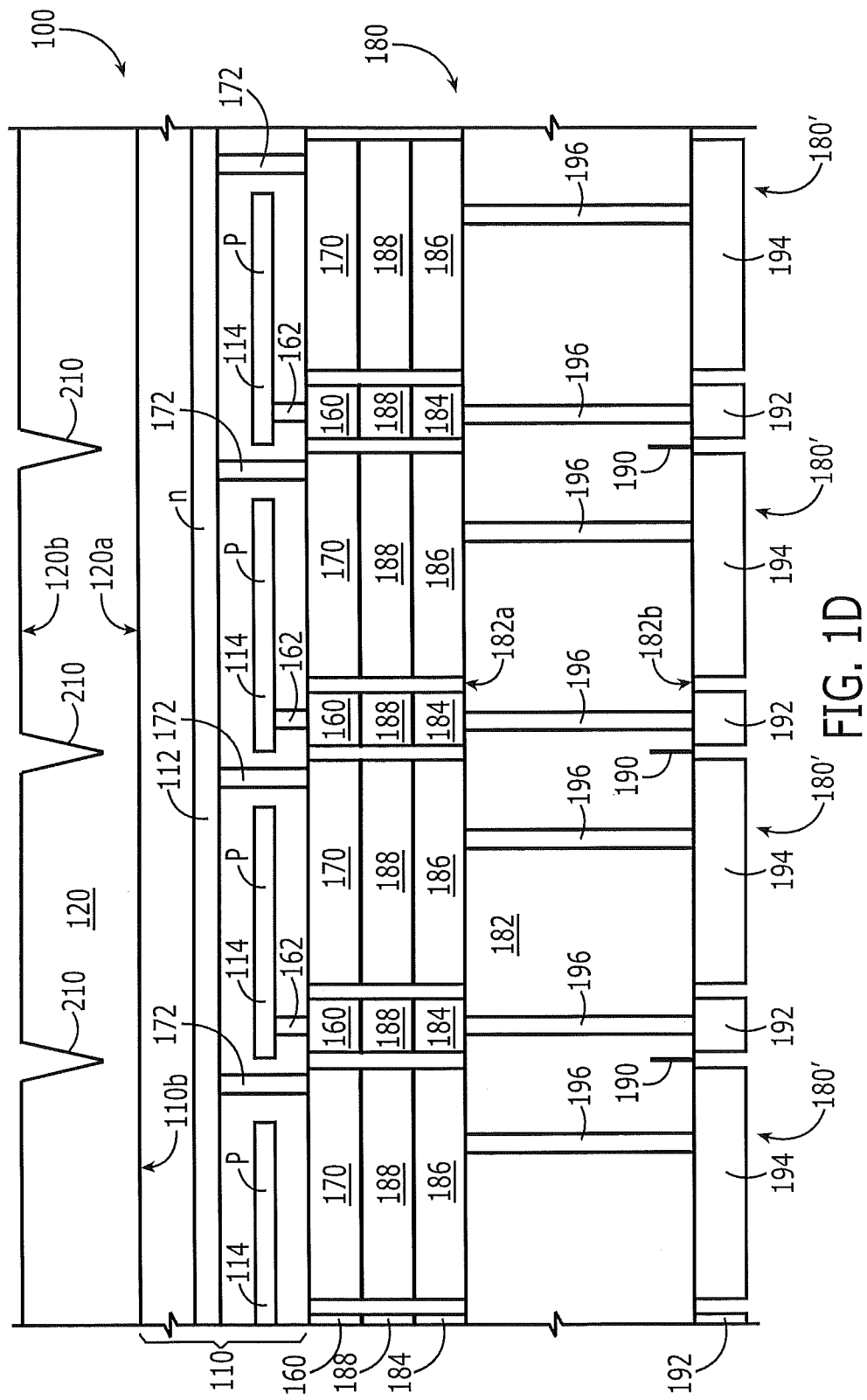
Figure 1E:
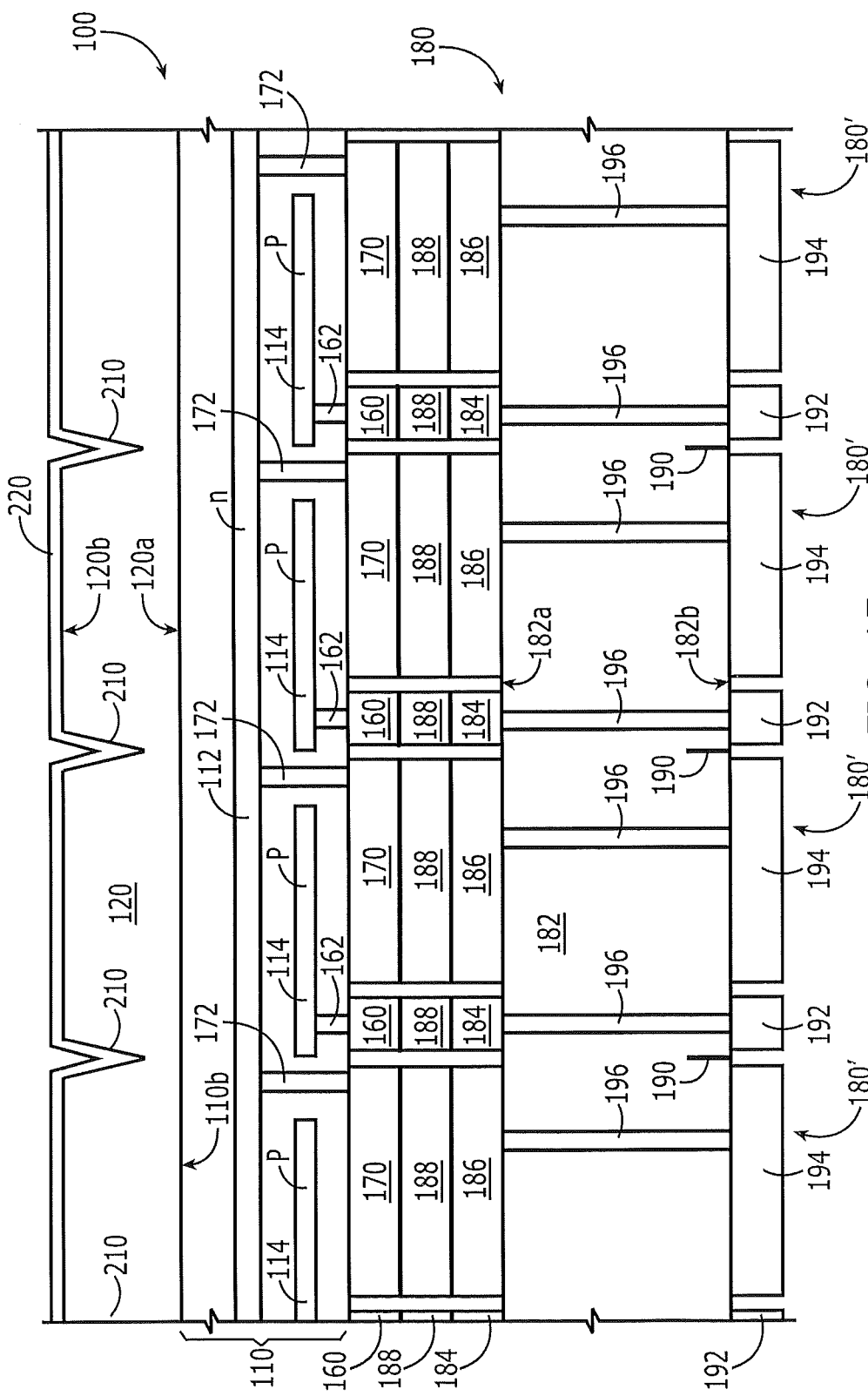
Figure 1F:
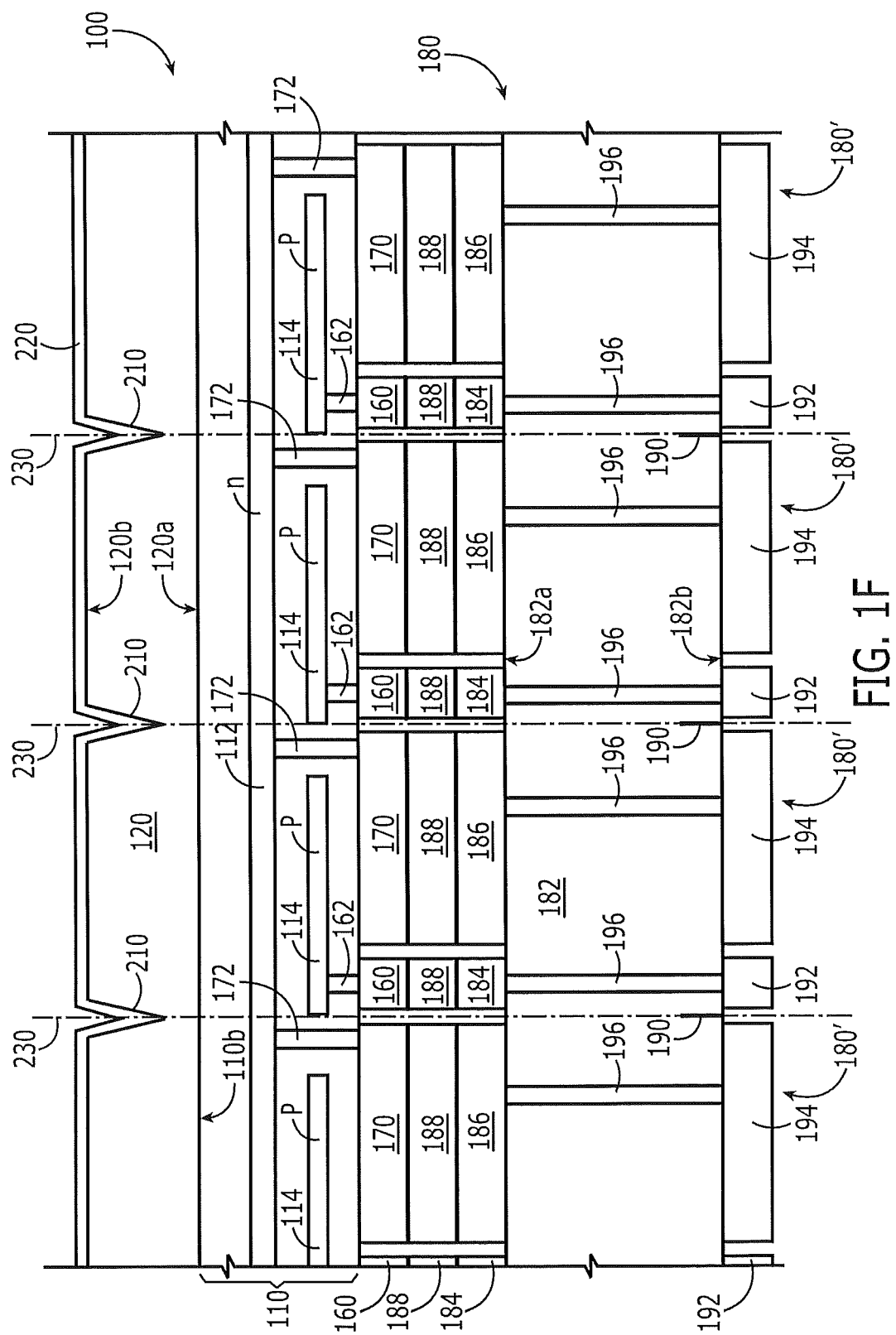
Figure 1G:
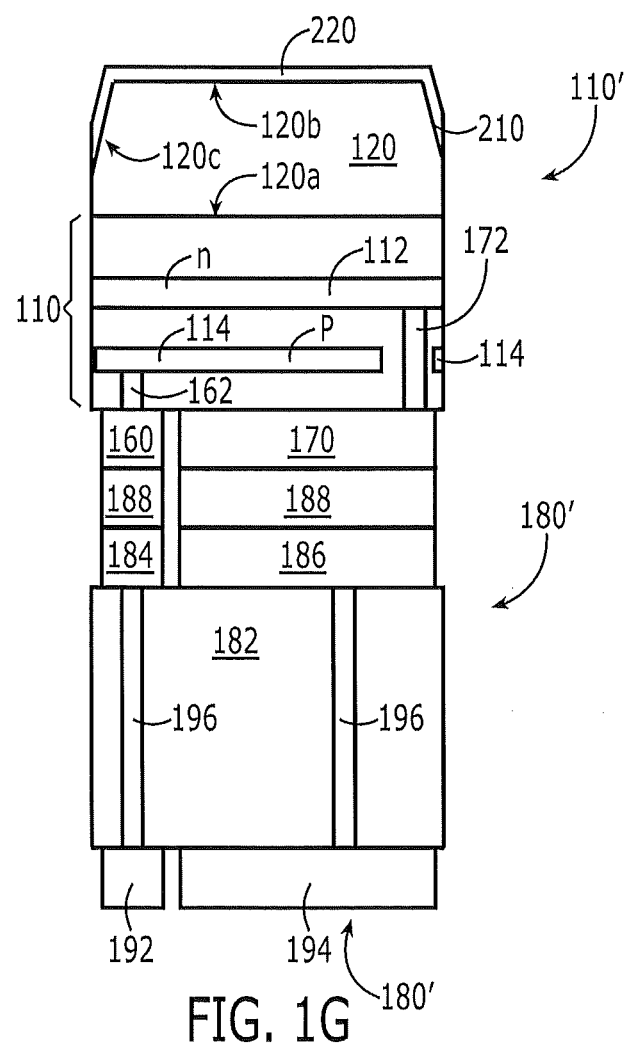
Figure 1H:
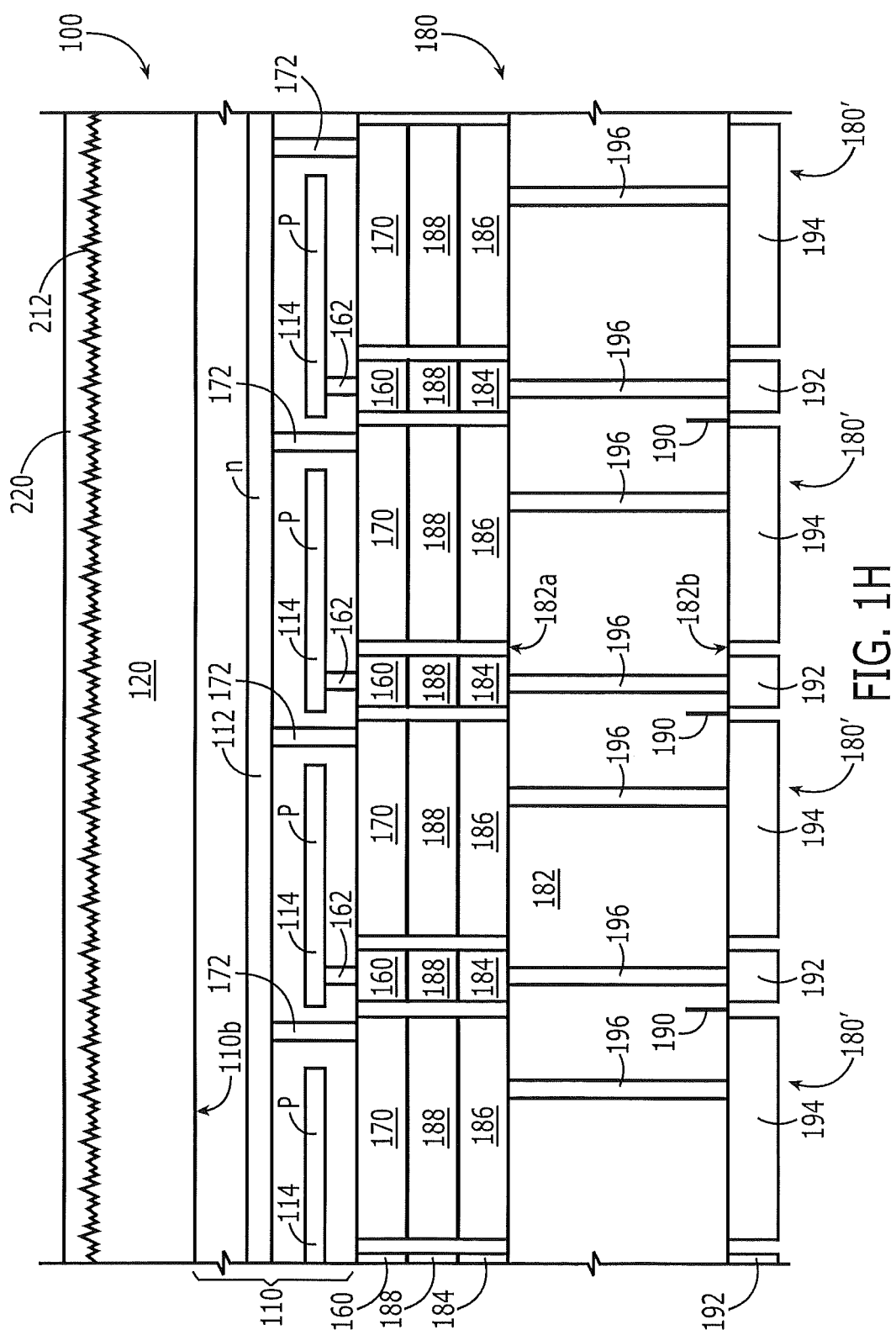
Figure 1I:
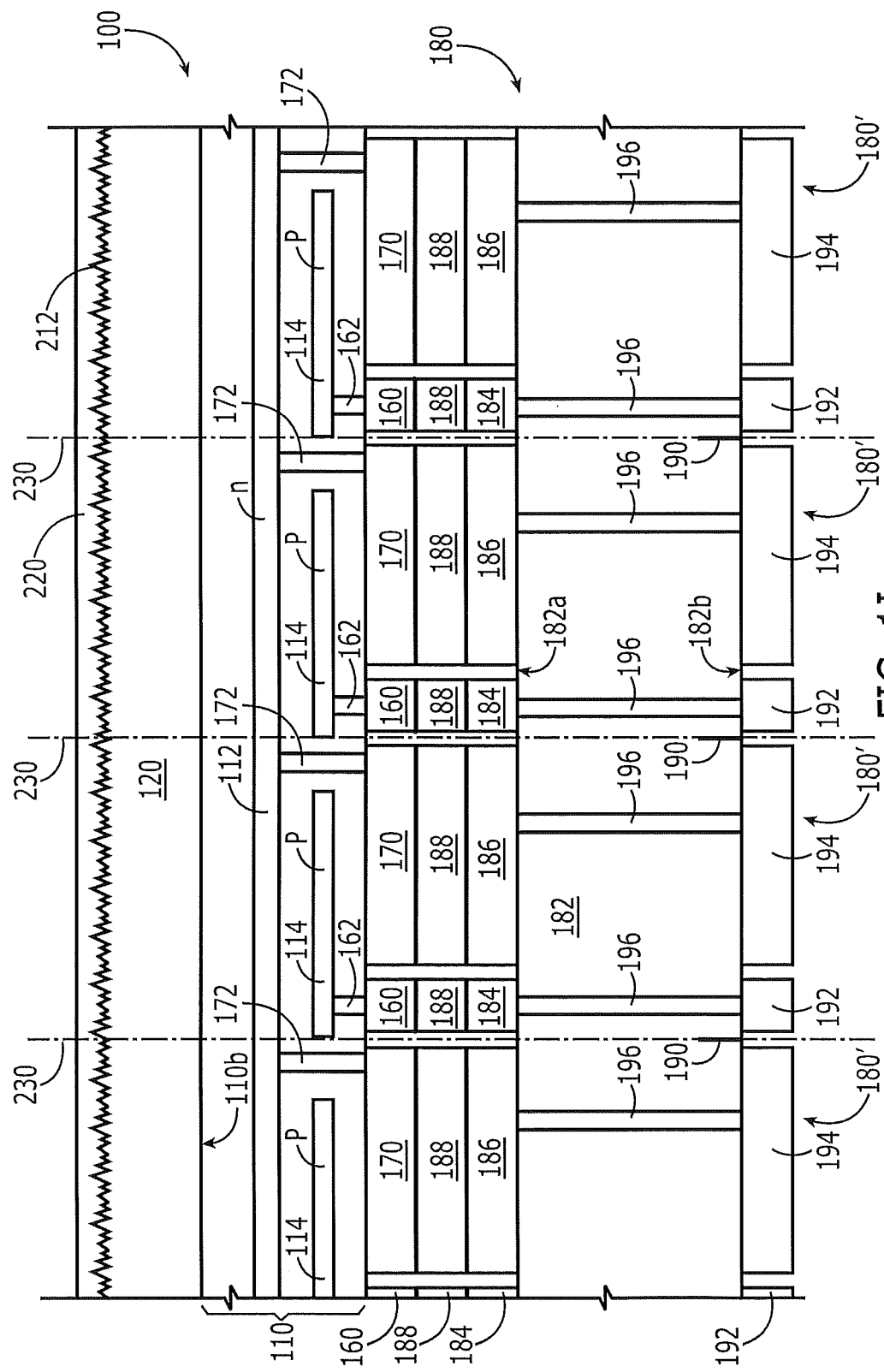
Figure 1J:
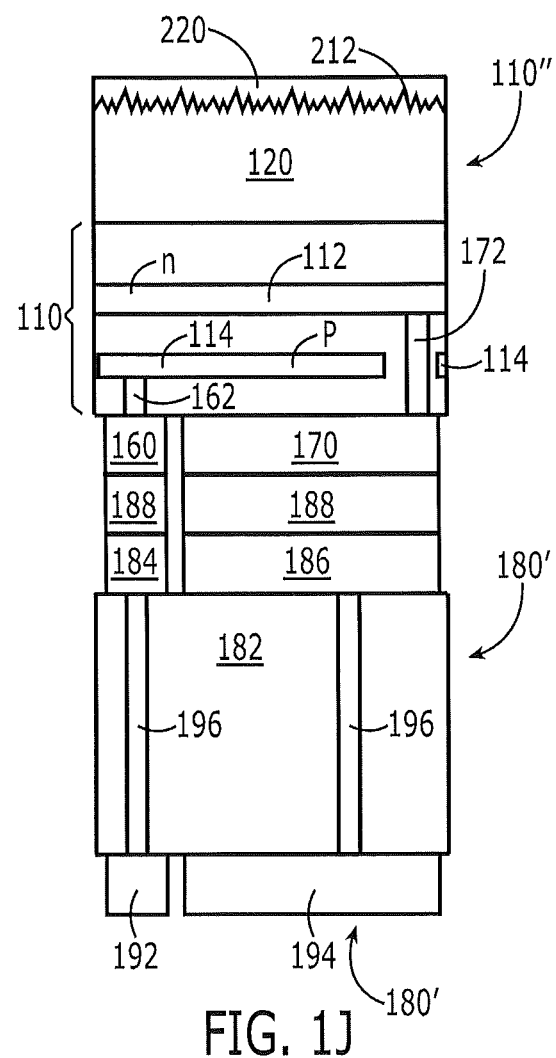
Figure 1K:
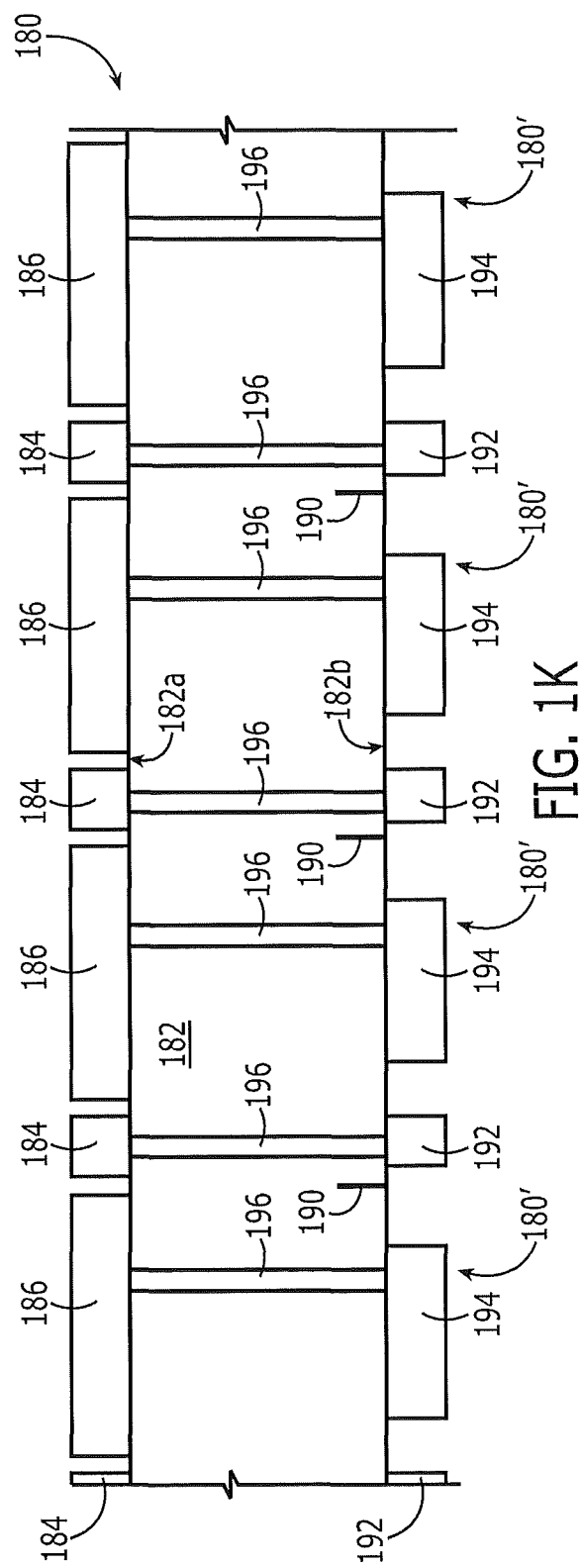
Figure 1L:
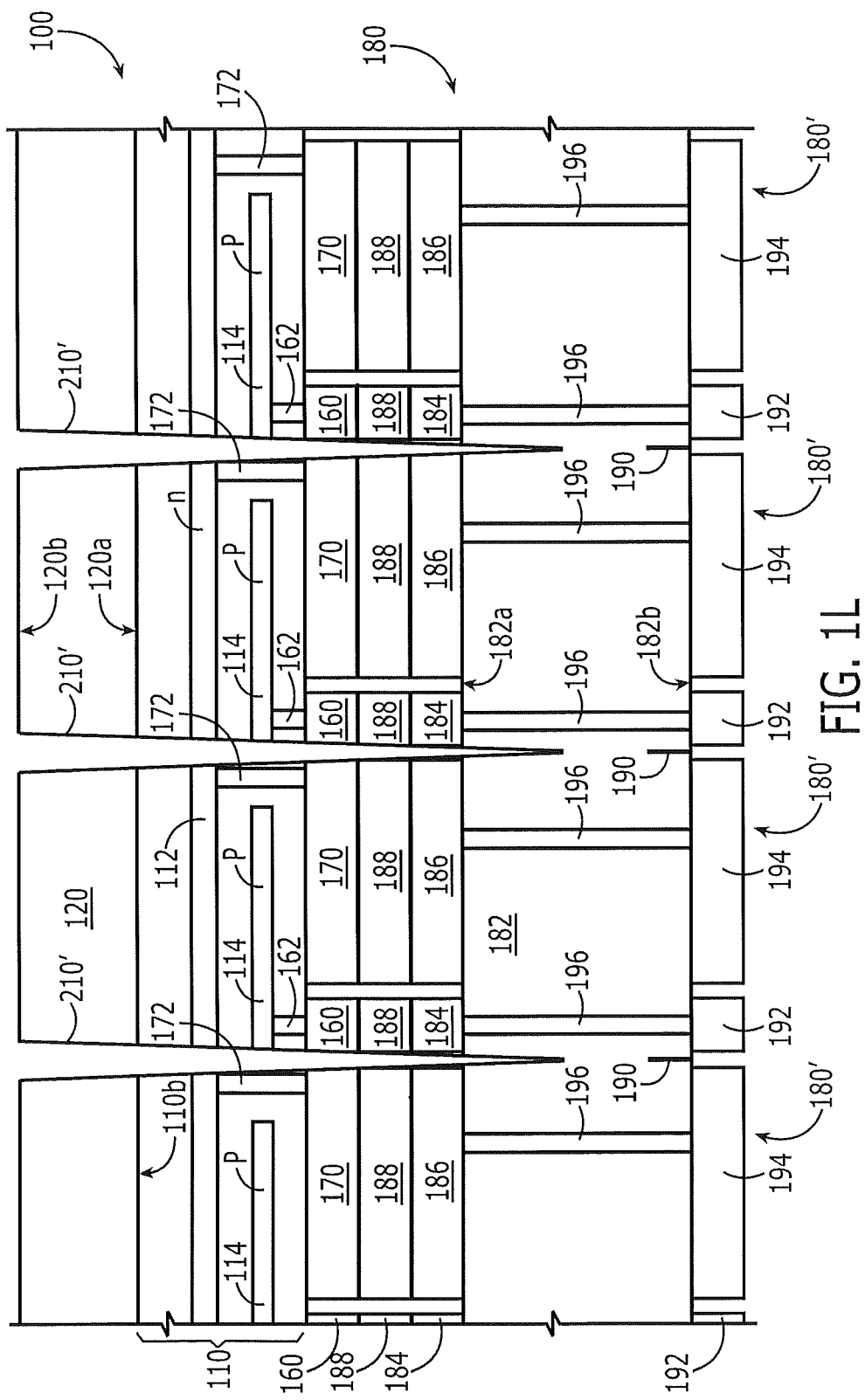
Figure 1M:
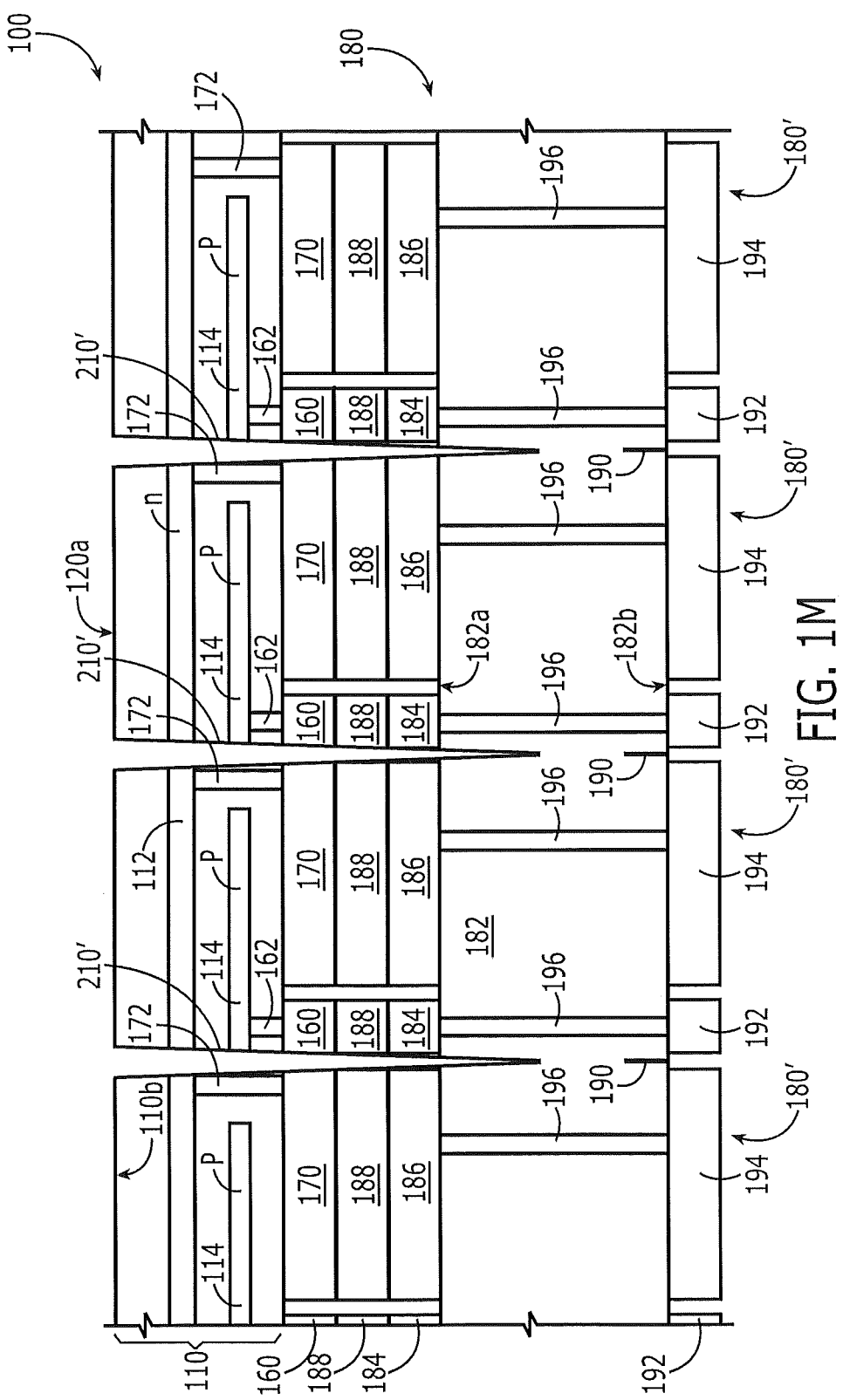
Figure 1N:
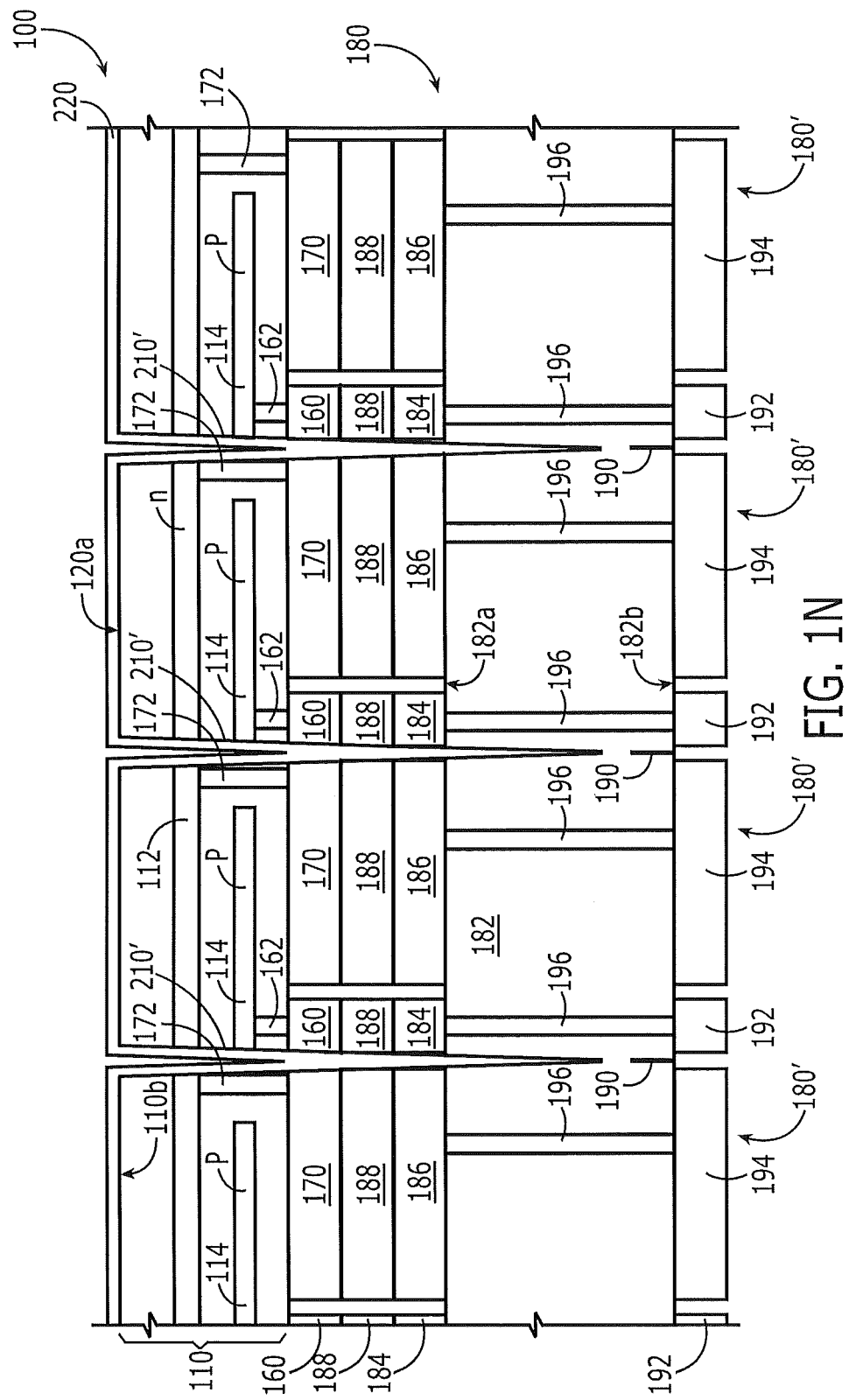
Figure 1Q:
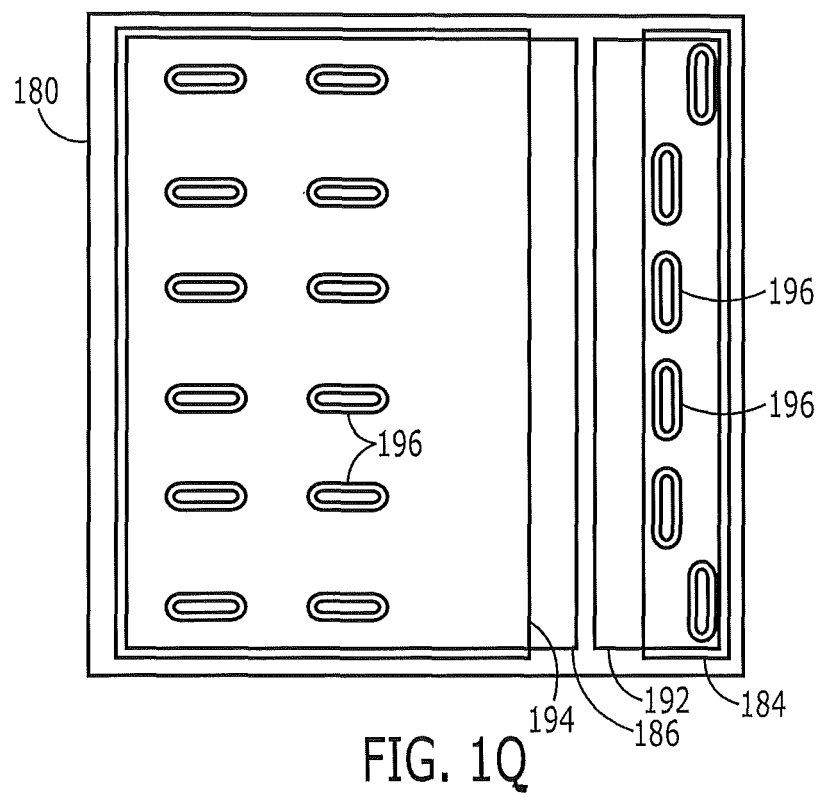
Figure 1R:
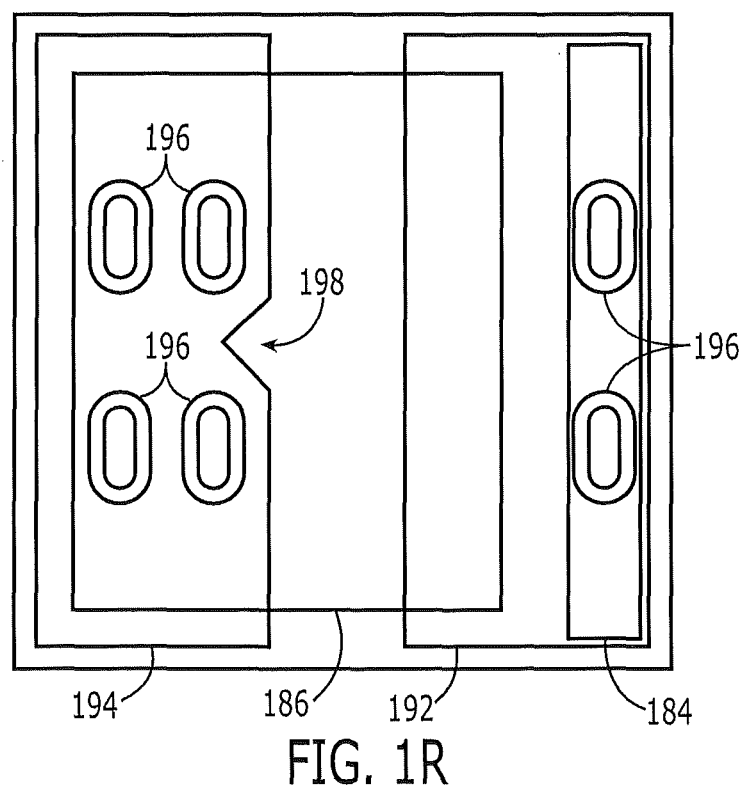

More specifically, FIGS. 1Q and 1R illustrate configurations of anode pads 184, packaged device anodes 192, cathode pads 186 and packaged device cathodes 194 on a carrier wafer 180, according to various embodiments described herein. As shown in FIG. 1Q, the packaged device anode 192 may be larger than the anode pad 184, and the packaged device cathode 194 may be smaller than the cathode pad 186, to facilitate surface mounting of the LED. In other embodiments, as shown in FIG. 1R, there may be more spacing between the packaged device anode 192 and the packaged device cathode 194, than between the anode pad 184 and the cathode pad 186, to facilitate surface mounting of the LED. Moreover, a feature, such as a notch 193 in the packaged device cathode 194 may be provided to allow identification of an orientation of the LED. Other types of orientation identification features may also be provided according to various other embodiments, and the orientation identification features may be provided in the packaged device anode 192, in the packaged device cathode 194 and/or on the body 180 of the carrier die. Accordingly, the carrier die may be configured for surface mounting of the LED and/or to allow identification of an orientation of the LED. In some embodiments, when the carrier has dimensions of about 0.7 mm×0.7 mm, the packaged device cathode 194 may have dimensions of about 0.65 mm×about 0.25 mm, the packaged device anode 192 may have dimensions of 0.65 mm×0.25 mm, and the spacing between the packaged device anode 192 and the packaged device cathode 194 may be about 0.15 mm.

FIG. 1A illustrates LED wafers that are configured for flip-chip mounting on a carrier wafer such as the carrier wafer 180 of FIG. 1B. Various configurations of flip-chip mounted light emitting diode dies may be used in the LED wafers in various embodiments described herein. Other light emitting devices according to various embodiments described herein may be configured for non-flip-chip mounting on a mounting substrate, as described and illustrated, for example, in U.S. Patent Application Publication 2011/0031502 to Bergmann et al. entitled "Light Emitting Diodes Including Integrated Backside Reflector and Die Attach", filed Aug. 10, 2009, assigned to the assignee of the present application, the disclosure of which is hereby incorporated herein by reference in its entirety as if set forth fully herein. Moreover, other light emitting devices according to various embodiments described herein may be configured as vertical light emitting devices, as described and illustrated, for example, in U.S. Pat. No. 6,791,119 to Slater, Jr et al., entitled "Light Emitting Diodes Including Modifications for Light Extraction", filed Jan. 25, 2002, assigned to the assignee of the present application, the disclosure of which is hereby incorporated herein by reference in its entirety as if set forth fully herein.

FIG. 1B also illustrates a plurality of scribe lines 190 in the second face 182b of the carrier wafer 180, that define a plurality of carrier dies that are of similar length and width as the plurality of LED dies 110' on the LED wafer 100. Scribing may take place using a diamond tool, a laser and/or other conventional scribing techniques. Moreover, scribing may not need to be performed in FIG. 1B, but may be performed after attaching the LED wafer 100 to the carrier wafer 180, as will be described below.

Accordingly, FIG. 1A illustrates providing an LED wafer 100 that includes a plurality of LED dies 110' on an LED substrate 120, the plurality of LED dies 110' including anode and cathode contacts 160, 170, on a face 110a thereof that is remote from the LED substrate 120. FIG. 1B illustrates providing a carrier wafer 180 and also illustrates an optional scribing 190 of the carrier wafer, to define a plurality of carrier dies 180' that are of similar length and width as the plurality of LED dies 110'.

Referring now to FIG. 1C, the LED wafer 100 and the carrier wafer 180 are joined, so that the anode and cathode contacts 160, 170 are adjacent the carrier wafer 180, and the LED substrate 120 is remote from the carrier wafer 180. More specifically, as illustrated in FIG. 1C, the LED wafer 100 is mounted on the carrier wafer 180, such that the first face 110a is adjacent the first carrier wafer face 182a, the second face 110b is remote from the carrier wafer 180, the anode pads 184 are adjacent the anode contacts 160, and the cathode pads 186 are adjacent the cathode contacts 170. In some embodiments, a bonding layer, such as a eutectic gold/tin solder layer 188, is used to electrically, thermally and/or mechanically connect the anode contacts 160 to the anode pads 184, and the cathode contacts 170 to the cathode pads 186. In other embodiments, direct attachment of the anode contacts 160 to the anode pads 184, and direct attachment of the cathode contacts 170 to the cathode pads 186 may be provided, for example using thermocompression bonding and/or other techniques.

Referring now to FIG. 1D, the LED substrate 120 that is joined to the carrier wafer 180 is shaped. In FIG. 1D, shaping takes place by forming bevels 210 in the second face 120b of the substrate 120, for example using a saw blade, laser, wet and/or dry etching, and/or other conventional beveling techniques. Various shapes of beveling and/or faceting may be provided. For example, an "X"-shaped cut may be performed on the outer face, and sidewall beveling 210 may also be performed. Prior to or after beveling, the substrate 120 may be thinned. In other embodiments, the entire LED substrate 120 may be removed. Moreover, in some embodiments, if scribing of the carrier wafer 180 did not take place prior to attachment in FIG. 1C, scribing may take place after attachment in FIG. 1D.

In FIG. 1D, the bevels 210 extend into the second face 120b of the substrate 120. However, deeper beveling may also be provided that extends through the substrate 120. In other embodiments, the bevels may extend into, and in some embodiments through, the diode regions 110. In yet other embodiments, the bevels may extend into the body 182 of the carrier wafer 180. Thus, for example, as illustrated in FIG. 1L, the bevels 210' extend through the substrate 120, through the diode region 110 and into the body 182 of the carrier wafer 180. By providing deeper bevels, a subsequent coating of phosphor (described below) can extend along the edges or sidewalls of the diode region 110, and can reduce or prevent production of undesired edge emission from the LED. For example, undesired blue edge emission may be reduced or prevented when a blue LED is used with yellow phosphor that extends along the edge or sidewalls of the diode region.

As was also noted above, in some embodiments, the entire LED substrate 120 may be removed. Thus, as illustrated in FIG. 1M, the substrate 120 is entirely removed. Substrate removal may take place prior to or after beveling. In other embodiments, the substrate may be thinned prior to beveling, and the remaining substrate may be removed after beveling.

Referring now to FIG. 1E, a wavelength conversion material 220 is applied to the LED substrate 120 that has been shaped. The wavelength conversion material 220, also generally referred to herein as "phosphor", may be provided according to various configurations. In some embodiments, the diode regions 110 are configured to emit blue light, for example light having a dominant wavelength of about 450-460 nm, and the wavelength conversion layer 220 comprises yellow phosphor, such as YAG:Ce phosphor, having a peak wavelength of about 550 nm. In other embodiments, the diode region 110 is configured to emit blue light upon energization thereof, and the wavelength conversion material 220 may comprise a mixture of yellow phosphor and red phosphor, such CASN-based phosphor. In still other embodiments, the diode region is configured to emit blue light upon energization thereof, and the wavelength conversion material 220 may comprise a mixture of yellow phosphor, red phosphor and green phosphor, such as LuAG:Ce phosphor particles. Moreover, various combinations and subcombinations of these and/or other colors and/or types of phosphors may be used in mixtures and/or in separate layers. Various techniques may be used to apply the phosphor, including spraying, coating and/or other techniques. Phosphor preforms also may be applied.

Similarly, for deep beveling embodiments that were illustrated in FIG. 1M, a wavelength conversion material 220 may be applied according to any of the embodiments described above, as illustrated, for example, in FIG. 1N. As was already noted, by coating the diode region 110 with phosphor, undesired emission of, for example, excess blue light from the sidewalls or edge of the diode region may be reduced or prevented.

Referring now to FIG. 1F, singulation 230 is then performed on the carrier wafer 180 that has been scribed, and on the LED wafer 100 that has been joined to the carrier wafer 180 and that has been shaped 210 and that has wavelength conversion material 220 applied thereto. Singulation may take place along singulation lines 230, that correspond to the scribe lines 190, using conventional singulation techniques. As shown in FIG. 1G, the singulation provides a plurality of LED dies 110', a respective one of which is joined to a respective carrier die 180'. An anode 192 and a cathode 194 are provided on the carrier die 182, remote from the LED die 110. Moreover, a substrate 120 may also be provided. Note that only one of these LED dies/carrier dies is shown in FIG. 1G. FIG. 1O illustrates a singulated LED device of FIG. 1N, wherein the substrate 120 is not included, and the phosphor coating 220 extends along the sidewalls of the LED dies 110'.

Referring back to FIG. 1D, substrate shaping by beveling was illustrated. However, other techniques of substrate shaping may be provided, as will now be described in connection with FIGS. 1H-1J. Specifically, FIG. 1H illustrates providing texturing 212 on the outer substrate face, followed by application of wavelength conversion material 220. Texturing may take place using etching and/or other techniques. Substrate thinning may also take place. In other embodiments, the entire LED substrate 120 may be removed, and texturing of the second face of the diode regions 110 may take place.

FIG. 1I illustrates singulation of the textured devices, as was also illustrated in FIG. 1F. FIG. 1J illustrates a resulting LED die 110" having a textured substrate. It will also be understood that, in other embodiments, beveling and texturing may be combined, for example by using a saw blade to provide the bevels of FIG. 1D and then texturing on the exposed surface as illustrated in FIG. 1H. In yet other embodiments, the substrate 120 may be removed, and texturing of the second (outer) face 110b of the LED 110' may be provided. FIG. 1P illustrates the singulation of the textured devices, which were subject to deep beveling, as was illustrated in FIG. 1N. The texturing may extend on the second (outer) face 110b of the LED die 110" and/or may extend along the sidewalls thereof. In addition, an X-cut may also be provided on the second face 110b of the LED die 110".

Figure 1U:
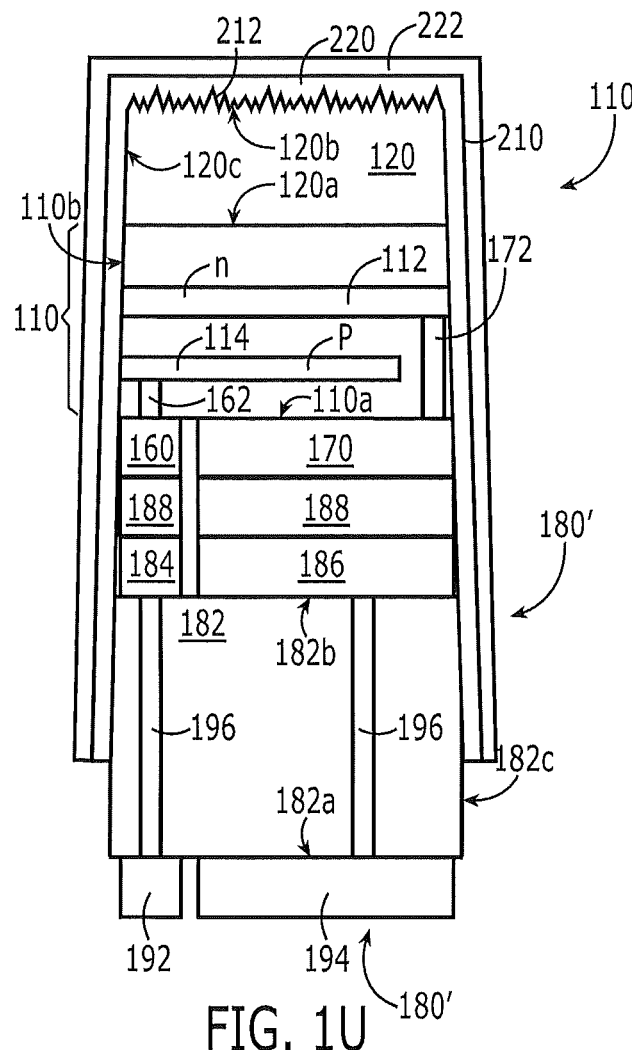

FIGS. 1S-1U also illustrate singulation of the devices according to various other embodiments described herein. Specifically, in FIG. 1S, the deep beveled wafers of FIG. 1L that include a shaped substrate 120 are singulated after a phosphor layer is applied thereto. Thus, as shown in FIG. 1S, the semiconductor LED die 110' includes an outer face 120b, an inner face 110a, and a plurality of sidewalls 110c therebetween. The carrier die 180' includes an outer face 182a, an inner face 182b, and a plurality of sidewalls 182c therebetween. The inner face 110a of the LED die 110' is electrically connected to the inner face 182b of the carrier die 182. A phosphor layer 220 extends directly on the outer face 120b of the LED die 110', directly on the plurality of sidewalls 110c of the LED die 110' and directly on the plurality of sidewalls 182c of the carrier die. In some embodiments, the phosphor layer covers the outer face 120b of the LED die 110' and the plurality of sidewalls 110c of the LED die 110', and partially covers the plurality of sidewalls 182c of the carrier die 180'. As also shown in FIG. 1S, the phosphor layer 220 may protrude beyond the carrier die 182 in a direction along the inner face 182b and outer face 182a of the carrier die 180'. Thus, in FIG. 1S, the phosphor layer may protrude in the horizontal direction beyond the sidewalls 182c of the carrier die body 182. The extent of protrusion of the phosphor layer 220 may be controlled, for example, by the depth and/or profile of the shaping that takes place, by the thickness of the phosphor layer that is provided and/or by other techniques.

FIG. 1T illustrates other embodiments wherein texturing 212 of the outer face 120b of the semiconductor LED die 120 is provided, as was also illustrated, for example, in FIG. 1J.

FIG. 1U illustrates the addition of a protective layer 222 on the phosphor layer 220. In some embodiments, the phosphor layer 220 may comprise phosphor particles in a binder, such as a silicone binder, and the protective layer 222 may comprise a layer, such as a silicone layer, comprising for example the same silicone as the silicone binder, that is free of the phosphor particles therein. The protective layer 220 may be added prior to and/or after singulation.

FIGS. 1G, 1J, 1O, 1P, 1S, 1T and 1U also illustrate LEDs according to other embodiments that comprise a carrier 180', an LED epi region 110, a primary optic, such as substrate 120, that is distinct from the LED epi region 110, and a phosphor layer 220. The carrier 180', the LED epi region 110, the primary optic 120 and the phosphor layer 220 have outer edges that are within 100 μm of one another in some embodiments, and in other embodiments, have same size outer edges. In some embodiments, the primary optic can be other suitable materials and/or constructions, such as a molded silicone lens, for example when the substrate is removed.

Figure 2:
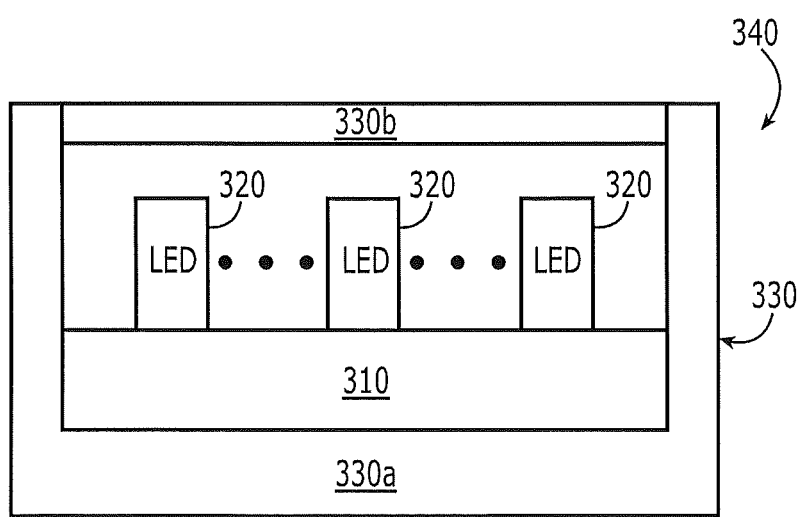
FIG. 2 is a cross-section of an LED die in a light fixture according to various embodiments described herein.

FIG. 2 illustrates the packaging of an LED die, for example an LED die of FIGS. 1G, 1J, 1O, 1P and/or 1S-1U, into an LED fixture. Specifically, as shown in FIG. 2, at least one of the LED dies 320, which may correspond to the product of FIGS. 1G, 1J, 1O, 1P and/or 1S-1U is directly mounted on a light fixture mounting board 310. The light fixture mounting board 310 is then mounted in a light fixture housing 330 to provide a light fixture 340. As illustrated in FIG. 2, the light fixture is free of a dome between the LED die 320 and the light fixture housing 330. It will be understood that, as used herein, a "dome" may include a smooth or faceted structure. It will be understood that light fixture 340 is illustrated in FIG. 2 in a greatly simplified form, and does not include driver circuitry, power supplies, heat sinking and/or other conventional elements. Moreover, the housing 330 may include opaque/reflective portions 330a and transparent portions 330b, to allow light to emerge from the housing.

Figure 3:
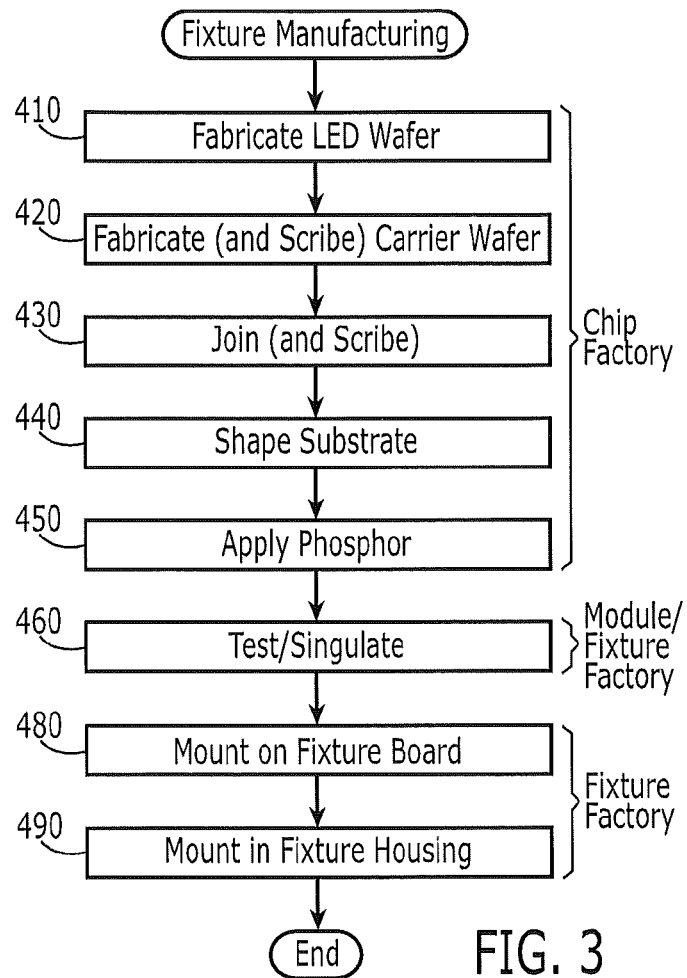
FIG. 3 is a flowchart of LED fixture manufacturing according to various embodiments described herein.

FIG. 3 is a flowchart of LED fixture manufacturing according to various embodiments described herein. Referring to FIG. 3, an LED wafer is fabricated at Block 410, for example as was illustrated in FIG. 1A. At Block 420, a carrier wafer is fabricated, as was illustrated, for example, in FIG. 1B or 1K, and is optionally scribed. At Block 430, the LED wafer and the carrier wafer are joined, as was illustrated, for example, in FIG. 1C. Scribing also may optionally take place. The substrate is then shaped at Block 440, as was illustrated, for example, in FIGS. 1D, 1H, 1L and/or 1M. At Block 450, phosphor is applied, as was illustrated, for example, in FIGS. 1E, 1H and/or 1N.

As also illustrated in FIG. 3, all of the operations of Blocks 410-450 may take place at a "chip factory". Thus, substrate carrier joining (Block 430), substrate shaping (Block 440) and phosphor application (Block 450) may be performed at a wafer level at a chip factory rather than being applied at a die level at a package factory.

Continuing with the description of FIG. 3, testing of the wafers that are provided by the chip factory at Block 450 may then be performed at Block 460 and singulation may also be performed at Block 460, as was illustrated, for example, in FIGS. 1F and/or 1I. Testing may be performed prior to and/or after singulation at Block 460. Testing and singulation may take place at a separate "module factory", or may take place at the chip factory or at a "fixture factory". Accordingly, in some embodiments, the completed wafers from Block 450 may be shipped to a fixture factory, which is then responsible for testing, singulation and integration into a fixture. Optionally, the entire carrier die 180' of FIG. 1G or 1J may be removed at any desired point in the fixture manufacturing process, if desired. Then, at Block 480, the LED, for example the LED of FIGS. 1G, 1J, 1O, 1P and/or 1S-1U, is mounted on a fixture board, as was illustrated, for example, in FIG. 2, and at Block 490, the fixture board is mounted on the fixture housing, as also was illustrated in FIG. 2.

Various embodiments described herein, as illustrated, for example, in FIG. 3, may eliminate the need for a package factory and may also eliminate the need for a module factory. The chip maker may ship completed wafers from the chip factory to a fixture factory or a module factory.

Figure 4:
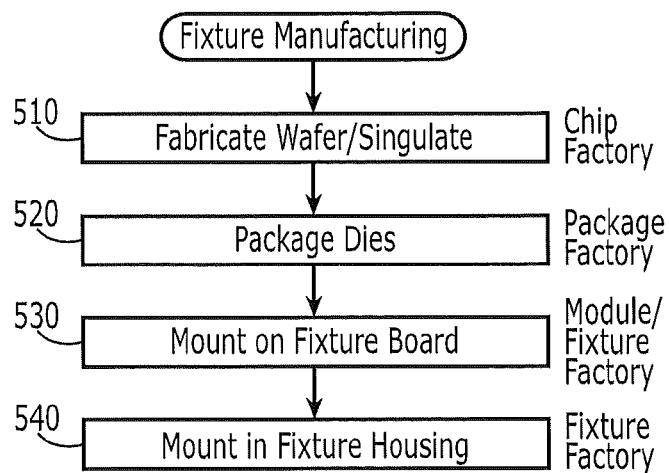
FIG. 4 is a flowchart of conventional fixture manufacturing.

In sharp contrast, FIG. 4 provides an overview of conventional fixture manufacturing. An LED wafer is fabricated and singulated at chip factory, as illustrated in Block 510. The singulated LED chips are then placed on die sheets and sent to a package factory, where the dies are packaged at Block 520. For example, the dies are mounted on a submount or other substrate, encapsulated, and a dome is placed on the encapsulated package. The packaged LEDs are then shipped to a module factory or a fixture factory, where they are mounted on a fixture board, as shown at Block 530. At the fixture factory, the packaged LEDs are mounted in a fixture housing, as shown at Block 540.

Figure 5:
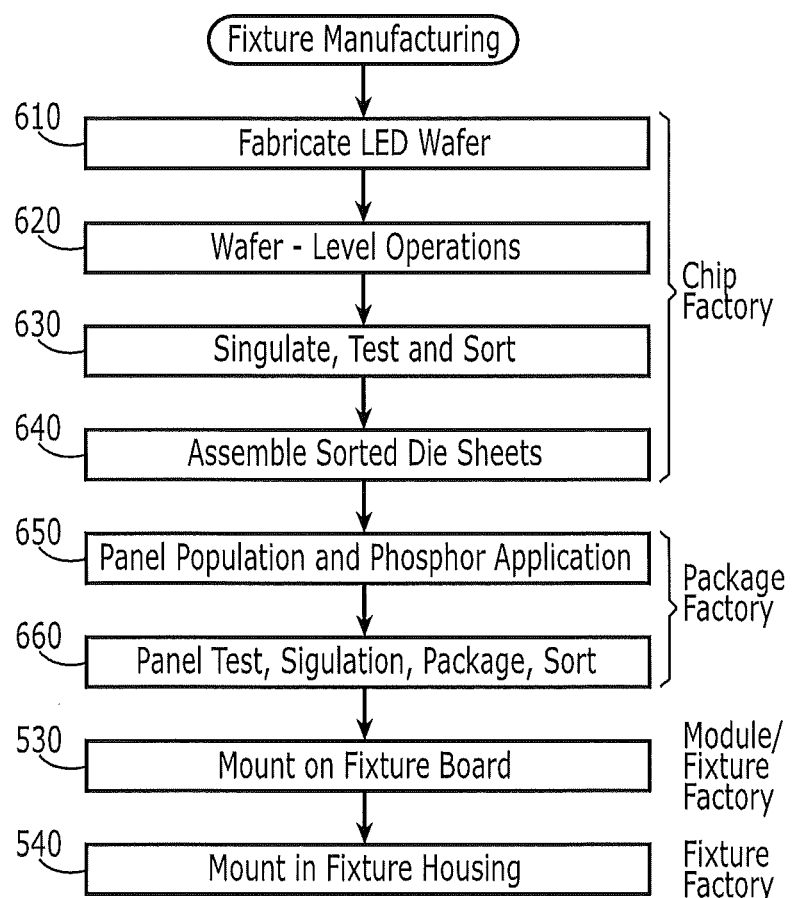
FIG. 5 is a more detailed flowchart of conventional fixture manufacturing.

FIG. 5 illustrates a more detailed flowchart of conventional fixture manufacturing. As illustrated at Block 610, the LED wafer is fabricated. Then, at Block 620, wafer level operations are performed (e.g., die contact formation and electrical testing). At Block 630, the LED dies are singulated, tested and sorted. At Block 640, the sorted LED dies are assembled onto sorted die sheets. The sorted die sheets are then shipped to a package factory, where at Block 660, a panel is populated and phosphor is applied, and the panel is tested, singulated, packaged and sorted again. Finally, operations of Block 530 and 540 are performed.

Figure 6:
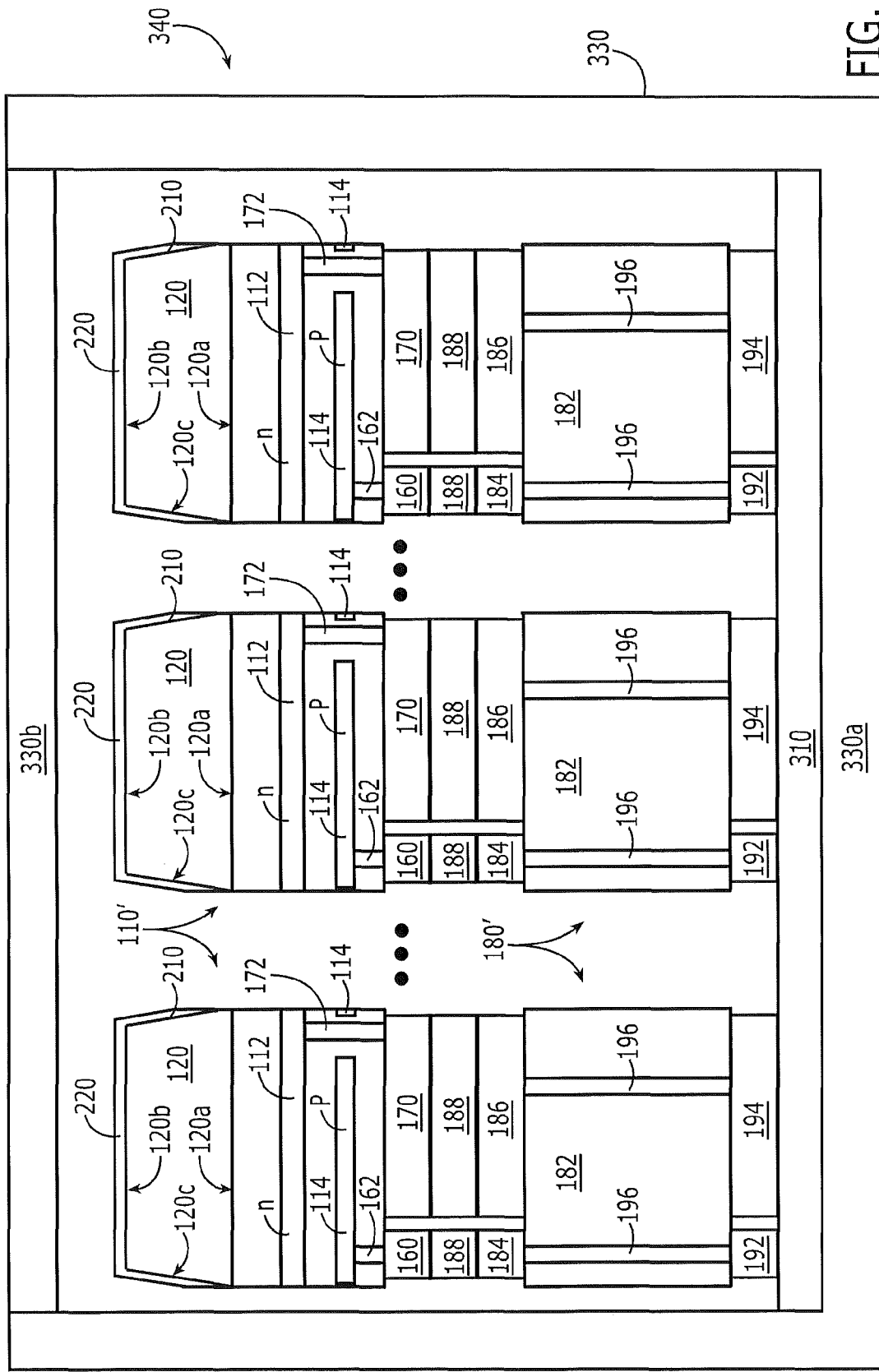
FIG. 6 is a cross-section of LED dies in a light fixture housing according to various embodiments described herein.

As was described above, various embodiments described herein can provide improved efficiency in the fabrication process for LEDs by eliminating/reducing fabrication steps and even eliminating the need for one or two separate factories (a packaging factory and/or a module factory). Moreover, improved luminous efficiency also may be provided according to various embodiments described herein. For example, FIG. 6 illustrates an LED light fixture 340 that includes a light fixture mounting board 310 and a plurality of LED dies 110'/110", such as the LED dies of FIGS. 1G, 1J, 1O, 1P and/or 1S-1U directly mounted thereon. LED dies according to any of the embodiments described herein may be used. A light fixture housing 330 is provided, wherein the light fixture mounting board 310 including the plurality of LED dies 110'/110" mounted thereon, is mounted in the housing 330. As shown in FIG. 6, the LED dies may be mounted in the housing without the need for encapsulation and a dome. Thus, the light fixture 340 is free of a dome between a respective LED die 110'/110" and the light fixture housing 330. Because a dome is not needed, the LEDs may be packed much more tightly than is conventionally the case. Higher light output per unit area may thereby be provided.

Moreover, although embodiments of FIG. 1G are illustrated in FIG. 6, the carrier dies 180' may optionally also be removed from the LED dies 110' prior to mounting on the LED mounting board 310, so that the plurality of LED dies 110' may be directly mounted on the light fixture mounting board without a carrier die therebetween.

Figure 7:
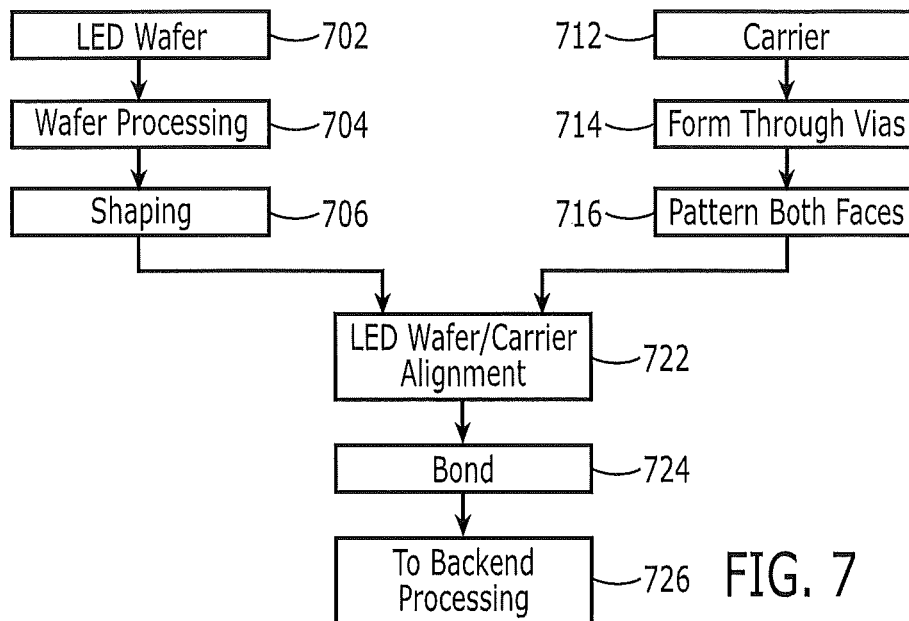
FIGS. 7 and 8 are flowcharts of wafer level packaging of LEDs according to various other embodiments described herein.

FIG. 7 is a flowchart of LED wafer/carrier wafer fabrication according to various other embodiments. As illustrated in FIG. 7, an LED wafer 100 is manufactured at Block 702, as was illustrated, for example, in FIG. 1A, and wafer processing is performed at Block 704 in order to provide standard wafer fabrication operations including metallization. At Block 706, substrate shaping, such as substrate thinning including substrate removal and/or texturing may optionally take place, to provide a final LED wafer thickness of, for example, between about 330 μm and about 390 μm, as was illustrated, for example, in FIG. 1M. At Block 712, a carrier, such as a silicon wafer, is fabricated, through vias are formed at Block 714 and both faces of the carrier wafer are patterned at Block 716 to provide contacts, as was illustrated, for example, in FIGS. 1B and 1K. At Block 722, the wafer and carrier are aligned and then bonded at Block 724, for example using eutectic bonding, as was illustrated, for example, in FIG. 1C. The bonded devices then proceed to backend processing operations at Block 726, as will be described in FIG. 8. It will be understood by those having skill in the art that all of the operations of FIG. 7 may be performed at a chip factory, also commonly referred to as a "Fab".

Figure 8:
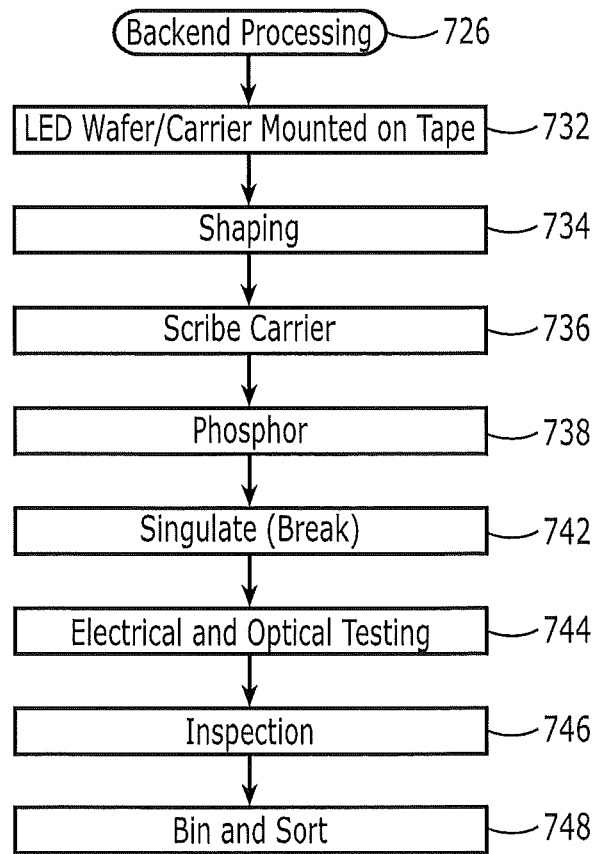

FIG. 8 illustrates the backend processing flow that may also take place at a chip factory or at a module/fixture factory. Referring to FIG. 8, at Block 732, the LED wafer and carrier that are bonded together is mounted on a tape. At Block 734, wafer shaping may take place if applicable. The shaping may include forming an "X"-cut or other top cut along with other operations to texture the LED substrate or the LED die, as was illustrated, for example, in FIG. 1H. A bevel cut may also be performed at Block 734, as was illustrated, for example, in FIGS. 1D, 1L and/or 1M. Scribing of the carrier may also take place at Block 736 using, for example, a straight cut, as was illustrated, for example, at FIG. 1C. A post-saw cleanup using, for example, Reactive Ion Etching (RIE) can then be performed. Phosphor and an optional protective layer are then deposited, for example by spraying or other coating techniques at Block 738, as was illustrated, for example, in FIGS. 1E, 1H and 1N. An initial probe, such as a color target probe, may be performed. Singulation then takes place at Block 742, for example by taking apart the dies using a slotted anvil, as was illustrated, for example, in FIGS. 1F and 1I. The tape may then be stretched to further separate the singulated devices and a post-stretch cure of the tape may then be performed if desired. Electrical and optical testing may then take place at Block 744 and an optical inspection, such as a visual inspection, may take place at Block 746. The LEDs are then binned and sorted at Block 748. It will be understood that operations 732-748 of FIG. 8 may all take place at the chip factory.

FIGS. 9A, 9B, 10A and 10B illustrate an increased packing density or light output per unit area/volume/height that may be provided according to various embodiments described herein. FIG. 9A is a cross-section and FIG. 9B is a plan view of a mounting board 310 with a plurality of LEDs 900 mounted thereon, according to any of the various embodiments described herein. For ease of illustration, the connectors and contacts, the internal structure of the LED and the phosphor/protective layers are not illustrated. As shown, the carrier substrate 180' may be of approximately same size as the LED epi region 110. In other embodiments, the LED die and the carrier die have sides that are within 100 μm or within about 15% of one another in length. In other embodiments, the LED die and the carrier die have areas that are within 70% of one another, in other embodiments within 85% of one another, and in still other embodiments have same areas. Moreover, a dome or other separate lens need not be provided. Accordingly, packing on the fixture mounting board 310 may be dense.

Figure 10A:
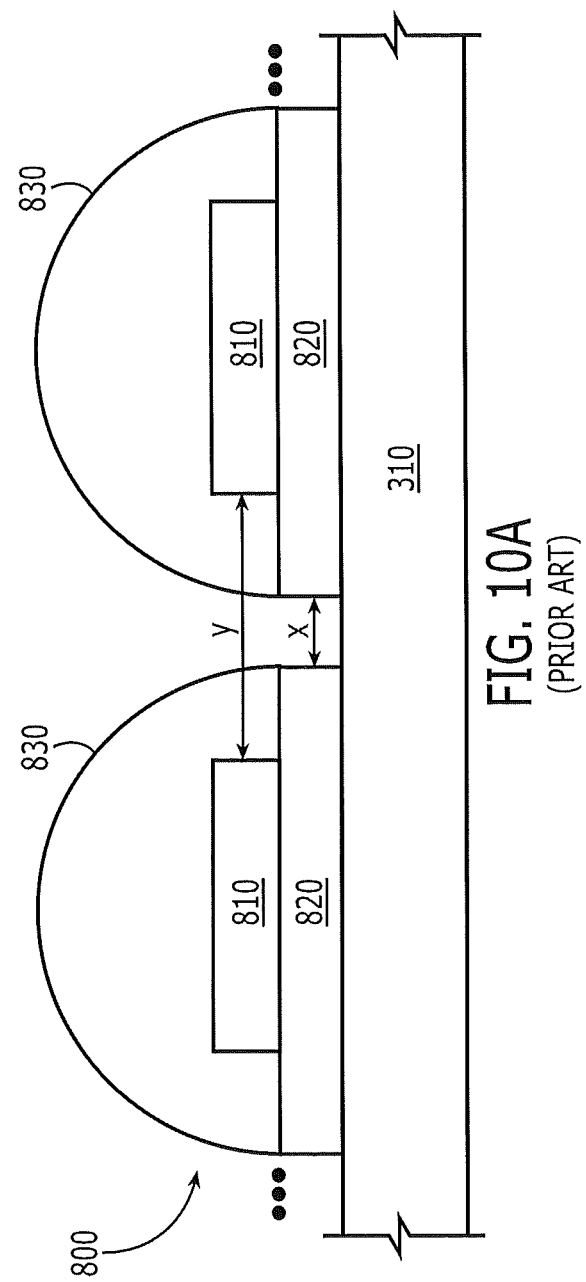
FIG. 10A is a cross-section of a conventional packing of LED dies on a carrier substrate.

In sharp contrast, FIG. 10A illustrates conventional packing of LED 810 on a carrier substrate 820, also referred to as a submount, which is in turn mounted on a fixture mounting board 310. Each LED 800 also includes an associated dome 830 thereon. The submount 820 typically needs to be much bigger than the LED die 810 in order to accommodate the dome thereon. Accordingly, the packing density is generally much lower than may be provided according to various embodiments described herein.

Figure 10B:
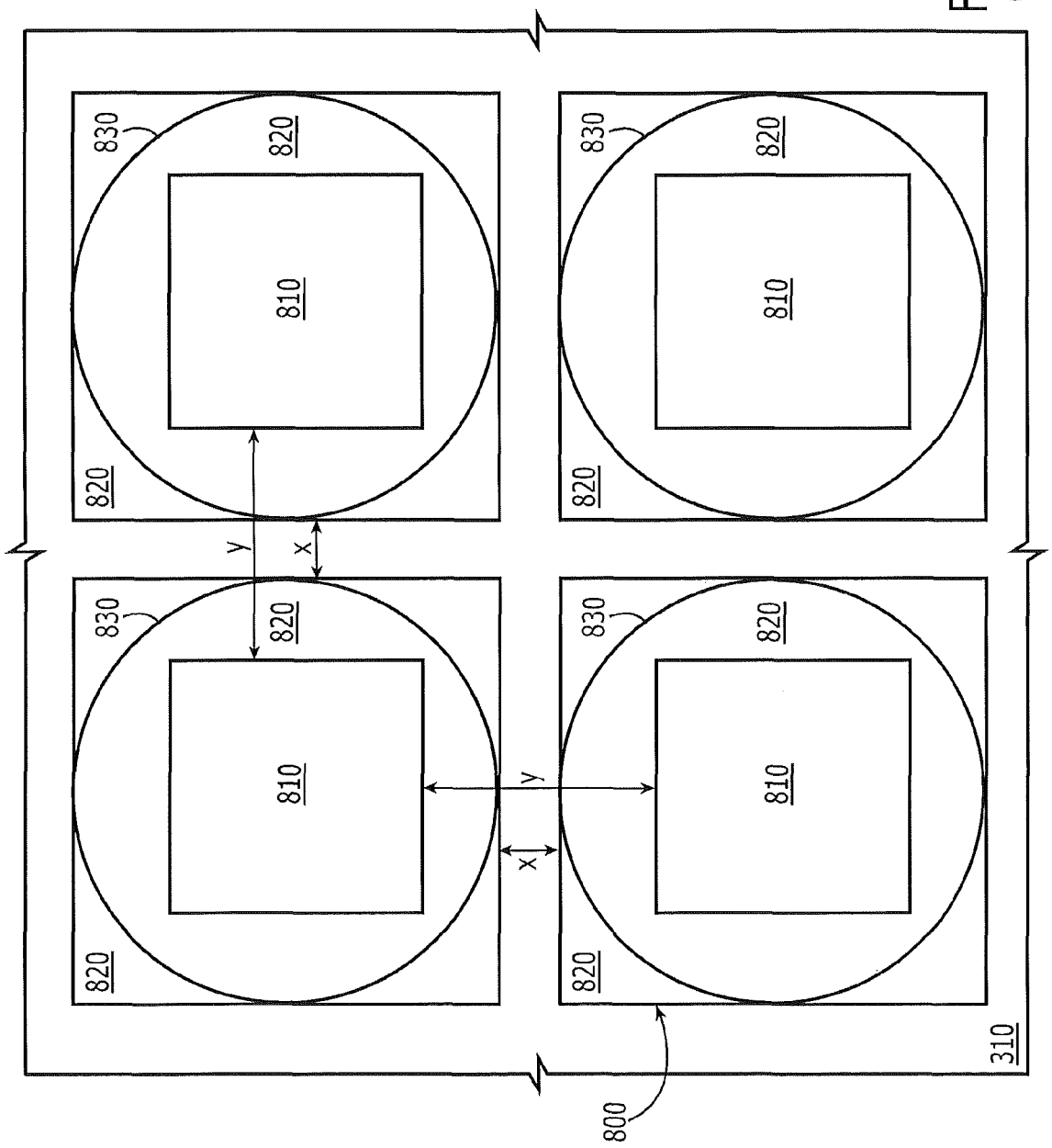
FIG. 10B is a plan view of FIG. 10A.

For example, consider that the LED epi region 110 of FIGS. 9A and 9B and the LED die 810 of FIGS. 10A and 10B are both about 1.0×1.0 mm in size. The carrier substrate 180' of FIGS. 9A and 9B may be slightly larger, for example about 1.1×1.1 mm in size. Thus, according to various embodiments described herein, the carrier substrate 180' of FIGS. 9A and 9B may be about the same size as the LED epi region 110. The spacing between adjacent LEDs 900, shown as "x" in FIGS. 9A and 9B, may be about 100 μm in this example. Other LED epi region 110 and die sizes that may be used include 0.5 mm×0.5 mm.

In sharp contrast, in FIGS. 10A and 10B, the submount 820 is much larger than the LED die 810, for example at least about 3×3 mm in size using the same LED die size (about 1.0×1.0 mm) as FIGS. 9A/9B. This larger size submount 820 is needed to hold the dome 830. Therefore, the distance "y" between adjacent LED dies 810 may be about 2000 μm, assuming the same submount spacing x. Thus, embodiments of FIGS. 10A-10B have much lower die packing density on the mounting board 310 than various embodiments described herein, for example in FIGS. 9A and 9B. Embodiments of FIGS. 9A and 9B can therefore provide for greater light output per unit area of the mounting board 310.

A comparison between existing LEDs, as illustrated by LEDs 800 of FIGS. 10A and 10B, and LEDs according to various embodiments described herein, as illustrated by LEDs 900 of FIGS. 9A and 9B, will now be provided, to quantitatively illustrate the higher optical efficiency that may be provided according to various embodiments described herein.

Specifically, LEDs 800 of FIGS. 10A and 10B may be represented by a Cree® XLamp® XB-D white LED, as described extensively in the Product Family Data Sheet entitled "Cree® XLamp® XB-D White LED", Cree Document No. CLD-DS45 Rev 4, 2011-2012, the disclosure of which is hereby incorporated herein by reference in its entirety as if set forth herein. As described in this Data Sheet, an XB-D LED die 810 may have dimensions of 0.7 mm×0.7 mm, or about 0.5 mm². The submount or carrier 820 may have dimensions of 2.45 mm×2.45 mm, or about 6 mm². The total height of the XB-D LED may be 1.84 mm, with the total thickness of the carrier being 0.76 mm and the total thickness of the dome 830 being 108 mm. As noted on the first page of the above-cited Product Family Data Sheet, the XB-D white LED constitutes Cree's smallest lighting class LED, and may produce up to 136 lumens/watt (lm/w) of cool white light at a standard temperature of 85° C. and a standard drive current of 350 mA. Accordingly, on a per-unit area basis, the XB-D LED may produce up to 136 lm/w/ (2.45 mm×2.45 mm) or about 22 lumens per watt per square millimeter.

Figure 11:
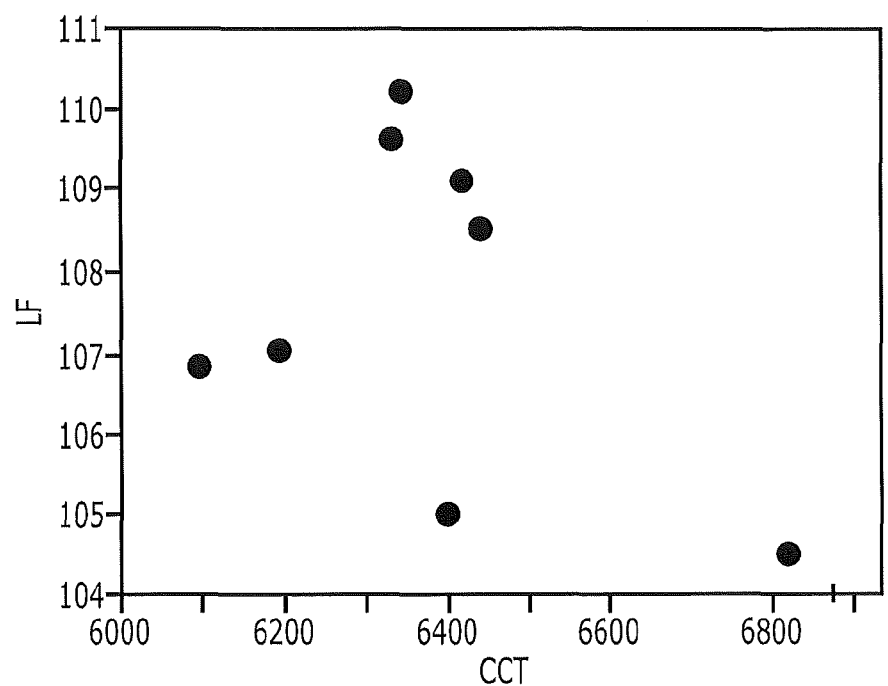
FIG. 11 illustrates performance of wafer level packaged LEDs according to various embodiments described herein.
Figure 12A:
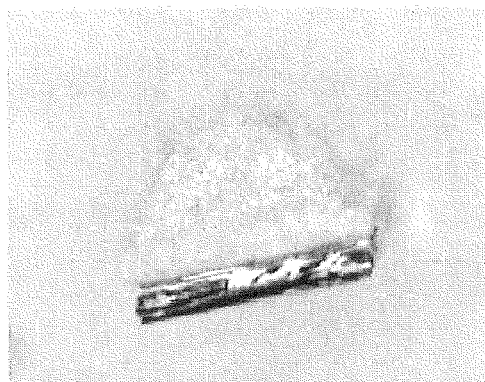
FIG. 12A is a photograph of a prototype LED according to various embodiments described herein, taken from the side.
Figure 12B:
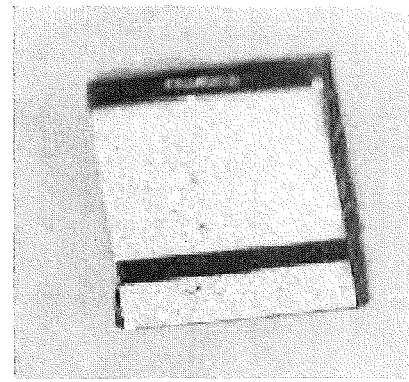
FIG. 12B is a photograph of a prototype LED according to various embodiments described herein, taken from the bottom.
Figure 12C:
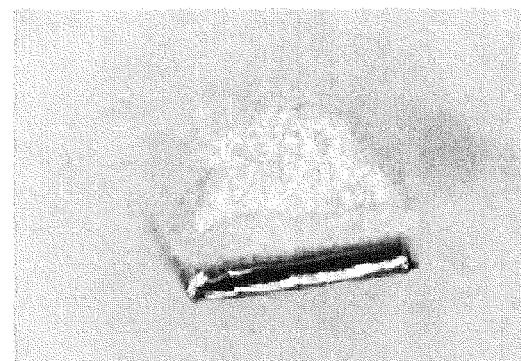
FIG. 12C is another photograph of a prototype LED according to various embodiments described herein, taken from the side.
Figure 12D:
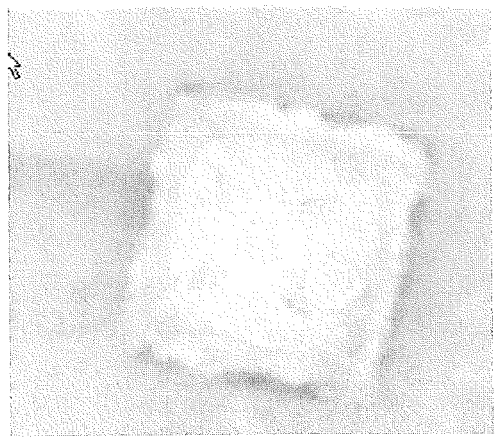
FIG. 12D is a photograph of a prototype LED according to various embodiments described herein, taken from the top.
Figure 12E:
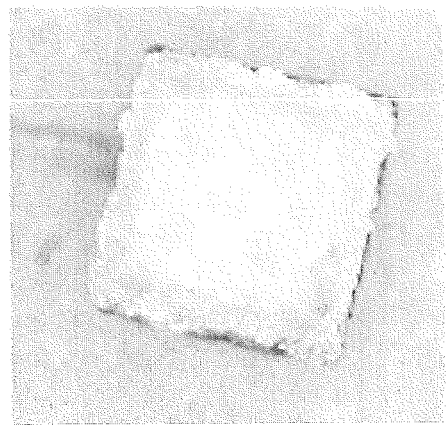
FIG. 12E is another photograph of a prototype LED according to various embodiments described herein, taken from the top.
Figure 13A:
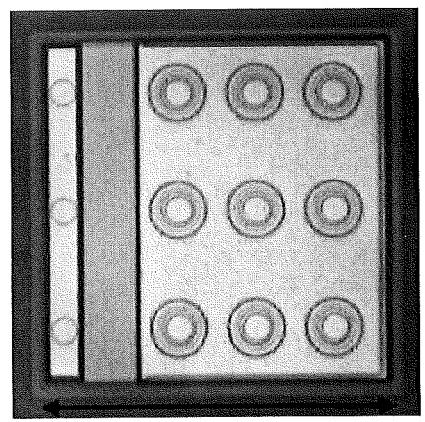
FIG. 13A is a photograph of a prototype LED according to various embodiments described herein, taken from the bottom.
Figure 13B:
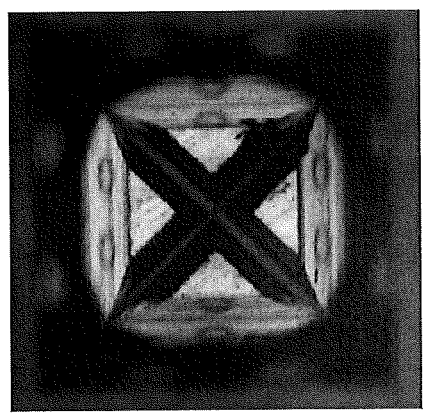
FIG. 13B is a photograph of a prototype LED according to various embodiments described herein, taken from the top.
Figure 13C:
FIG. 13C is a side view of a prototype LED according to various embodiments described herein.

In sharp contrast, various embodiments described herein, as illustrated in FIG. 9A, may use the same 0.7 mm×0.7 mm LED die 110 as the XB-D LED and may use a carrier die 180' that is also about 0.7 mm×0.7 mm in size. As shown in FIG. 11, various samples of these devices produced between about 105 and about 110 lumens of cool white light (between about 6100 and 6500 K in FIG. 11) for an average output of about 107 lumens per watt. Thus, an LED according to various embodiments described herein may produce 107 lm/w/(0.7 mm×0.7 mm), or at least about 200 lumens per watt per square millimeter. This constitutes an almost tenfold improvement in lumens per watt per square millimeter over the XB-D LED.

Accordingly, various embodiments described herein may provide a semiconductor LED die 900 that includes an LED epi region 110 and a carrier die 180' that is electrically connected to the semiconductor LED die 110, wherein the LED epi region 110 and the carrier die 180' have sides that are within 100 μm of one another, or within 15% of one another, in length. In some embodiments, the LED epi region 110 and the carrier die 180' have same side lengths. In other embodiments, the size difference between the LED epi region 110 and the carrier die 180' of FIG. 9A may be less than about 100 μm, less than about 200 μm, less than about 500 μm, less than about 10%, less than about 5% and, in various embodiments, may be substantially zero (so that the LED epi region 110 and the carrier substrate 180' may be about the same size). These relationships may apply to any carrier die and LED die that are smaller, larger or different from various embodiments described herein. In some embodiments, these LEDs can produce at least 45 lumens per watt per square millimeter of, in some embodiments, cool white light (about 6000 K). In other embodiments, these LEDs can produce at least 100 lumens per watt per square millimeter, and in yet other embodiments, these LEDs can produce at least about 200 lumens per watt per square millimeter of, in some embodiments, cool white light (about 6000 K). For warm white light, these values may be decreased by about 30%, so that various embodiments described herein can produce at least 30 lumens of warm white light (about 3000 K) per watt per square millimeter, and in some embodiments, 70 lumens of warm white light per watt per square millimeter, and in yet other embodiments, at least about 140 lumens of warm white light per watt per square millimeter of area of the carrier die.

The comparative output of the XB-D LED of FIGS. 10A-10B and LEDs according to various embodiments described herein, may also be provided on a "per volume" (mm$^3$) basis. As used herein, "volume" means the product of the area of the carrier die and the total height of the LED, and does not take into account the decreased volume caused by the shape of the dome 830 and/or beveling of the LED die. As described in the above-cited Product Family Data Sheet, the XB-D LED may have a total height of about 1.84 mm, so that its total output per unit volume may be calculated as 136 lm/w/(2.45 mm×2.45 mm×1.84 mm), or about 12 lumens per watt per cubic millimeter. In sharp contrast, various embodiments as illustrated in FIGS. 9A and 9B, may have a total height of about 1 mm, so as to produce at least 45 lumens per watt per cubic millimeter of volume of the LED in some embodiments, at least about 100 lumens per watt per cubic millimeter of volume of the LED in other embodiments, and at least about 200 lumens per watt per cubic millimeter of volume of the LED in yet other embodiments, of cool white light. Warm white light values may be decreased by about 30%, to produce at least 30 lumens of warm white light per cubic millimeter of volume of the LED in some embodiments, at least 70 lumens of warm white light per watt per cubic millimeter of volume of the LED in other embodiments, and at least about 140 lumens of warm white light per watt per cubic millimeter of volume of the LED in yet other embodiments.

As was described above, various embodiments described herein can provide very small LED die/carrier packages compared to, for example, XB-D LEDs described in the above-cited Product Family Data Sheet. As was described above, the XB-D LED has an area of about 2.45 mm×2.45 mm or about 6 mm$^2$. In contrast, using the same LED die size of 0.7 mm×0.7 mm, various embodiments described herein may have area of about 0.5 mm$^2$. Other embodiments described herein may use a larger die size and a larger carrier size to produce an area of less than about 1 mm$^2$, and yet other embodiments may further increase the die and carrier size to produce an area of less than about 2 mm$^2$. Smaller die sizes may also be used. Moreover, the height of various embodiments described herein may be less than about 1.5 mm in other embodiments.

Other dimensions of various embodiments described herein will now be provided. Specifically, the carrier die 180 may have a thickness of between 50 μm and about 100 μm, and the LED die (epi region 110 and substrate 120) may have a thickness of between about 100 μm and about 1000 μm, and in some embodiments may be about 150 μm, about 250 μm or about 400 μm thick, and in some embodiments less than about 500 μm thick. A specific embodiment may use a carrier die that is about 100 μm thick and an LED die that is about 335 μm thick. Specific thicknesses for an LED die that is 240 mm×320 mm in area may be about 140 μm; for an area of 500 mm×500 mm may be about 250 μm; for an area of 350 mm×470 mm may be about 155 μm; for an area of about 700 mm×700 mm, 850 mm×850 mm, 1000 mm by 1000 mm or 1400 mm×1400 mm may be about 355 μm. Moreover, commercially available sapphire die may be between 85 μm and about 150 μm thick, and typically less than about 200 μm thick. A phosphor coating may be added in some embodiments, which may have a thickness of less than about 1 mm in some embodiments, between 10 μm and 500 μm in other embodiments, and in yet other embodiments between about 20 μm and about 60 μm.

Accordingly, an LED according to various embodiments described herein may comprise a semiconductor LED die that includes an LED epi region and a carrier die that is electrically connected to the LED die, wherein the LED epi region and the carrier die have sides that are within 100 μm of one another in length and, in some embodiments, have the same side lengths. Moreover, these LEDs may be combined with a light fixture mounting board on which the LED die is mounted and a light fixture housing in which the light fixture mounting board is mounted to provide a light fixture, wherein the light fixture is free of a dome between the LED die and the light fixture housing.

Other embodiments may provide an LED light fixture that includes a light fixture mounting board, a plurality of LEDs mounted on the light fixture mounting board, and a light fixture housing in which the light fixture mounting board including the plurality of LEDs thereon is mounted. The light fixture is free of a dome between a respective LED and the light fixture housing.

FIGS. 12-16 provide photographs of prototype LEDs according to various embodiments described herein. These figures are provided to highlight the scale and/dimensional relationships between the various features of the prototype LEDs, such as the carrier, the epi region, the primary optic and the phosphor layer, according to various embodiments described herein. Specifically, FIG. 12A, is a side photograph, FIG. 12B is a bottom photograph, FIG. 12C is another side photograph and FIGS. 12D and 12E are top photographs of a prototype LED according to various embodiments described herein. FIG. 13A provides a more detailed bottom photograph, and FIG. 13B provides a more detailed top photograph. FIG. 13C provides a side photograph with dimensions, based on a carrier die and substrate die that are 0.7 mm×0.7 mm in size.

Figure 14:
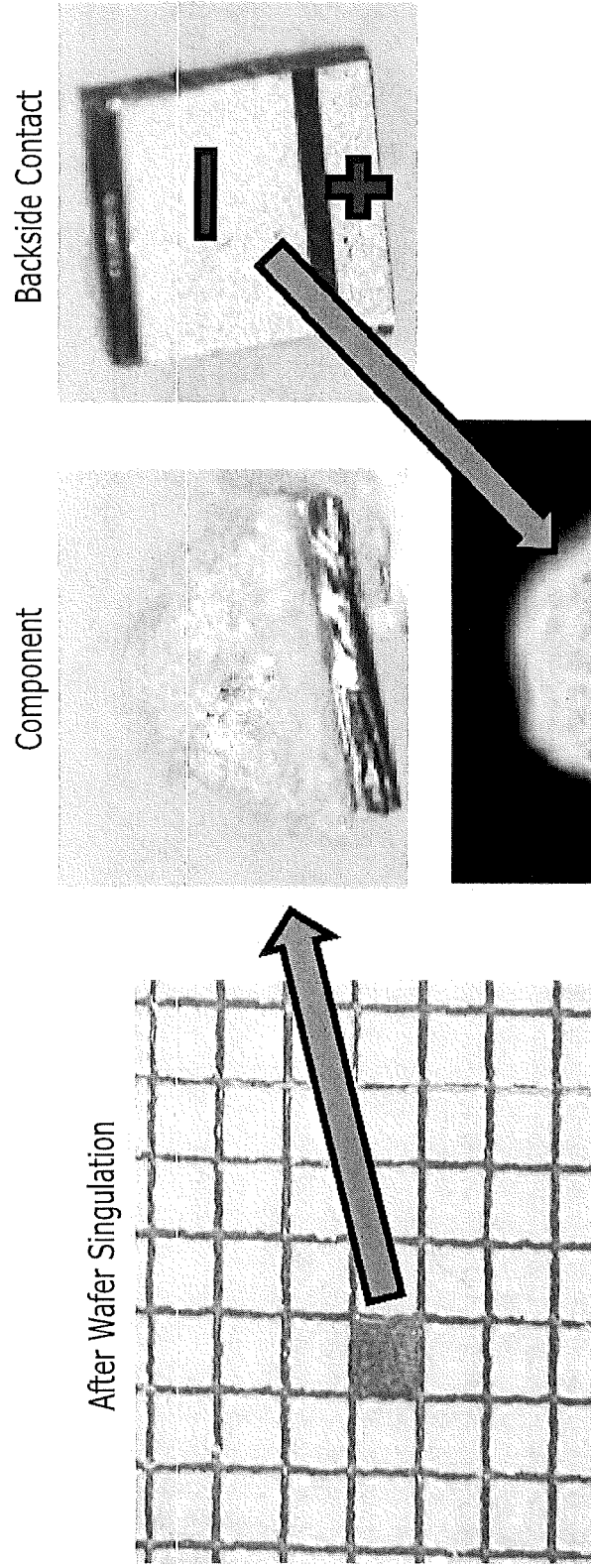
FIG. 14 is a series of photographs of prototype LEDs according to various embodiments described herein, after wafer singulation and biasing of a backside contact.
Figure 15:
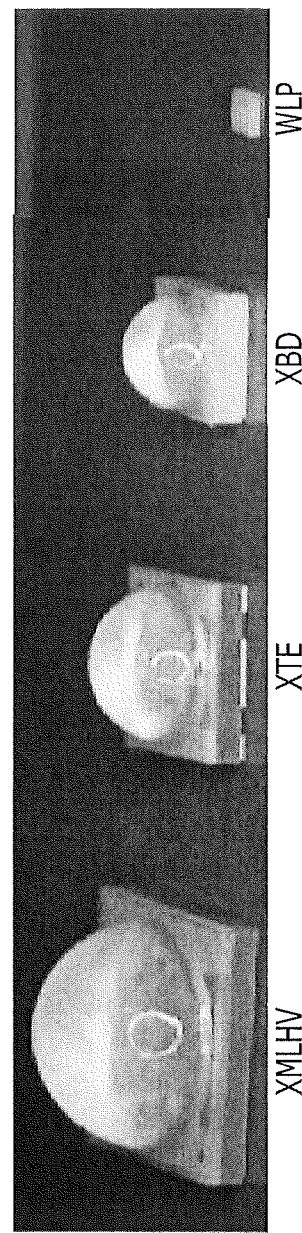
FIG. 15 is a photograph illustrating relative sizes of a prototype LED according to various embodiments described herein (far right side) and other LEDs.
Figure 16:
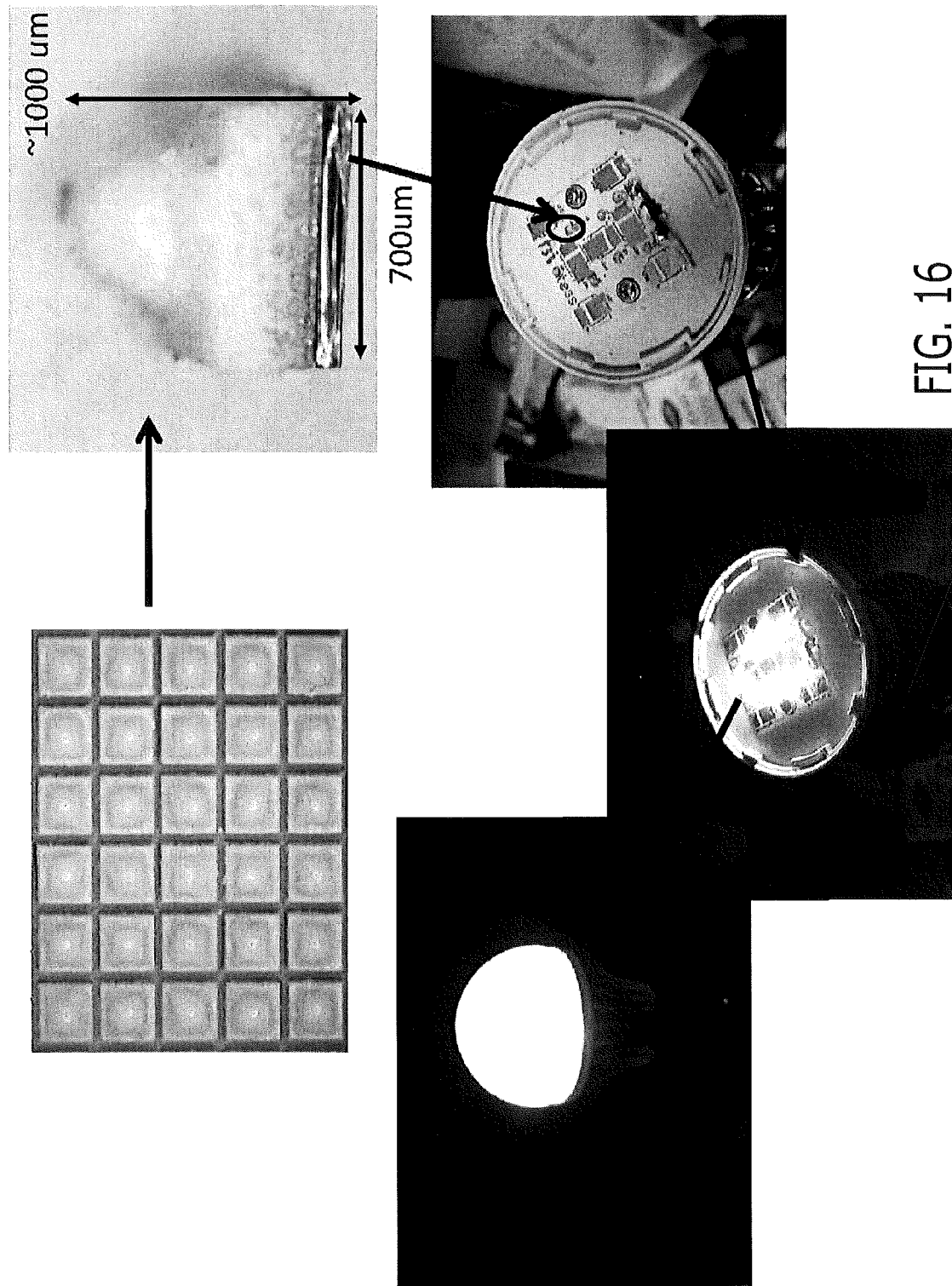
FIG. 16 is a series of photographs of prototype LEDs according to various embodiments described herein after singulation, mounted on a mounting board and mounted in an LED fixture.

FIG. 14 provides photographs of a wafer after singulation, a prototype LED component, a backside contact and a prototype LED under bias. FIG. 15 illustrates relative sizes of various LEDs, such as XM-L high voltage, XT-E and XB-D LEDs available from the assignee, Cree, Inc. wherein a 0.7 mm×0.7 mm LED according to various embodiments described herein is illustrated at the far right and is labeled "WLP". Finally, FIG. 16 provides photographs of an LED according to various embodiments described herein after die separation, and when mounted on a mounting board and installed in a fixture.

Accordingly, various embodiments described herein can move testing and singulation to the very end of the wafer level processing. Production efficiency and/or luminous efficiency may thereby be improved.

Wafer Level Packaging of Multiple LEDs on a Single Carrier Die

Wafer level packaging of multiple LED chips on a single carrier die according to various embodiments will now be described. Specifically, various embodiments described above in connection with FIGS. 1A-16 provided a one-to-one correspondence among the LED dies on the LED wafer and the carrier dies on the carrier wafer, so that after singulation, a single LED die is joined to a respective carrier die. In contrast, various embodiments that will now be described in connection with FIGS. 17-36 may arise from a recognition that it may be desirable to join a plurality of LED dies to a single carrier die using wafer level packaging techniques that were described above. The multiple LED dies may be connected on the single carrier die in series and/or in parallel, to provide an LED chip. By connecting a plurality of LED dies on a single LED chip in series, a higher voltage LED chip may be provided. Moreover, by connecting a plurality of LED chips in parallel on a single carrier die, a higher current LED chip may be provided. Other potential advantages in terms of cost and/or performance may be obtained by providing a plurality of LED dies that are electrically connected in series and/or in parallel on a single carrier die.

Figure 17:
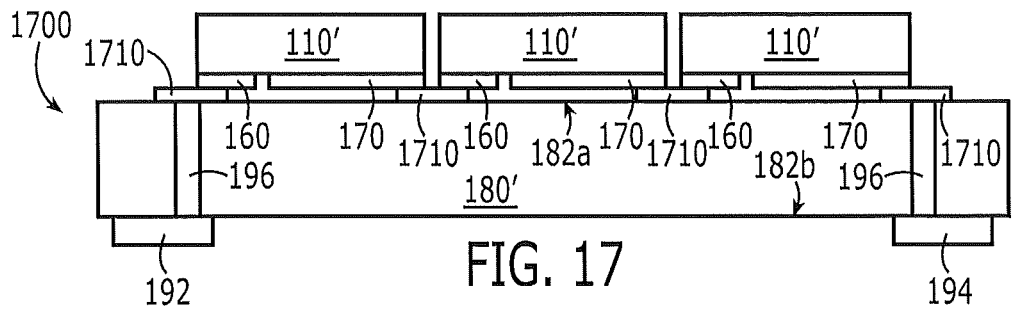
FIGS. 17-27 are cross-sections of LED chips according to various embodiments described herein.

FIG. 17 is a cross-sectional view of an LED chip according to various embodiments described herein. Referring to FIG. 17, the LED chip 1700 includes a plurality of LED dies 110', a respective one of which includes an anode contact 160 and a cathode contact 170 on a face thereof. The LED dies 110' may be fabricated and configured according to any of the embodiments described in connection with FIGS. 1A-16. A carrier die 180' includes a first face 182a and a second face 182b. A plurality of internal contacts 1710 are provided on the first face 182a, that are configured to electrically connect the anode and cathode contacts 160 and 170, respectively, of the plurality of LED dies 110', in series and/or in parallel, when the carrier die 180' is electrically connected to plurality of LED dies 110'. The carrier die 180' also includes an external anode contact 192 and an external cathode contact 194 on the second face 182b. The external anode and cathode contacts 192, 194 may be connected to separate ones of the internal contacts 1710 using a plurality of vias 196. Moreover, in any of the embodiments described herein, the contacts that are configured to electrically connect the anode and cathode contacts of a plurality of LED dies in series and/or in parallel may be provided internal to the carrier die 180', in addition to or instead of on a face thereof, using techniques that may be similar to those used for multilayer wiring substrates or multilayer printed circuit boards having internal wiring layers.

Still referring to FIG. 17, the plurality of LED dies 110' and the carrier die 180' are joined or connected to one another, so that the anode and cathode contacts 160, 170, respectively, of the LED dies 110' are adjacent the first face 182a of the carrier die 180' and the plurality of internal contacts 1710 on the first face 182a electrically connect the anode and cathode contacts 160, 170 of the plurality of LED dies 110' in series and/or in parallel. Various connection configurations will be described below in connection with FIGS. 28A-28C.

The LED dies 110' and the carrier die 180' may be embodied according to any of the embodiments that were described in connection with FIGS. 1A-16. For example, the LED dies 110' may be fabricated from an LED wafer 100, as was described in any of the embodiments described in connection with FIGS. 1A-16. Moreover, the carrier die 180' may be fabricated from a carrier wafer 180 according to any of the embodiments described in connection with FIGS. 1A-16, except that the anode pads 184 and cathode pads 186 may be replaced by the plurality of internal contacts 1710.

Accordingly, embodiments of FIG. 17 may be regarded as providing a submount 180' with traces 1710 on the top side 182a for mounting LED dies 110' in series, and a single anode 192 and cathode 194 on the backside for each string of LEDs 110'. Dies 110' may be mounted at the wafer level, and singulated to a component, as shown in FIG. 17. The submount 180' may be cut as a high aspect ratio rectangle, where, for example, a single row of dies 110' is mounted end-to-end in a linear fashion. However, the submount may be other shapes, such as a square submount, as will be described below. An oxide film may also be provided under the top side pads, to reduce submount leakage.

Figure 36:
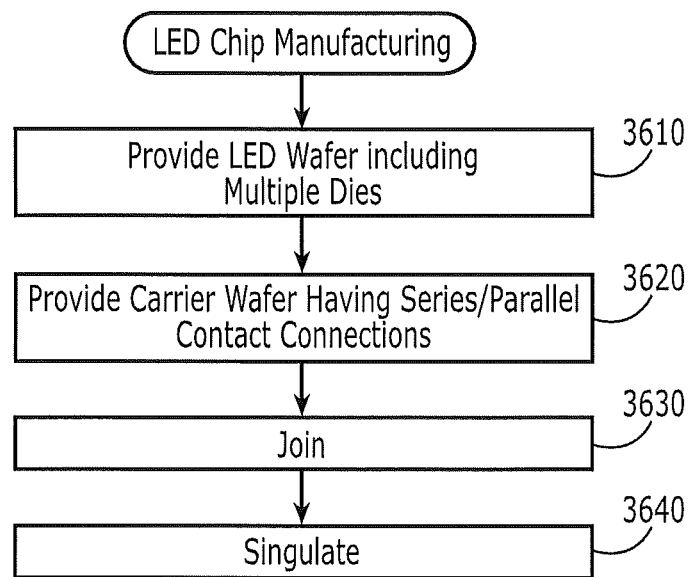
FIG. 36 is a flowchart of operations that may be performed to manufacture LED chips according to various embodiments described herein.

FIG. 36 is a flowchart of operations that may be performed to manufacture an LED chip, such as the LED chip 1700 of FIG. 17, according to various embodiments described herein. Referring to FIG. 17, at Block 3610, an LED wafer that includes a plurality of LED dies is provided. The plurality of LED dies include anode and cathode contacts on a face thereof. The LED wafers may be embodied by LED wafers 100, according to any of the embodiments described in connection with FIGS. 1A-16.

At Block 3620, a carrier wafer is provided. The carrier wafer includes first and second opposing faces and a plurality of internal contacts on the first face that are configured to electrically connect the anode and cathode contacts of at least two of the LED dies in series and/or in parallel when the carrier wafer is joined to the LED wafer. The carrier wafer also includes at least one external anode contact and at least one external cathode contact on the second face. A carrier wafer 180 according to any of the embodiments described in connection with FIGS. 1A-16 may be used, except that the internal contact structure is modified to provide the series/parallel connections.

Still referring to FIG. 36, at Block 3630, the LED wafer and the carrier wafer are joined, so that the anode and cathode contacts of the LED dies are adjacent the first face of the carrier wafer and the plurality of internal contacts on the first face electrically connect the anode and cathode contacts of the at least two of the LED dies in series and/or in parallel. Wafer joining may take place using any of the techniques that were described above in connection with FIGS. 1A-16.

Still referring to FIG. 36, at Block 3640, the LED wafer and the carrier wafer that have been joined are singulated to provide a plurality of LED chips, a respective one of which includes a single carrier die, wherein a respective single carrier die includes a plurality of LED dies thereon that are electrically connected in series and/or in parallel. Any of the singulating techniques described above in connection with FIGS. 1A-16 may be used, provided that, after singulation, a single carrier die includes multiple LED dies thereon that are connected in series and/or in parallel. It will be understood that singulation may be performed using multiple operations. For example, a first singulation operation may singulate the LED dies from one another in the LED wafer, and a second singulation operation may singulate the individual carrier dies in the carrier wafer. In other embodiments, the individual LED dies for a single carrier die need not be singulated, and a single singulation operation may be used to singulate the carrier wafers and the plurality of LED chips that are associated with the single carrier wafers.

Still referring to FIG. 36, between the joining (Block 3630) and the singulating (Block 3640), various scribing, substrate shaping, phosphor applying, electrical/optical testing, inspection, binning and/or sorting operations may take place as was described in connection with FIGS. 1A-16 above. Moreover, after singulating at Block 3640, various packaging and/or fixture manufacturing operations may also take place, as was described above in connection with FIGS. 1A-16. It will be understood that any of the embodiments described above in connection with FIGS. 1A-16 may be used in connection with wafer level packaging of multiple LED dies on a single carrier die according to various embodiments described herein. For example, the LED dies 110' may include an LED epi region on an LED substrate, as was described above in connection with FIGS. 1A-16. As was also described in connection with FIGS. 1A-16, at least a portion of the LED substrate may be removed. As was also described in connection with FIGS. 1A-16, a respective LED die 110' may include a sidewall, at least a portion of which is oblique to the face of the LED die. Moreover, the carrier die 180' may comprise silicon. Various other embodiments will now be described.

Figure 18:
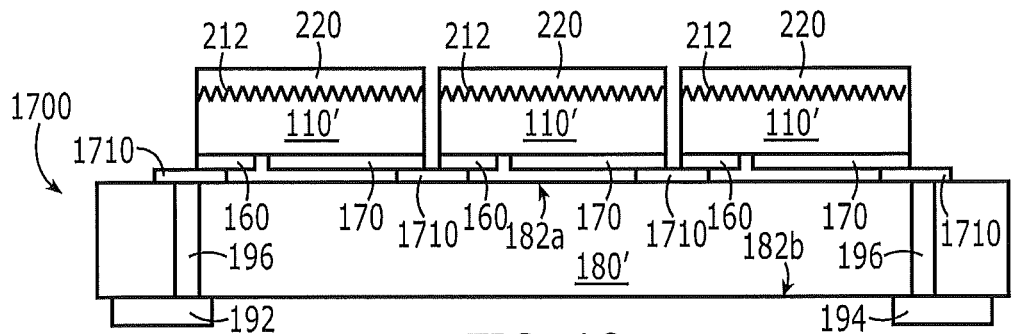

FIG. 18 illustrates other embodiments, wherein a face of a respective LED die 110' that is opposite the anode and cathode contacts 160, 170 includes a textured surface 112, as was described above in connection with FIGS. 1A-16. Other shaping operations may be performed, as was described above in connection with FIGS. 1A-16. The shaping may be performed between the joining and singulating operations (Blocks 3630 and 3640 of FIG. 36).

Still referring to FIG. 18, a face of a respective LED 110' that is opposite the anode and cathode contacts 160, 170 includes a wavelength conversion material 220 thereon, according to any of the embodiments that were described above in connection with FIGS. 1A-16. The wavelength conversion material 220 may be applied between the joining and the singulating operations as was described above in connection with FIGS. 1A-16. The wavelength conversion material 220 may also be applied after singulating, for example using spraying and/or other deposition techniques, so that the wavelength conversion material can also cover portions of the carrier die 180' that do not have an LED die 110' thereon. As also shown in FIG. 18, both texturing 212 and wavelength conversion material 220 may be used, in some embodiments. Moreover, as was described above in connection with FIGS. 1A-16, the sidewalls of the LED dies 110' may also include texturing and/or a wavelength conversion material thereon and may be fabricated as was described in connection with FIGS. 1A-16.

Figure 19:
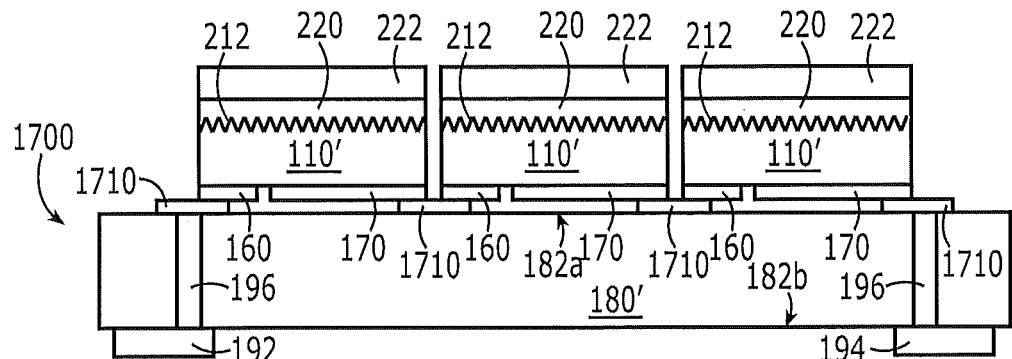

Referring to FIG. 19, a protective material 222 may also be provided on a face of a respective LED die 110' that is opposite the anode and cathode contacts 160, 170. The protective material 222 may be applied at the wafer level, according to any of the embodiments that were described above in connection with FIGS. 1A-16, and may also be applied to the sidewalls of the LED dies, according to any of the embodiments that were described above in connection with FIGS. 1A-16. Various combinations and subcombinations of texturing 212, wavelength conversion material 220, and protective material 222 may be provided. In some embodiments, the wavelength conversion material 220 comprises silicone having phosphor particles therein, and the protective material 222 may comprise the silicone without the phosphor particles therein.

Figure 20:
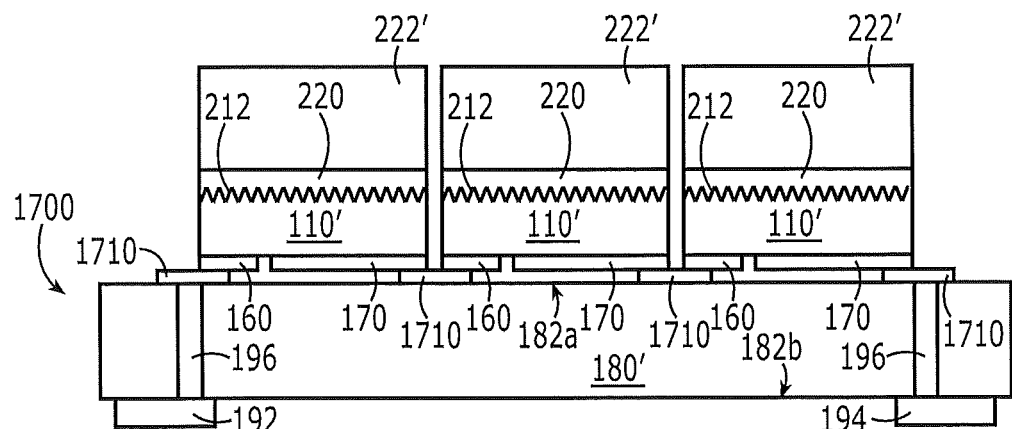

FIG. 20 illustrates a relatively thick protective layer 222' that may also provide a primary optic for the LED as described, for example, in U.S. patent application Ser. No. 13/649,052 to Lowes et al., filed Oct. 10, 2012, entitled "LED Package With Encapsulant Having Planar Surfaces", the disclosure of which is incorporated herein by reference as if set forth fully herein. Accordingly, the protective layer 222, 222' can provide optical, encapsulation and/or other properties.

Figure 21:
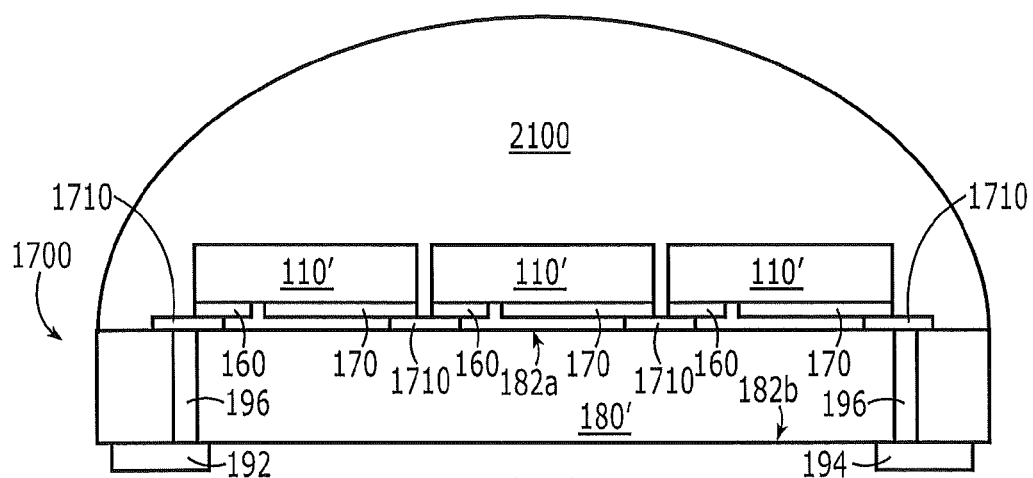

FIG. 21 illustrates other embodiments wherein a dome 2100 is provided that extends from the first face of the carrier die 180' across the plurality of LED dies 110'. The dome 2100 may be molded or formed using any conventional techniques. The dome may include phosphor particles therein and/or thereon in a uniform or nonuniform composition and/or concentration.

Figure 22:
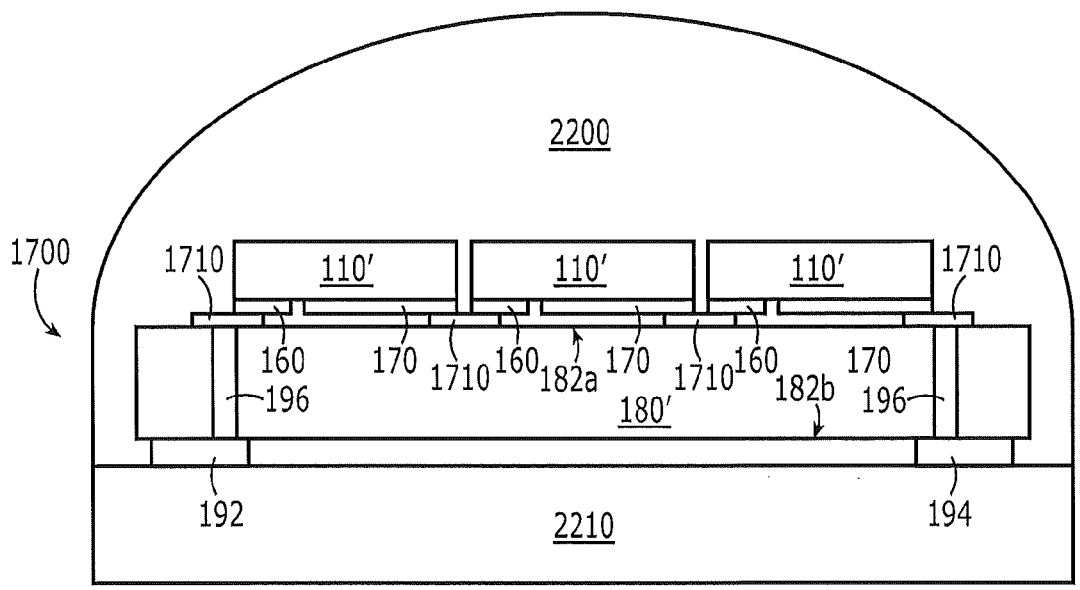

FIG. 22 illustrates other embodiments that further include a mounting substrate 2210 on the carrier die 180', remote from the plurality of LED dies 110, and a dome 2200 that extends from a face of the mounting substrate 2210 across the carrier die 180' and across the plurality of LED dies 110'. The dome 2200 may be molded or formed using any conventional techniques. The dome may include phosphor particles therein and/or thereon in a uniform or nonuniform composition and/or concentration.

Figure 23:
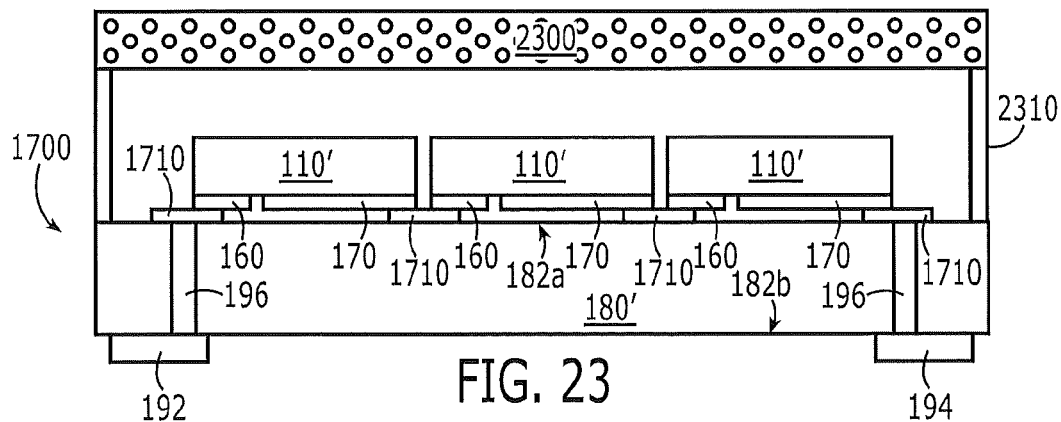

FIG. 23 illustrates other embodiments wherein a layer 2300 of wavelength conversion material such as phosphor is provided that is remote from the plurality of LED dies 110'. A housing or standoff 2310 may be used to maintain the wavelength conversion layer 2300 remote from the plurality of LED dies 110'. The wavelength conversion layer 2300 may include a binder, such as a silicone binder including phosphor particles therein and/or thereon in a uniform or nonuniform composition and/or concentration. Air, other gas and/or other transparent material may be provided in the space between the wavelength conversion layer 2300 and the LED dies 110'.

Figure 24:
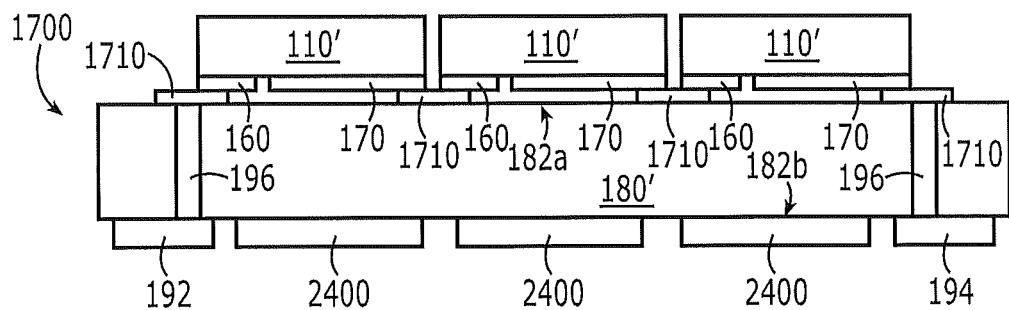

FIG. 24 illustrates other embodiments wherein the carrier die 180' further comprises at least one external thermal contact 2400 on the second face 182b that is not electrically connected to the external anode contact 192 or to the external cathode contact 194. In FIG. 24, three external thermal contacts 2400 are provided.

Figure 25:
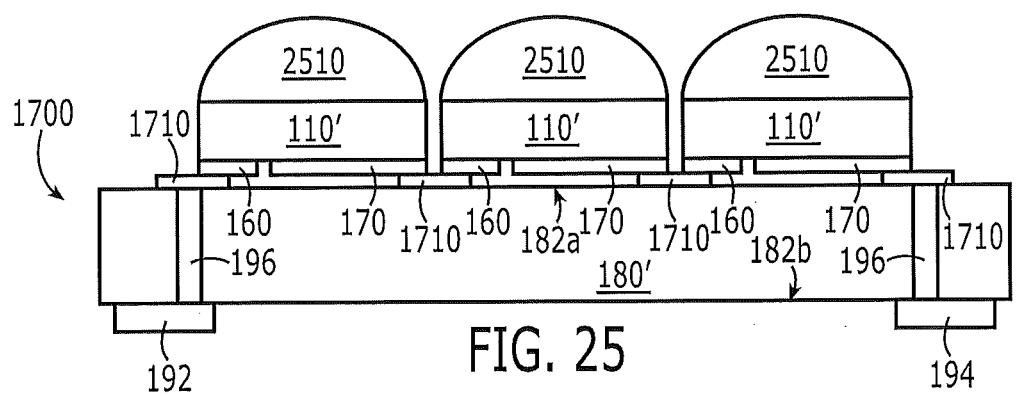

FIG. 25 illustrates other embodiments wherein a plurality of domes 2510 are provided, a respective one of which is on a respective LED die 110' remote from the anode and cathode contacts 160, 170 thereof. The individual domes may be formed using dispensing, overmolding, drop coating and/or other techniques. The dome 2510 may be molded or formed using any conventional techniques. The dome may include phosphor particles therein and/or thereon in a uniform or nonuniform composition and/or concentration.

Figure 26:
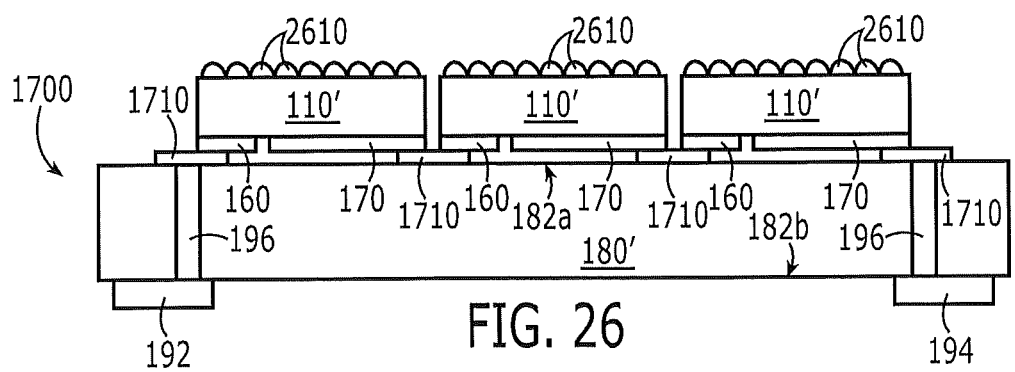

FIG. 26 illustrates a plurality of lenses 2610 on a respective LED die 110'. The plurality of lenses 2610 may be macro lenses having a dimension (such as height, width, diameter, etc.) of at least about 100 μm and/or microlenses having a dimension that is less than about 100 μm. The lenses 2610 need not be hemispherical, and may be identically or differently shaped and/or sized. The lenses can be fabricated from spin-on glass, BCB, transfer molding or photolithography, and may include phosphor therein and/or thereon.

Figure 27:
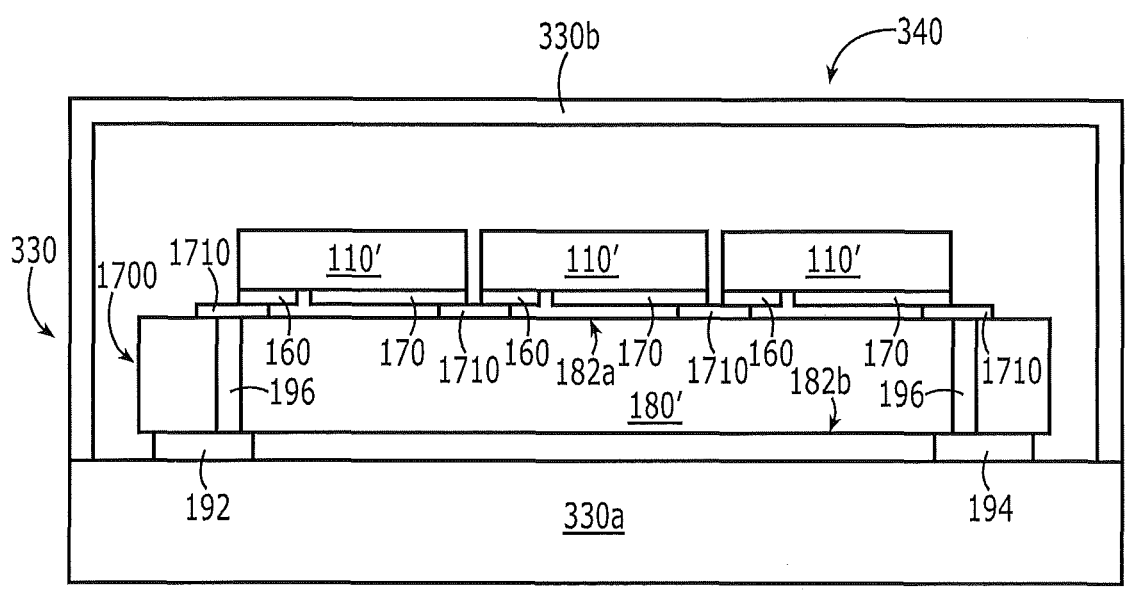

FIG. 27 illustrates an LED chip 1700 according to any of the embodiments described in connection with FIGS. 17-26 and 28A-36, installed in a light fixture housing 330 to provide a light fixture 340. As was described above in connection with FIG. 2, the light fixture housing 330 may include opaque/reflective portions 330a and transparent portions 330b, to allow light to emerge from the housing. A separate light fixture mounting board may be provided, as was described in connection with element 310 of FIG. 2, or the LED chip 1700 may be mounted directly in the housing 330 without the need for a light fixture mounting board. In some embodiments, the housing 340 is a vehicle headlight or taillight housing. The overall fixture 340 may be cheaper and/or more efficient, since the driver may be higher voltage when a string of series connected LED dies 110' is provided.

Figure 28A:
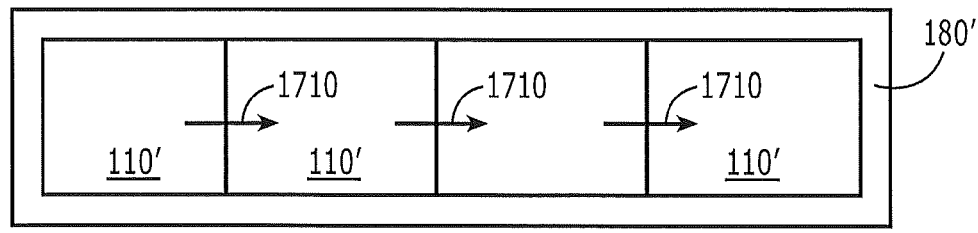
FIGS. 28A-28C are top views of LED dies on a carrier die according to various embodiments described herein.
Figure 28B:
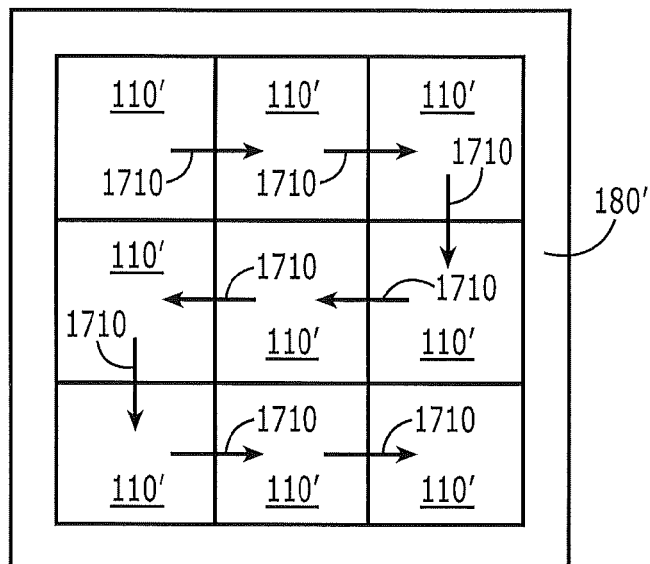
Figure 28C:
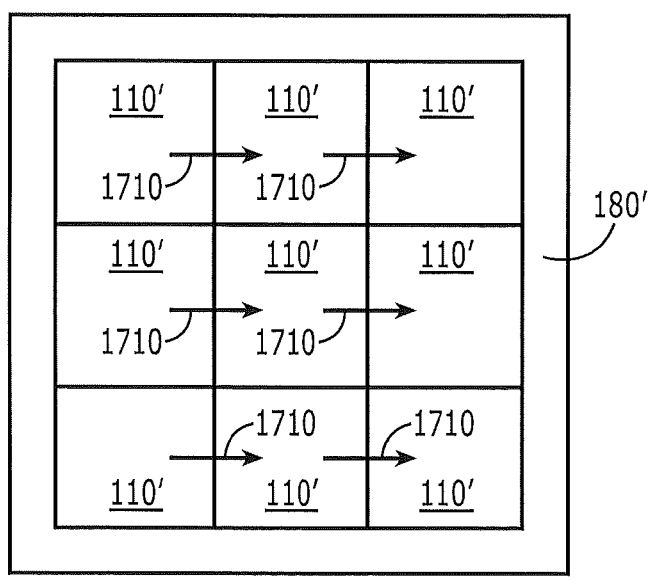

FIGS. 28A-28C illustrate various configurations of LED dies 110' on a carrier die 180' according to various embodiments described herein. For example, in FIG. 28A, a single row of the LED dies 110' is connected in series by the internal contacts 1710, represented by arrows in FIG. 28A. Thus, in FIG. 28A, the carrier die 180' may be an elongated (high aspect ratio) rectangle, such as may be used in vehicle headlights/taillights. The string can provide an LED filament for a fixture. More than one row of LED dies may be provided, and any number of LED dies greater than one may be provided.

In contrast, in FIG. 28B, the carrier die 180' is square shaped, and may include a series connection of, for example, nine (9) LED dies 110'. Fewer or more LED dies 110' may be used, and rectangular or other shaped carrier dies 180' (including circular) may be used. Moreover, in FIG. 28C, nine LED dies 110' may be connected in three parallel strings of three LED dies.

In some embodiments of FIGS. 28B and 28C, the carrier die 180' may have the same dimensions of a Cree® XLamp® XP-E high efficiency white LED, that is described in the data sheet "Cree® XLamp XP-E High Efficiency White LEDs", Cree Data Sheet No. CLD-DS34 Rev 3A, 2010-2012, the disclosure of which is hereby incorporated herein by reference in its entirety as if set forth herein. More specifically, in some embodiments of FIGS. 28B and 28C, the carrier die 180' may be 3.45 mm×3.45 mm in size, to provide the same external footprint as a Cree XLamp XP-E high efficiency white LED, but may include multiple LED dies connected in series (FIG. 28B) or in series/parallel (FIG. 28C).

Other configurations are also possible. For example, embodiments of FIG. 28B may include a single external anode contact and a single external cathode contact on the backside. Embodiments of FIG. 28C may also include a single external anode and cathode contact on the backside that connects the three series strings of three LED dies in parallel, or may include three pairs of external anode/cathode contacts on the backside, to provide three separate sets of series strings. Various other combinations/subcombinations of series and parallel connections may be provided. Moreover, larger or smaller footprints may be provided.

In some embodiments, the number of LED dies in each string may be a function of a desired voltage for the LED chip. For example, if one LED die 110' has a forward voltage of about 3V, then the forward voltage of the LED chip of FIG. 28B may be about 27V, and the forward voltage of the LED chip of FIG. 28C may be about 9V. Strings of four LEDs may also be provided, for example as was illustrated in FIG. 28A, to provide a 12V device, which may be particularly useful in vehicular applications.

Figure 29A:
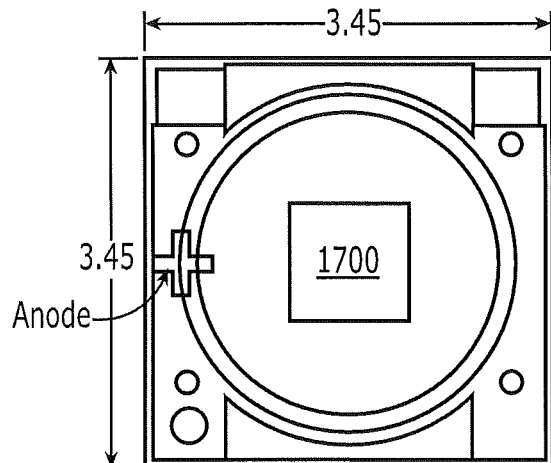
FIGS. 29A-29C are top view, side view and bottom view, respectively, of an LED chip according to various embodiments described herein in an LED package.
Figure 29B:
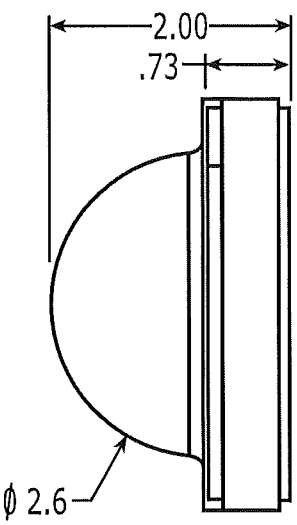
Figure 29C:
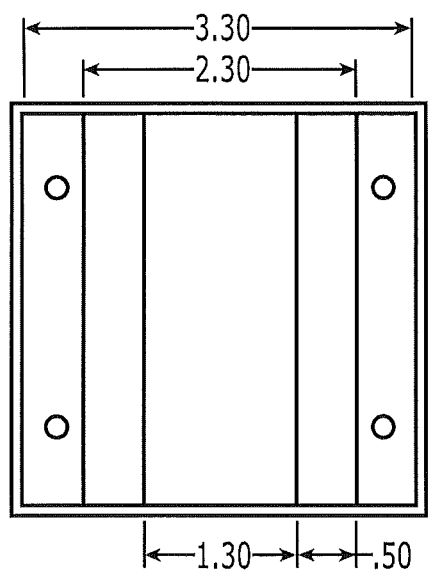

FIGS. 29A-29C illustrate other embodiments wherein an LED chip 1700 according to any of the embodiments described herein may be placed in a Cree XLamp XP-E high efficiency white LED package in place of a single LED die.

Figure 30A:
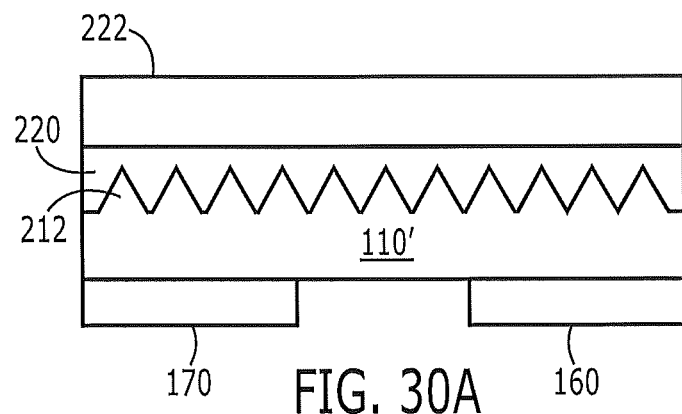
FIGS. 30A-30C are cross-sections of an LED die according to various embodiments described herein.
Figure 30B:
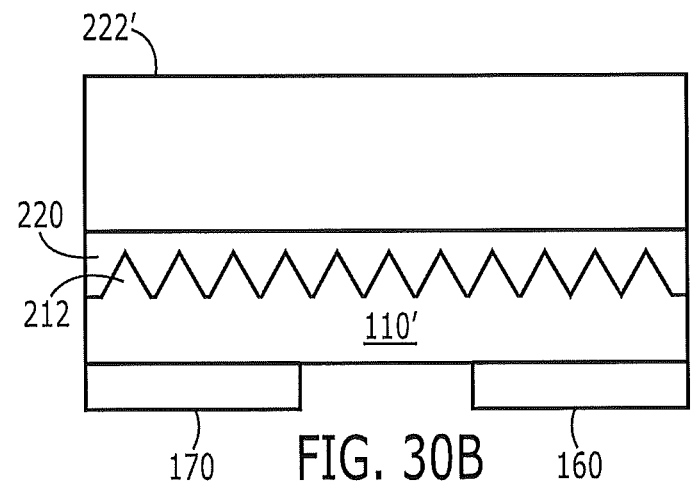
Figure 30C:
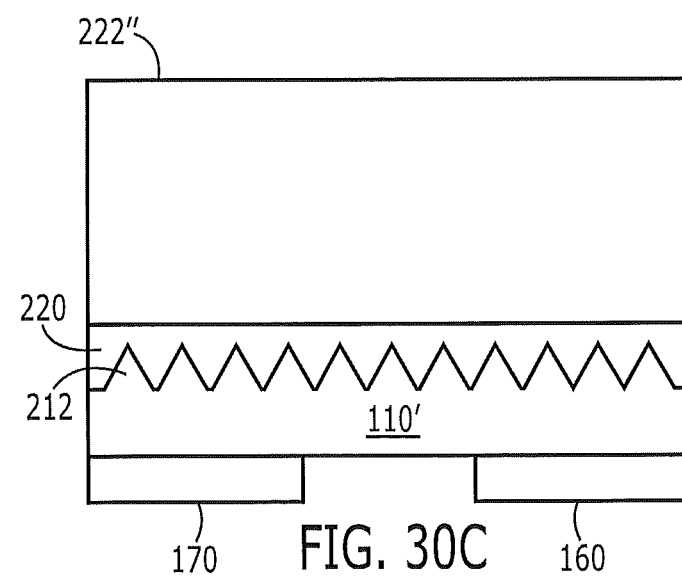

FIGS. 30A-30C illustrate various configurations of texturing 212, wavelength conversion layers 220 and protective layers 222 that were generally illustrated in FIGS. 19 and 20. Various thicknesses of the protective layer 222, 222', 222" may provide primary optics having different characteristics, as described, for example, in the above cited U.S. patent application Ser. No. 13/649,052.

Figure 31:
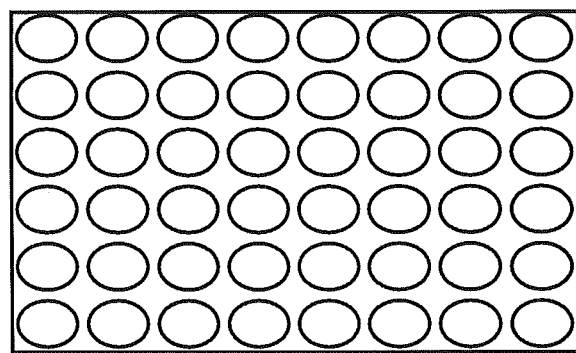
FIG. 31 is a top view of lenses that can be placed on an LED die according to various embodiments described herein.
Figure 32:
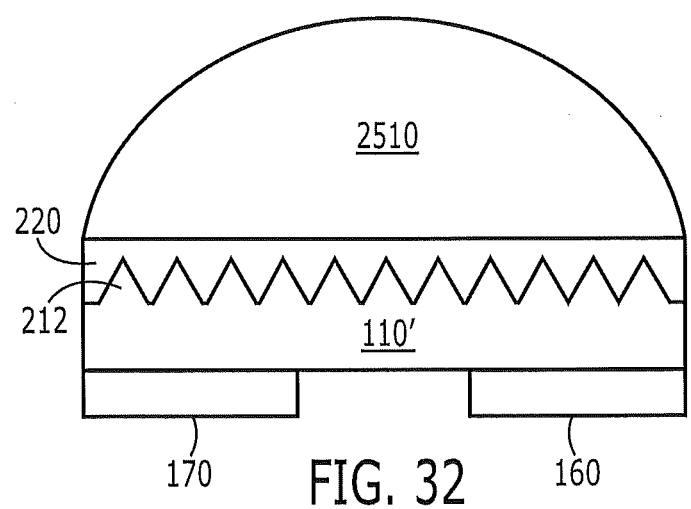
FIG. 32 is a cross-section of an LED die according to various embodiments described herein.

FIG. 31 illustrates a top view of lenses 2610, which may be macrolenses and/or microlenses, as was described above in connection with FIG. 26. FIG. 32 illustrates a dome 2510 on an LED die 110', as was described above in connection with FIG. 25.

FIG. 33 illustrates the mechanical dimensions of a Cree XLamp XP-E high efficiency white LED including the recommended PCB solder pad and recommended stencil pattern therefor. As was described above, an LED chip 1700 according to any of the embodiments described herein may be placed in a Cree XLamp XP-E high efficiency white LED package in place of a single LED die.

Figure 34:
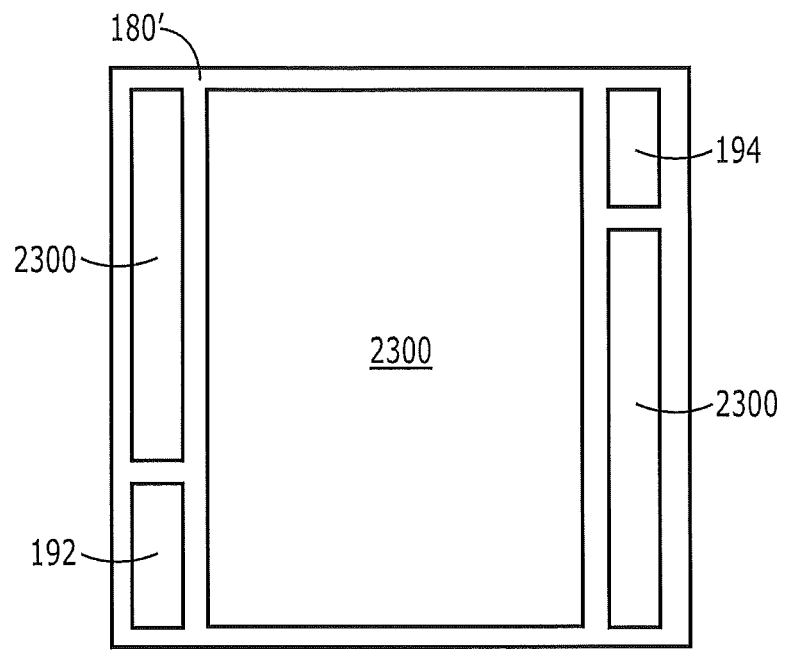
FIG. 34 is a bottom view of a carrier die according to various embodiments described herein.

FIG. 34 is a bottom view of a carrier die 180' according to various other embodiments described herein. As shown in FIG. 34, the carrier die 180' includes an external anode contact 192, an external cathode contact 194, and a plurality of external thermal contacts 2300 that are not electrically connected to the external anode contact 192 or the external cathode contact 194. It is known to provide multiple bond pads for an LED, as described, for example, in U.S. Patent Application Publication 2012/0217530 to Edmond et al., entitled "Semiconductor Light Emitting Diodes Having Multiple Bond Pads and Current Spreading Structures", the disclosure of which is hereby incorporated herein by reference. Moreover, the Cree XLamp XP-E device that was described above also includes a single external thermal contact. However, various embodiments of FIG. 34 can provide a plurality of external thermal contacts 2300. An external thermal contact 2300 may also be referred to as a "neutral contact" or as a "neutral thermal contact".

The plurality of external thermal contacts 2300 of FIG. 34 may also be used in other LEDs, such as a Cree XLamp XP-E high efficiency white LED, or in any of the embodiments that were described above in connection with FIGS. 1A-16, to provide multiple external thermal contacts.

Figure 35:
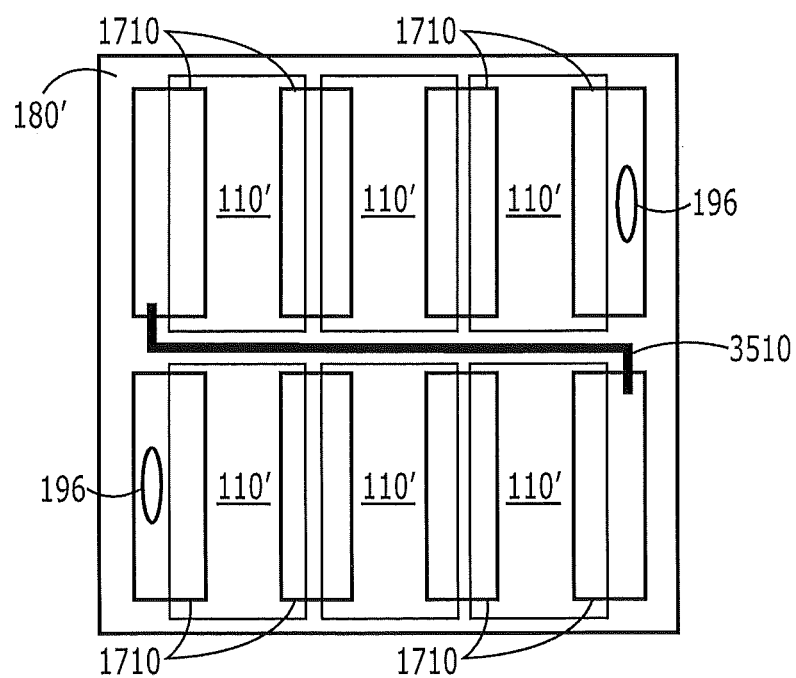
FIG. 35 is a top view of an LED chip according to various embodiments described herein.

FIG. 35 is a top view of an LED chip of FIG. 17, illustrating the plurality of internal contacts 1710, the plurality of LED dies 110' and a link or strap 3510 that electrically connects non-adjacent LED dies 110'. Various configurations of links or straps 3510 may be provided to electrically connect adjacent and/or non-adjacent LED dies in a desired series/parallel circuit. In some embodiments, the link or strap 3510 may be a thin strap, for example about 20 μm wide, of conductive material.

It will be understood that various embodiments of FIGS. 17-36 may also be combined with various embodiments of FIGS. 1A-16. For example, the various protective layers 222, 222', 222" that were illustrated in FIGS. 19, 20 and 30A-30C, may be incorporated into embodiments of FIGS. 1A-16. Moreover, an individual dome 2510, as was illustrated in FIGS. 25 and 32, may also be incorporated into any of the embodiments of FIGS. 1A-16. In addition, macro- and/or microlenses 2610, as were illustrated in FIGS. 26 and 31, may also be incorporated into any of the embodiments of FIGS. 1A-16. Thus, various lenses in the form of a cube, a dome, an overmold and/or a microlens may be provided in any of the embodiments described herein. Finally, any of the internal structures or manufacturing techniques of FIGS. 1A-16 may be incorporated into embodiments of FIGS. 17-36. For example, the internal structure of an LED die 110/110', the internal interconnection structures 180a, the substrate shaping, singulation, wavelength conversion layer configuration and LED fabrication, chip fabrication and module/fixture fabrication of FIGS. 1A-16 may also be incorporated into embodiments of FIGS. 17-36.

Additional Wafer Level Packaging of Multiple LEDs on a Single Carrier Die

Wafer level packaging of multiple LED dies on a single carrier die according to various embodiments that were described in connection with FIGS. 17-36 used wiring in and/or on the carrier die to electrically connect the LED dies in series and/or in parallel, to provide an LED chip. Additional embodiments that will now be described in connection with FIGS. 37-53 can provide other embodiments of wafer level packaging of multiple LED dies on a single carrier die, where a patterned internal interconnection layer in the plurality of LED dies themselves may be used to connect the plurality of LED dies in series and/or in parallel. Thus, interconnection may be provided by the LED substrate instead of or in addition to the carrier wafer.

Various embodiments that will now be described may arise from a recognition that a patterned internal interconnection layer may be provided in an LED die for other purposes, such as to provide a crack-tolerant barrier structure, as described in U.S. patent application Ser. No. 13/790,369, to Donofrio et al., filed Mar. 8, 2013, entitled Semiconductor Light Emitting Diodes With Crack-Tolerant Barrier Structures and Methods of Fabricating Same, assigned to the assignee of the present application, the disclosure of which is hereby incorporated herein by reference in its entirety as if set forth fully herein. Various embodiments that will now be described can selectively extend the patterned internal interconnection layer between adjacent LED dies in order to selectively electrically interconnect the LED dies in series and/or in parallel.

Figure 37:
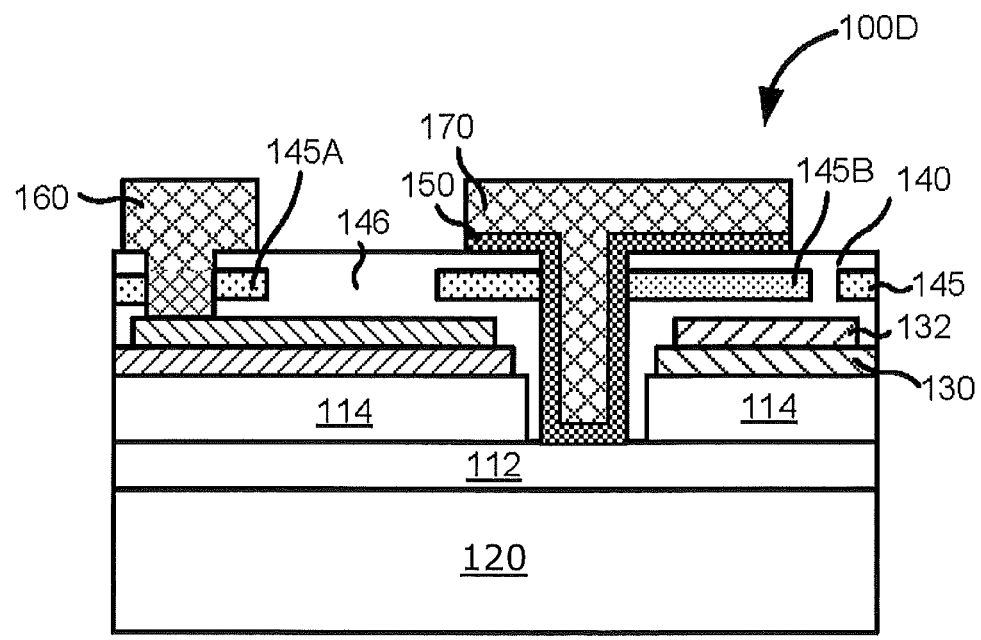
FIG. 37 is a cross-section of a light emitting diode according to various embodiments described herein.

In more detail, FIG. 37 is a reproduction of FIG. 9 of the above incorporated application Ser. No. 13/790,369. As shown in FIG. 37, an LED chip structure 100D includes a "crack reducing interlayer" 145. A portion 145A of the crack reducing interlayer 145 contacts the anode bond pad 160, while a portion 145B of the crack reducing interlayer 145 contacts the cathode bond pad 170 and/or a reflective cathode contact 150. Thus, where the crack reducing interlayer 145 includes a conductive material such as aluminum, one or both of the portions 145A, 145B of the crack reducing interlayer 145 may be electrically active. However, as the portions 145A, 145B of the crack reducing interlayer 145 are isolated from one another by a gap or moat 146, such contact will not cause a short circuit. Various embodiments that will now be described can selectively extend the conductive interlayer 145 across adjacent LED dies on an LED substrate, so as to selectively electrically connect the anodes and cathodes of the LED dies in series and/or in parallel. The patterned internal interconnection layer 145 may also provide functionality of a crack reducing interlayer and/or other functionality.

Figure 38:
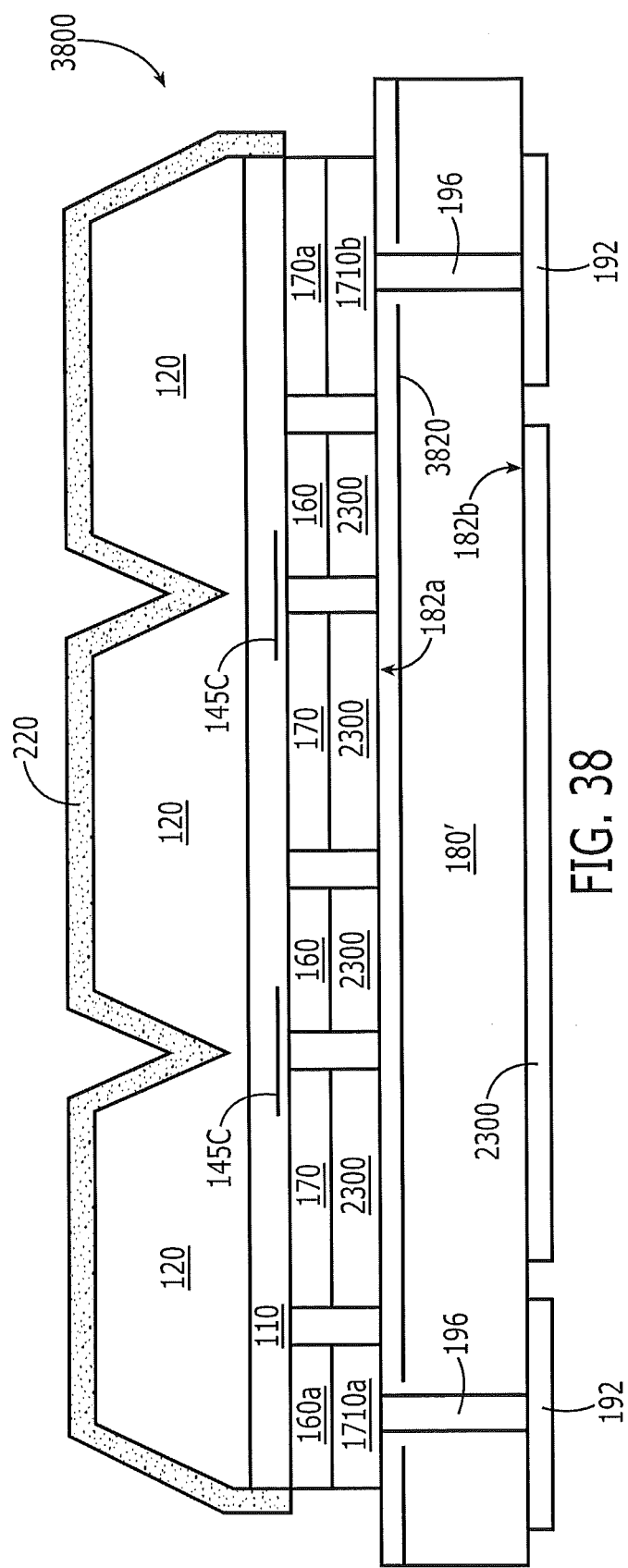
FIGS. 38-49 are cross-sections of LED chips according to various embodiments described herein, during intermediate and final fabrication thereof.

FIG. 38 illustrates an LED chip according to various embodiments described herein. FIG. 38, which selectively electrically connects the anodes and cathodes of a plurality of LED dies in series and/or in parallel in the LED dies themselves, may be contrasted with FIG. 17, wherein the anodes and/or cathodes of the plurality of LED dies are electrically connected in series and/or in parallel using internal contacts in and/or on a carrier die. It will also be understood that any of the embodiments of FIGS. 17-36 may be combined with any of the embodiments of FIGS. 37-53, to provide interconnections that use the LED dies and the carrier die.

More specifically, referring to FIG. 38, an LED chip includes an LED substrate 3800 having a plurality of LED dies 3810 (shown as three LED dies 3810a-3810c in FIG. 38). A respective LED die 3810 includes an anode and a cathode (which will be illustrated in subsequent figures). A patterned internal interconnection layer 145C is provided in the plurality of LED dies 3810, and as shown in FIG. 38, in the LED epi region 110. The patterned internal interconnection layer 145C is configured to selectively electrically connect the anodes and cathodes of the plurality of LED dies 3800 in series and/or in parallel. An LED die anode contact 160a is electrically connected to at least one of the anodes, and an LED die cathode contact 170a is electrically connected to at least one of the cathodes. The internal structure of the LED epi region 110 will be illustrated in subsequent figures. As will also be described, the patterned internal interconnection layer 145C may be part of a crack reducing interlayer 145 in some embodiments.

Thus, the patterned internal interconnection layer 145C may comprise a patterned internal metal layer that selectively extends between the plurality of LED dies 3810, to selectively electrically connect the anodes and cathodes of the plurality of LED dies 3810 in series and/or in parallel.

Still referring to FIG. 38, the LED chip includes a carrier die 180' having first and second opposing faces 182a and 182a, respectively. The carrier die 180' has a first anode contact 1710a and a first cathode contact 1710b on the first face 182a, and a second anode contact 192 and a second cathode contact 194 on the second face 182b. The carrier die 180' is joined to the LED substrate 3800 so that the plurality of LED dies 3800 are adjacent the first face 182a and is joined to the LED substrate 3800 so that the plurality of LED dies 3810, and in some embodiments the LED epi region 110, are adjacent the first face 182a, the first anode contact 1710a is electrically connected to the LED die anode contact 160a, and the first cathode contact 1710b is electrically connected to the LED die cathode contact 170a. The remaining LED die anode and cathode contacts 160 and 170 may be electrically connected to neutral or thermal contacts 2300 and/or may be unconnected. A single thermal contact 2300 also may be provided. Moreover, one or more thermal contacts 2300 may be provided on the second face 182b, in addition to or instead of on the first face 182a of the carrier die 180'. The thermal contacts are not connected to the anodes or cathodes in some embodiments.

As also shown in FIG. 38, the LED substrate 3800 may include beveled sidewalls between adjacent ones of the LED dies 3810, and a beveled edge at a periphery thereof. A wavelength conversion material 220 may be provided on the LED substrate 3800 remote from the carrier substrate 180', and extending onto the beveled sidewalls between adjacent ones of the LED dies 3810, onto the beveled edge of the periphery of the LED substrate 3800, and also extending onto a sidewall of the LED dies 3810a, 3810c at the periphery of the LED substrate 3800 (i.e., on an exposed edge of the LED epi region 110).

Various techniques of LED substrate shaping including texturing, microlensing and/or beveling that were described in connection with the other embodiments herein, as well as various embodiments of a mounting substrate and/or a light fixture housing, may be used in the present embodiments.

Finally, in some embodiments, the carrier die 180' may include a passivated reflector 3820 on or adjacent the first face 182a. The passivated reflector 3820 may include a reflector metal, such as aluminum, having a dielectric passivation layer, such as silicon dioxide and/or silicon nitride on opposite faces thereof. The passivated reflector 3820 may be provided in, adjacent and/or on the first face 182a of any of the carrier dies 180' according to any of the embodiments described herein, and may be fabricated using techniques that will be described below. Other embodiments of a reflector 3820 may be provided. For example, a reflector may be embodied as a hybrid mirror, as is described, for example, relative to FIG. 54 below. In yet other embodiments, a reflector 3820 may be formed only of dielectric material having, for example, differing indices of refraction. For example, a distributed Bragg reflector may be used.

Figure 39:
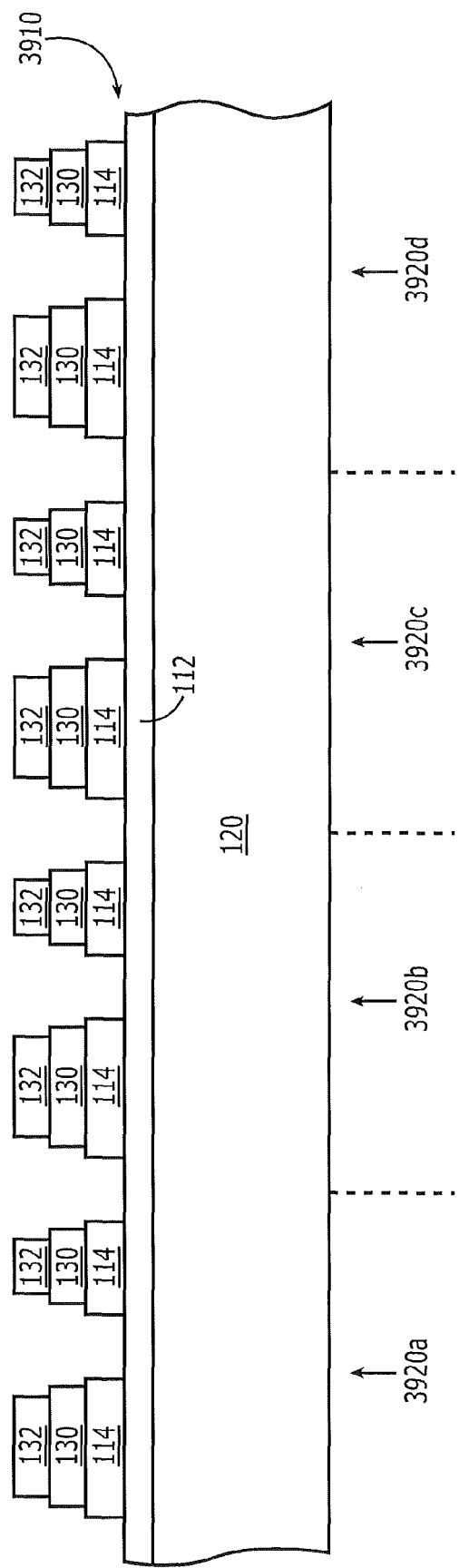

FIGS. 39-49 are cross-sectional views illustrating methods of fabricating a plurality of LED chips, such as the LED chips of FIG. 38, according to various embodiments described herein, and various intermediate and final products according to various embodiments described herein. Referring to FIG. 39, an LED wafer 3910 is provided that includes a plurality of LED dies 3920a-3920d. It will be understood that only four LED dies 3920a-3920d are illustrated in FIG. 39. Typically, however, many more dies 3920 are included in an LED wafer 3910. Moreover, for purposes of explanation, assume that LED dies 3920a and 3920b will be connected in series on the LED wafer 3810, LED dies 3920c and 3920d will be connected in series on the LED wafer 3910, but LED dies 3920b and 3920c will not be connected to one another. Stated differently, LED dies 3920a and 3920b will eventually form a first LED chip having series connected LED dies, and LED dies 3920c and 3920d will form a second LED chip having LED dies that are connected in series. The LED wafer 3910 includes a substrate 120, such as a silicon carbide substrate, one or more n-type layers 112 (also referred to as a "cathode"), an active region, and one or more p-type layers 114 (also referred to as an "anode"), according to any of the embodiments described herein. For convenience, the active region will not be shown, but it will be understood that an active region will generally be present between the n-type layers 112 and the p-type layers 114. A patterned layer 130 of reflective material, such as a silver or nickel layer, is provided on the p-type layers 114, to provide a reflective anode contact. A barrier layer 132 of, for example, titanium tungsten, tungsten, platinum and/or other suitable material, is formed on the reflective anode contact 130 and patterned as shown in FIG. 39.

Figure 40:
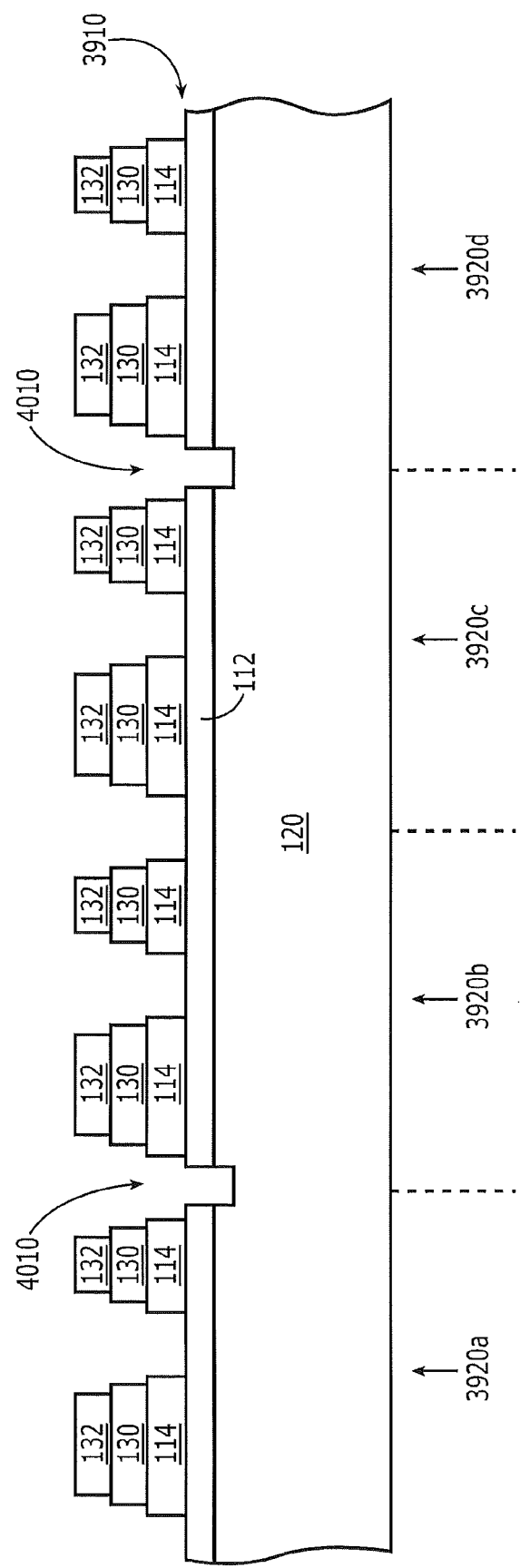

Referring to FIG. 40, trenches are etched between the LED dies that will be connected together. For example, as shown, a trench 4010 is formed between dies 3920a and 3920b and between dies 3920c and 3920d. These trenches 4010, which may be referred to herein as "first trenches", are etched sufficiently deep to penetrate through the n-type layer 112, so as to isolate adjacent LED dies 3920 from one another. They may extend up to the substrate 120 or may penetrate into the substrate 120 as shown.

Figure 41:
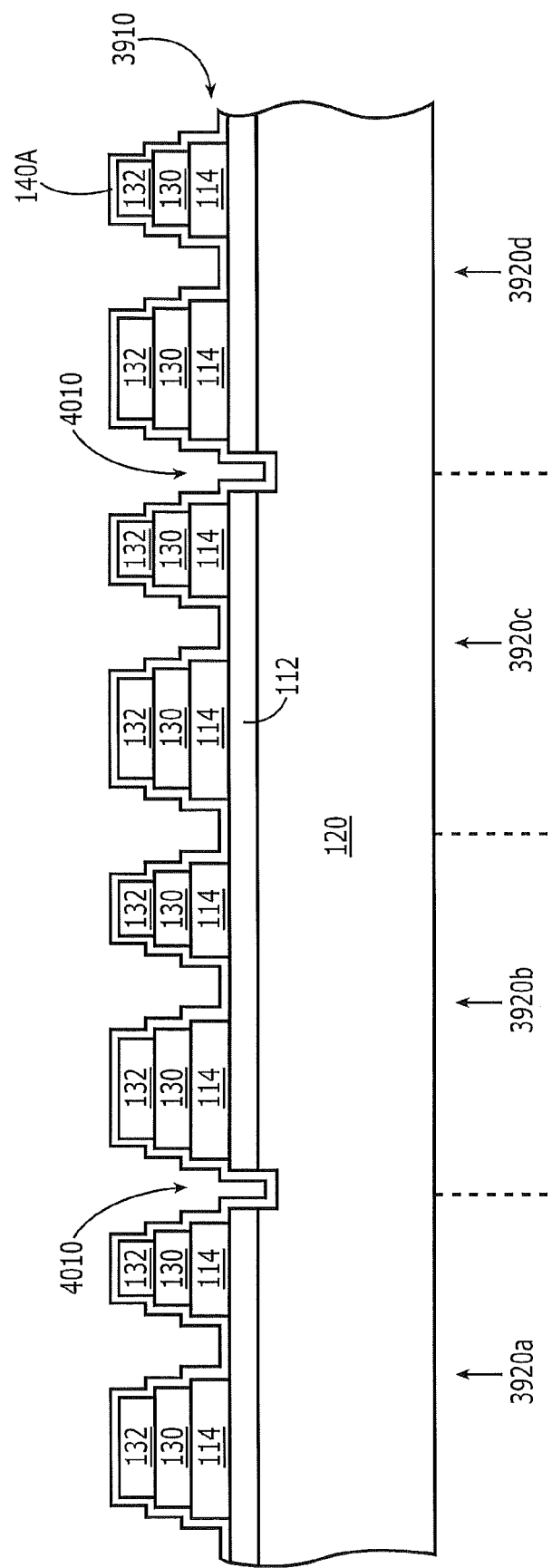

Then, referring to FIG. 41, a base or first insulating layer 140A may be blanket-deposited over the structure to cover the exposed portion of the anode contacts 130 and the barrier layer 132. The first insulating layer 140A may extend into the trenches 1410 and onto the exposed portions of the p-type layers 114, the active layers and the n-type layers 112. The first insulating layer 140A may include a dielectric material, such as silicon dioxide and/or silicon nitride, and may have a thickness of between about 250 nm and 1 µm, and in particular embodiments, may comprise about 500 nm of silicon nitride.

Figure 42:
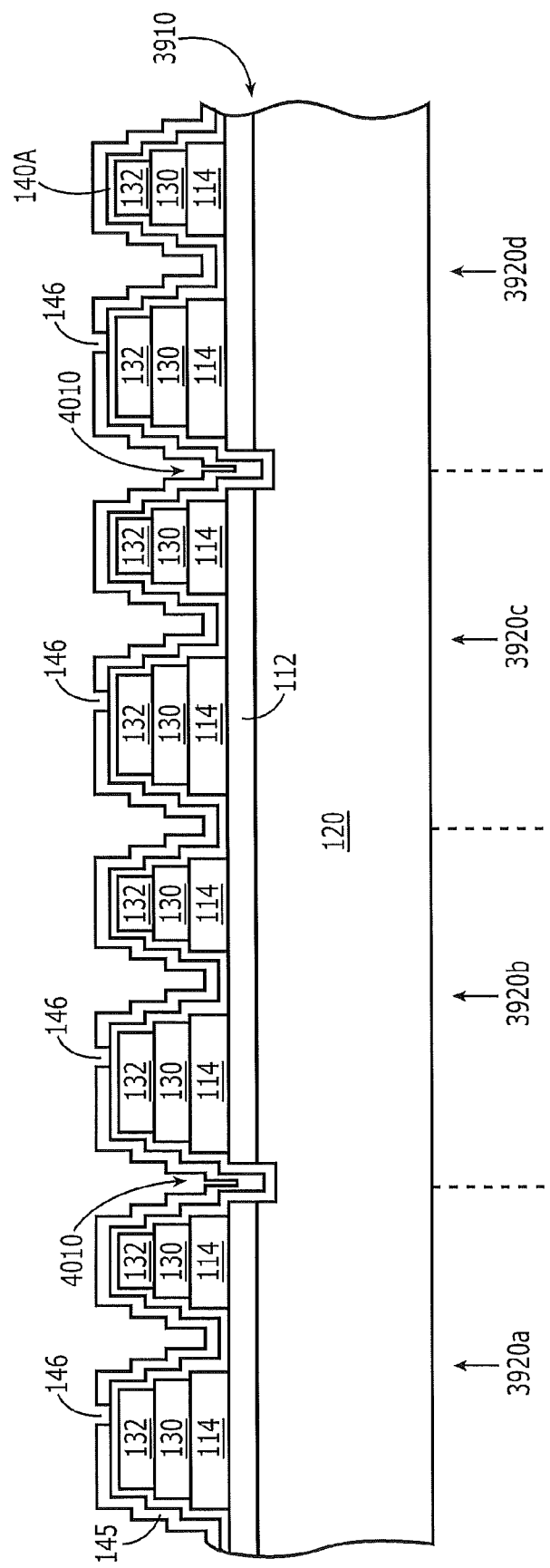

Referring now to FIG. 42, an internal interconnection layer 145 is then deposited on the first insulating layer 140A and patterned, as shown in FIG. 42. The internal interconnection layer 145 may comprise any conductor. For example, a metal such as aluminum, titanium, tungsten, aluminum/titanium, aluminum/titanium/tungsten, titanium/tungsten and/or other metal(s) may be used. In some embodiments, the internal interconnection layer 145 may have a thickness of about 150 nm. In some embodiments, the internal interconnection layer 145 may be sufficiently thin so as to be transparent, but sufficiently thick so as to be conductive. In other embodiments, the internal interconnection layer 145 may be sufficiently thick so as to not be optically transparent and may, in fact, be optically absorbing. In other embodiments, the internal interconnection layer 145 may be reflecting. The fabrication details of metal layers in an LED that are reflective, transparent or absorbing need not be described further herein.

As shown in FIG. 42, the internal interconnection layer 145 is patterned so as to leave a gap or moat 146 that separates the layer into two separate portions, as will be discussed in detail below. Moreover, as shown in FIG. 42, the internal interconnection layer 145 extends across the trench 4010 between the LED dies 3920a and 3920b that are to be interconnected and also extends between trench 4010 between the LED dies 3920c and 3920d that are to be interconnected. Thus, by extending across the trenches 4010, series or parallel connections between adjacent LED dies may be provided. On the other hand, the gap 146 can prevent short circuiting of a given LED die's anode and cathode to one another. As also shown in FIG. 42, the interconnection layer 145 does not extend between adjacent LED dies that are not to be interconnected. Thus, the interconnection layer 145 does not extend between LEDs 3920b and 3920c. In other embodiments, however, the interconnection layer 145 may extend between these dies and may be removed later.

Figure 43:
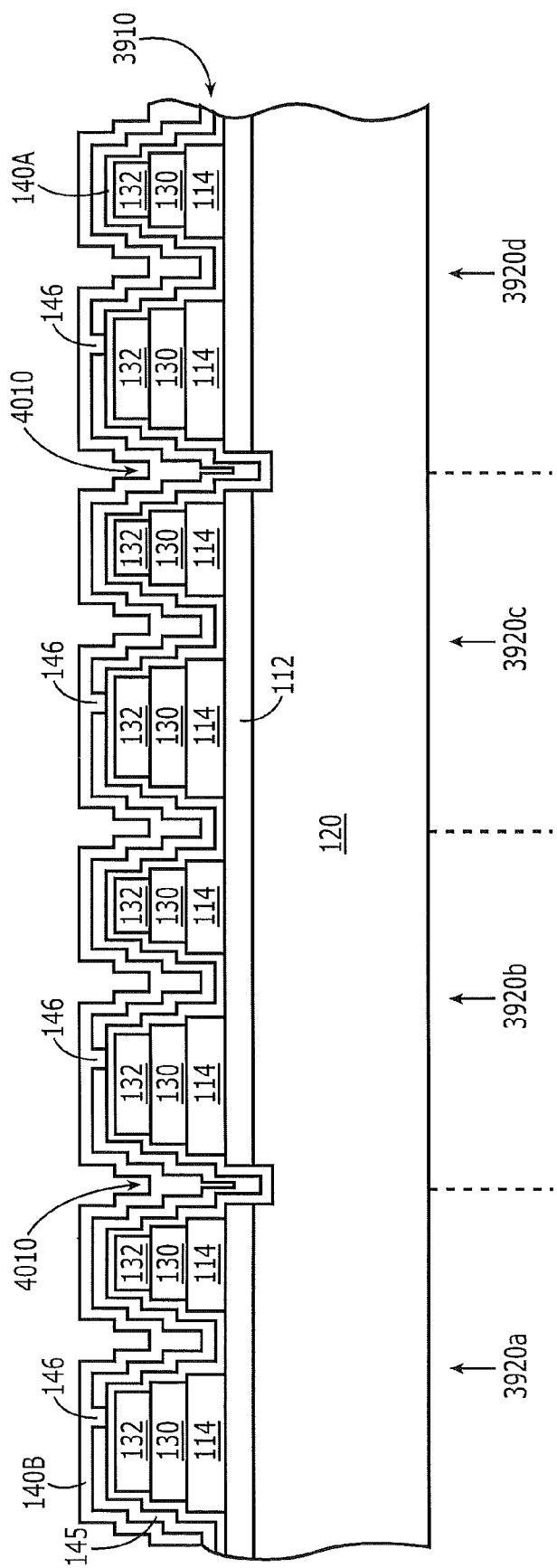

Referring now to FIG. 43, an upper or second insulating layer 140B may be blanket-deposited over the structure. The second insulating layer 140B may have the same composition or a different composition as the first insulating layer 140A. The second insulating layer 140B may include a dielectric material, such as silicon nitride and/or silicon dioxide, and may have a thickness of between about 250 nm and about 1 µm. In some embodiments, the second insulating layer 140B may include silicon nitride and may have a thickness of about 500 nm. In other embodiments, the second insulating layer 140B may comprise about 5,000 Å silicon nitride and about 2,000 Å silicon dioxide.

Figure 44:
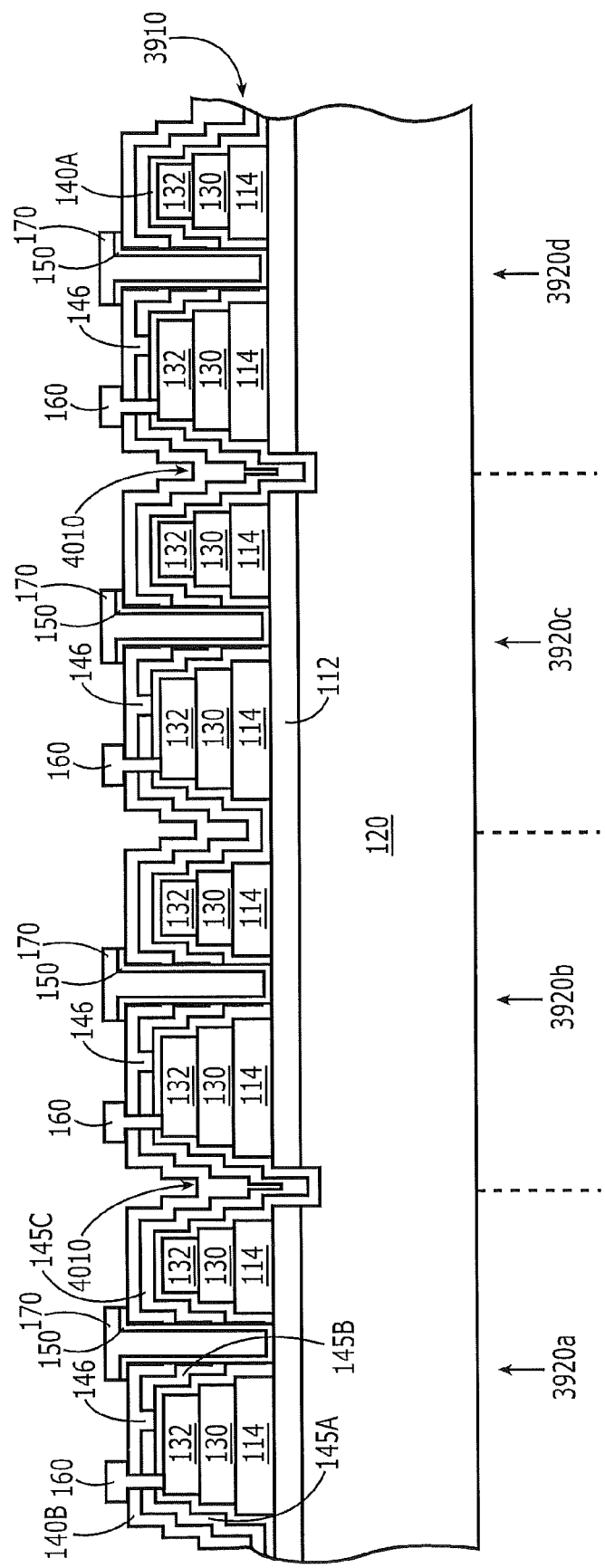

Referring now to FIG. 44, the insulating layer 140, which comprises the first insulating layer 140A and the second insulating layer 140B, and the internal interconnection layer 145 may be etched to open vias therein that extend to the barrier layer 132 and to the n-type layer 112. Two different etching operations may be used or a single or overlapping etching operations may be performed A reflective cathode contact 150 and a cathode bond pad 170 are formed to contact the n-type layer 112 and an anode bond pad 160 is formed to contact the barrier layer 132. Additional layers, such as reflective, adhesive or bonding layers, may also be included. The cathode bond pad 170 may also be referred to as a "cathode contact" and the anode bond pad 160 may also be referred to as an "anode contact".

Still referring to FIG. 44, it can be seen that the patterned internal interconnection layer 145 now includes three separate portions. A first portion 145A is electrically connected to the anode bond pads 160. A second portion 145B is connected to the cathode bond pads 170, but is spaced apart from the first portion 145A by the gaps 146. Thus, a given LED die is not shorted. A third portion 145C extends between an anode bond pad 160 and a cathode bond pad 170 of two adjacent LEDs, to connect these LEDs in series and/or in parallel. Thus, for example, the third portion 145C connects the anode bond pad 160 of LED die 3920*b* to the cathode bond pad 170 of the LED die 3920*a*.

Figure 45:
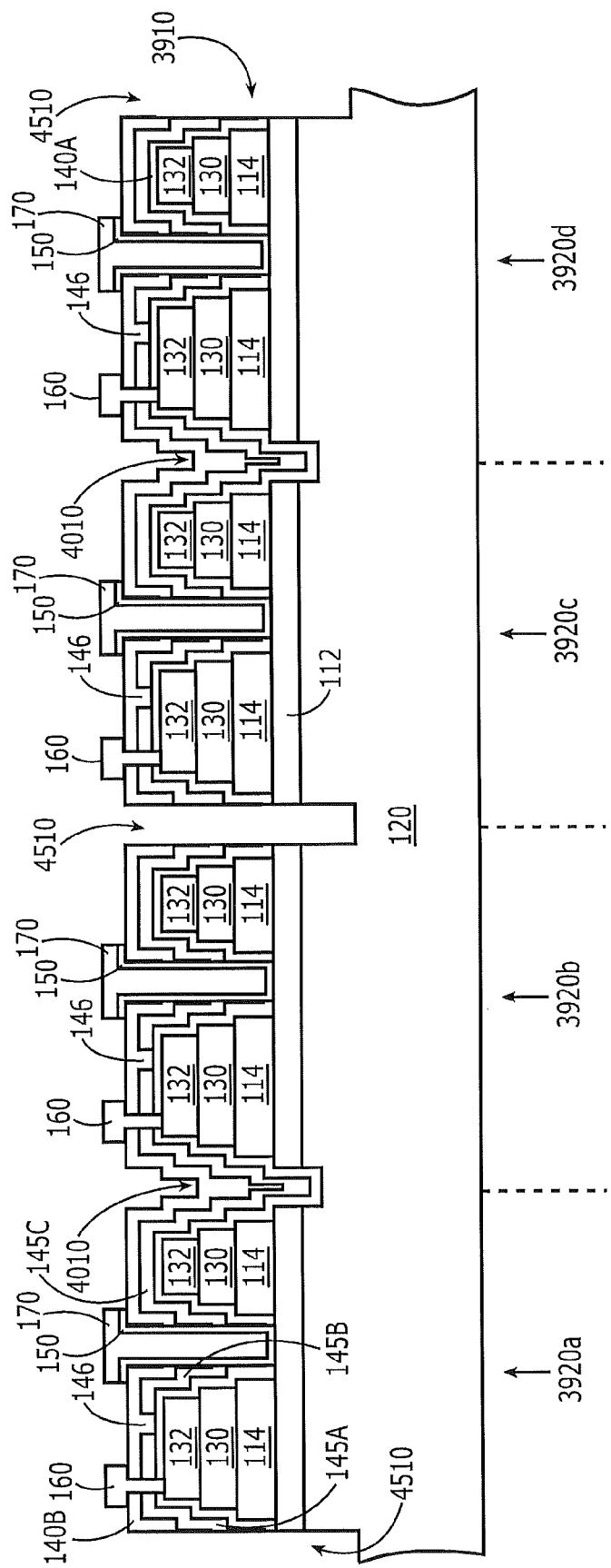

Referring now to FIG. 45, second trenches 4510 are etched to define groups of LED dies 3920 that are not electrically interconnected. For example, as shown in FIG. 45, a second trench 4510 is etched between LED dies 3920*b* and 3920*c*. The second trench 4510 extends through the n-type layer into the substrate 120. As also shown, the second trenches 4510 are deeper than the first trenches 4010. Moreover, in embodiments wherein the patterned internal interconnection layer 145 spans across LED dies 3920*b* and 3920*c*, this patterned internal interconnection layer between these dies can be removed when etching the second trenches 4510, thus electrically isolating the groups of LED dies that will not be electrically connected in series and/or in parallel.

Accordingly, FIG. 45 illustrates providing an LED wafer 3910 that includes a plurality of LED dies 3920*a*-3920*d*, a respective LED die including an anode 160 and a cathode 170. The LED wafer 3910 further includes a patterned internal interconnection layer 145 in the plurality of LED dies 3920 that is configured to selectively electrically connect the respective anodes 160 and cathodes 170 of at least two of the LED dies 3920*a*, 3920*b* and 3920*c*, 3920*d*, in series and/or parallel. The LED wafer 3910 further includes a plurality of external anode contacts 160*a* (also referred to herein as "LED die anode contacts 160*a*") and a plurality of external cathode contacts 170*a* (also referred to herein as "LED die cathode contacts 170*a*"), a respective pair of which is configured to provide an external anode contact and an external cathode contact for a respective at least two of the LED dies that are connected in series and/or in parallel.

In some embodiments, the first trenches 4010 of FIG. 40 may be etched using chlorine-based Reactive Ion Etching (RIE), and the second trenches 4510 of FIG. 45 may be etched using Inductively Coupled Plasma Reactive Ion Etching (ICP-RIE), typically florine-based in the case of etching into the SiC substrate. ICP etching typically has a much higher etch rate than standard RIE etching. Moreover, for comparison purposes, the depth of second trenches 4510 into the substrate 120 may be about 10-50 µm in some embodiments, whereas the depth of first trenches 4010 in these same embodiments may be about 0-1 µm.

It will be understood that various other embodiments of FIG. 45 may be provided. For example, the anode contacts 160 and the cathode contacts 170 that will not form an external anode contact 160*a* or an external cathode contact 170*a* may be omitted, may be of a different shape, or may not be brought to the surface of the LED wafer 3910. Alternatively, the anode contacts 160 and the cathode contacts 170 that do not form external anode contacts 160*a* or external cathode contacts 170*a* may be provided in a two-piece form, wherein a lower piece electrically contacts the first or second portion 145*a* or 145*b* of the patterned internal interconnection layer 145, and a second portion, at the surface of the LED wafer 3910, is insulated from the first portion, and is provided for thermal and/or mechanical support purposes. When provided for thermal purposes, a single thermal contact may be provided by the second pieces of the anode and cathode contacts 160, 170, as long as the thermal contact does not electrically connect the anode and cathode of a device. Various other configurations may be provided.

Figure 46:
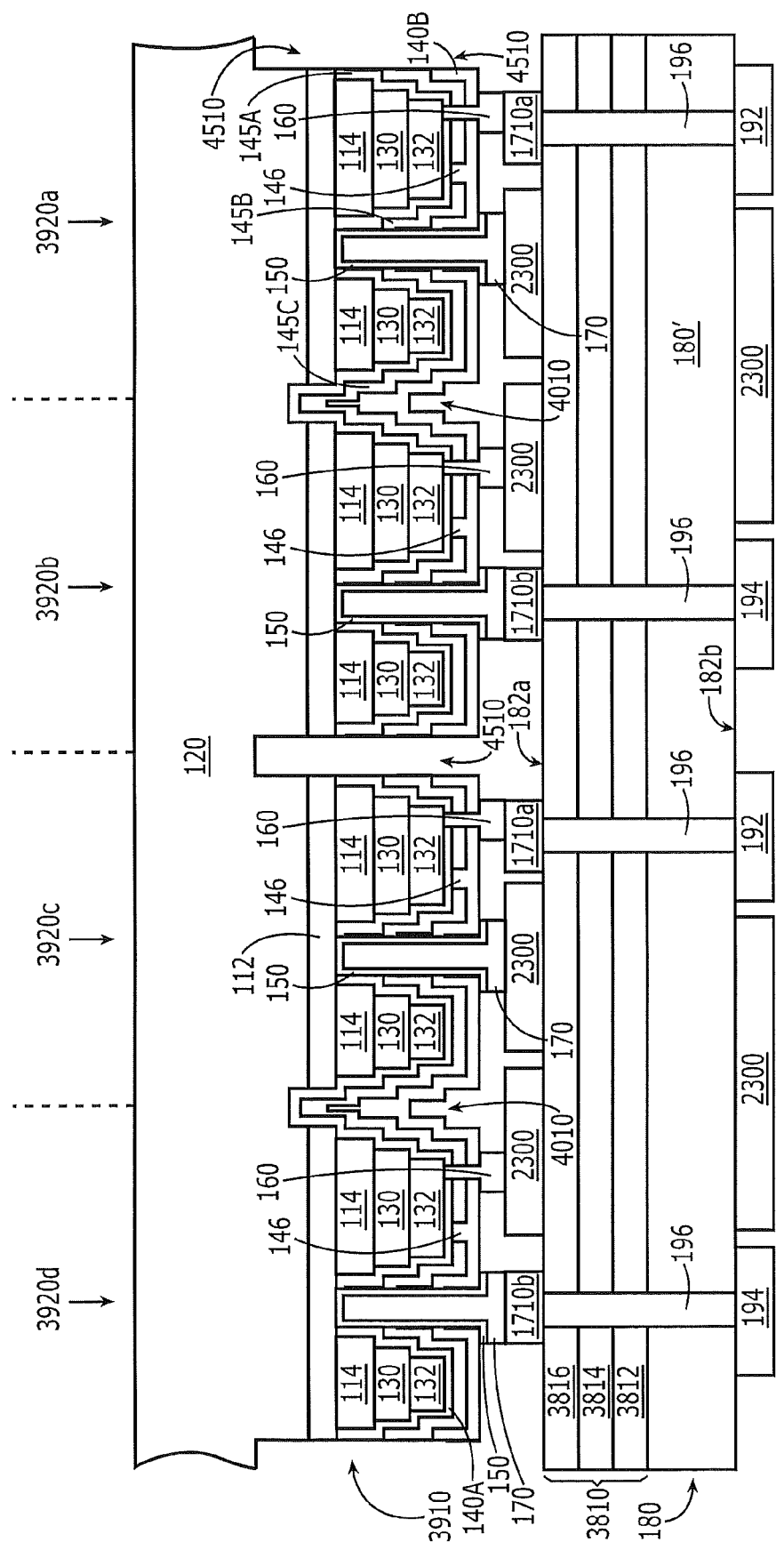

Referring now to FIG. 46, a carrier wafer 180 is fabricated according to any of the embodiments described herein. In FIG. 46, the carrier wafer 180 includes first and second opposing faces 182*a* and 182*b*, a plurality of first anode contacts 1710*a* on the first face 182*a* and a plurality of second anode contacts 1710*b* on the second face 182*b*. In these embodiments, the carrier wafer 180 may also include at least one external thermal contact 2300 on the first face 182*a* and/or on the second face 182*b*. The external thermal contacts 2300 may be connected by internal metal vias for thermal transfer purposes, but need not be connected by internal metal vias in other embodiments.

Optionally, the carrier wafer 180 also includes a passivated reflector 3810 on the first face 182*a*. The passivated reflector may include a first insulating layer 3812, which may comprise silicon dioxide and/or silicon nitride, a reflector layer 3814, which may comprise an aluminum layer, and a second insulating layer 3816, which may comprise silicon nitride and/or silicon dioxide. By using a passivated reflector layer 3810, light that impinges on the first face 182*a* may be reflected back away from the carrier wafer 180. In some embodiments, the first insulating layer 3812 may comprise silicon dioxide of thickness between about 2000 Å and 8000 ÅA; the reflector layer 3814 may comprise aluminum of thickness between about 100 Å and 5000 ÅA; and the second dielectric layer 3816 may comprise silicon nitride of thickness between about 2000 Å and 8000 Å. Other embodiments of a reflector 3810 may be provided. For example, a reflector may be embodied as a hybrid mirror, as is described, for example, relative to FIG. 54 below. In yet other embodiments, a reflector 3810 may be formed only of dielectric material having, for example, differing indices of refraction. For example, a distributed Bragg reflector may be used. In other embodiments, the reflector need not be used. Moreover, a passivated reflector 3810 may be used with any of the embodiments of FIGS. 17-36.

Still referring to FIG. 46, the LED wafer 3910 and the carrier wafer 180 are joined, so that the LED die anode and cathode contacts 160*a* and 170*a* are adjacent the first face 182*a* of the carrier wafer 180 and the respective pairs of the LED die anode and cathode contacts 160*a*, 160*b* are electrically connected to the respective pairs of first contacts 1710*a*, 1710*b* on the first face 182*a*.

Figure 47:
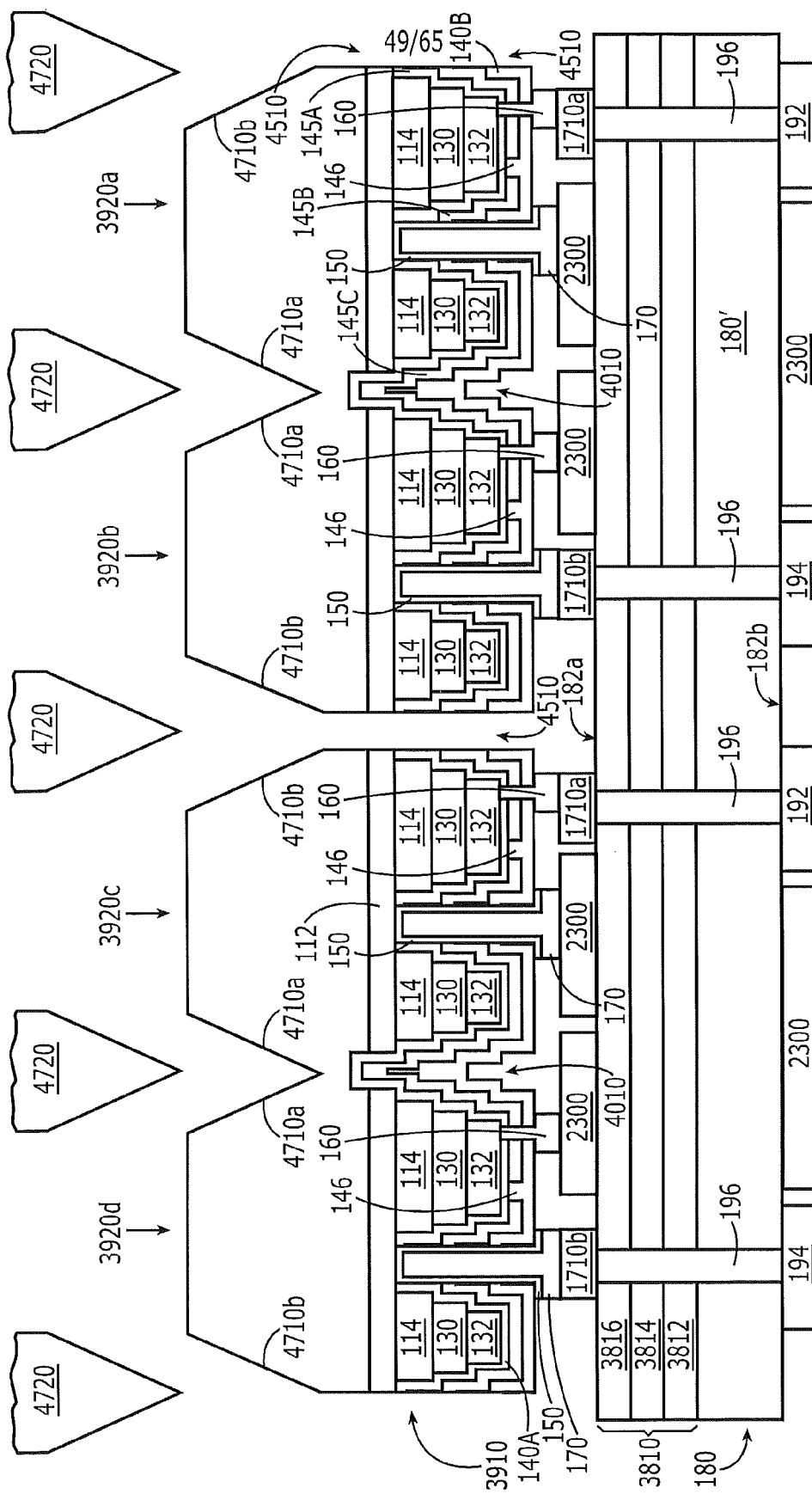

Referring now to FIG. 47, shaping of the substrate 120 then takes place, for example by applying a saw blade 4720 across the substrate 120 at a uniform depth, to provide bevels 4710. The bevels 4710 will have a different effect depending upon their location. In particular, between adjacent dies that are connected in series and/or in parallel, the bevels 4710*a* will not reach the first trenches 4010. Thus, the internal interconnection layer 145C will remain intact between these adjacent LED dies that are connected in series and/or in parallel. However, between groups of LED dies that are to be connected in series and/or in parallel, the bevels 4710*b* will penetrate into the second trenches 4510, and thereby create an exposed surface that extends down to the active layer of the LED. Thus, the saw blade 4720 or other shaping tool exposes the plurality of second trenches 4510, but does not expose the plurality of first trenches 4010.

It will also be understood that any other combination of substrate shaping techniques that were described herein, including texturing, the use of microlenses, the use of an additional x-cut and/or other shaping techniques may also be performed.

Figure 48:
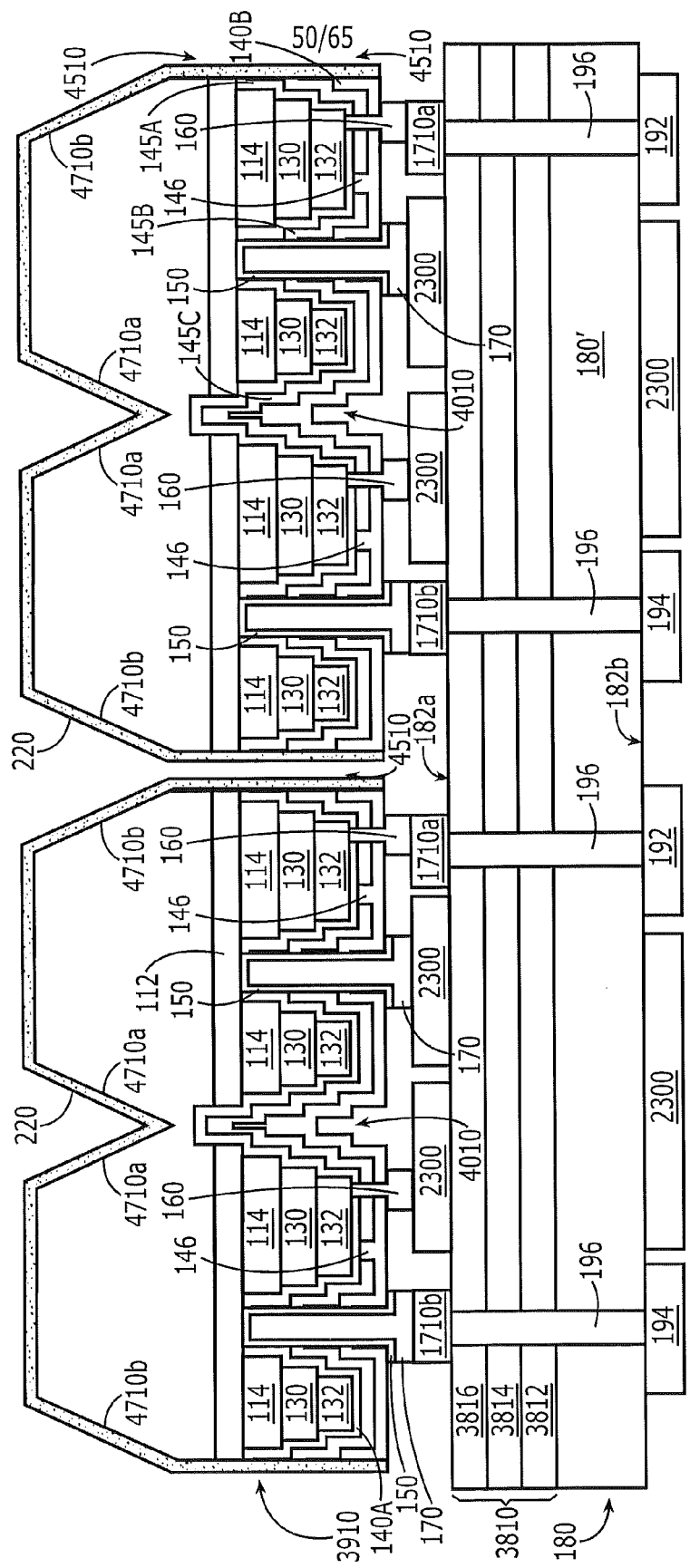

Referring now to FIG. 48, wavelength conversion material 220 is then applied to the exposed surfaces of the LED wafer 3910 according to any of the techniques described herein. In some embodiments, the wavelength conversion material is applied using spraying. A single pass or multiple passes may be used, with each pass including the same or different compositions and/or concentrations of wavelength conversion material(s). As shown in FIG. 48, the wavelength conversion material 220 is applied to the substrate 120 that was beveled, so that the wavelength conversion material 220 extends on a face of the substrate that is remote from the carrier wafer 180, extends onto surfaces of the substrate 120 that were exposed by the beveling and also extends into the plurality of second trenches 4510 that were exposed. Accordingly, the sidewalls of the LED epi region 110 that are on the periphery of an LED chip may be covered by wavelength conversion material 120, to reduce or prevent unwanted side emissions of, for example, blue light from taking place.

It will also be understood that protective layers and/or other layers or elements may be applied or placed according to any of the embodiments described herein, for example in FIGS. 1-36.

Figure 49:
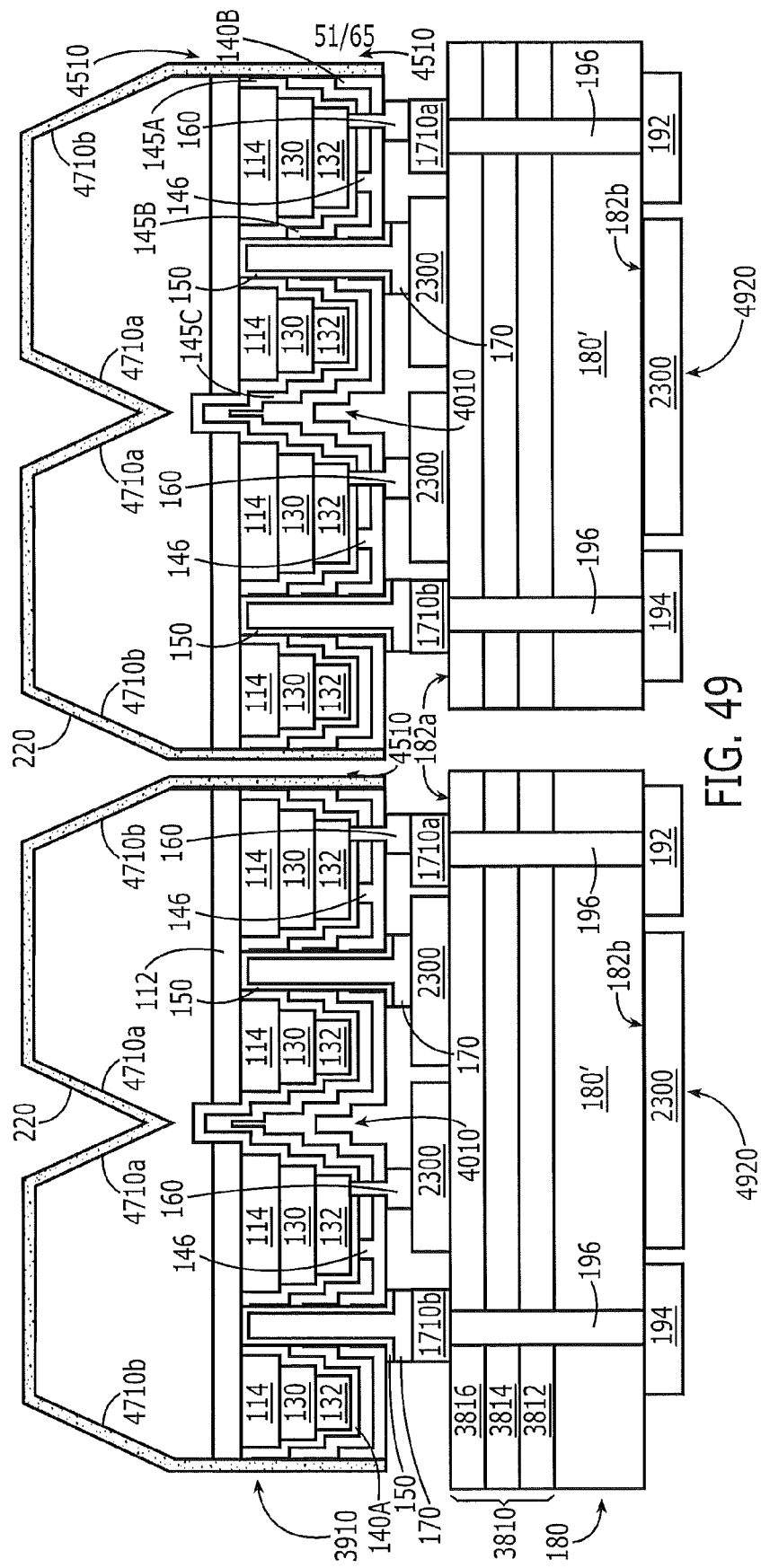

Referring now to FIG. 49, the carrier wafer 180 is singulated, for example using conventional singulation techniques, to produce a plurality of LED chips 4910, a respective one of which includes a single carrier die 4920, a respective single carrier die 4920 including a plurality of LED dies 4930 thereon that are electrically connected in series and/or in parallel.

It will be understood that various embodiments described herein in connection with FIGS. 17-36 may be combined with various embodiments described herein with respect to FIGS. 37-49. For example, combinations of interconnections on the LED wafer and on the carrier wafer may be provided in some embodiments. Duplicate interconnections on the LED wafer and the carrier wafer may also be provided in some embodiments. Moreover, the interconnection in the LED wafer may be partly conductive and partly insulating, to provide crack reduction throughout the LED wafer, while also providing selective interconnection between adjacent LED dies, as desired. Finally, LED chips 4910 of FIG. 49 may then be further processed, such as by mounting on a light fixture mounting board and/or directly mounting in a light fixture, according to any of the embodiments described herein.

Figure 50:
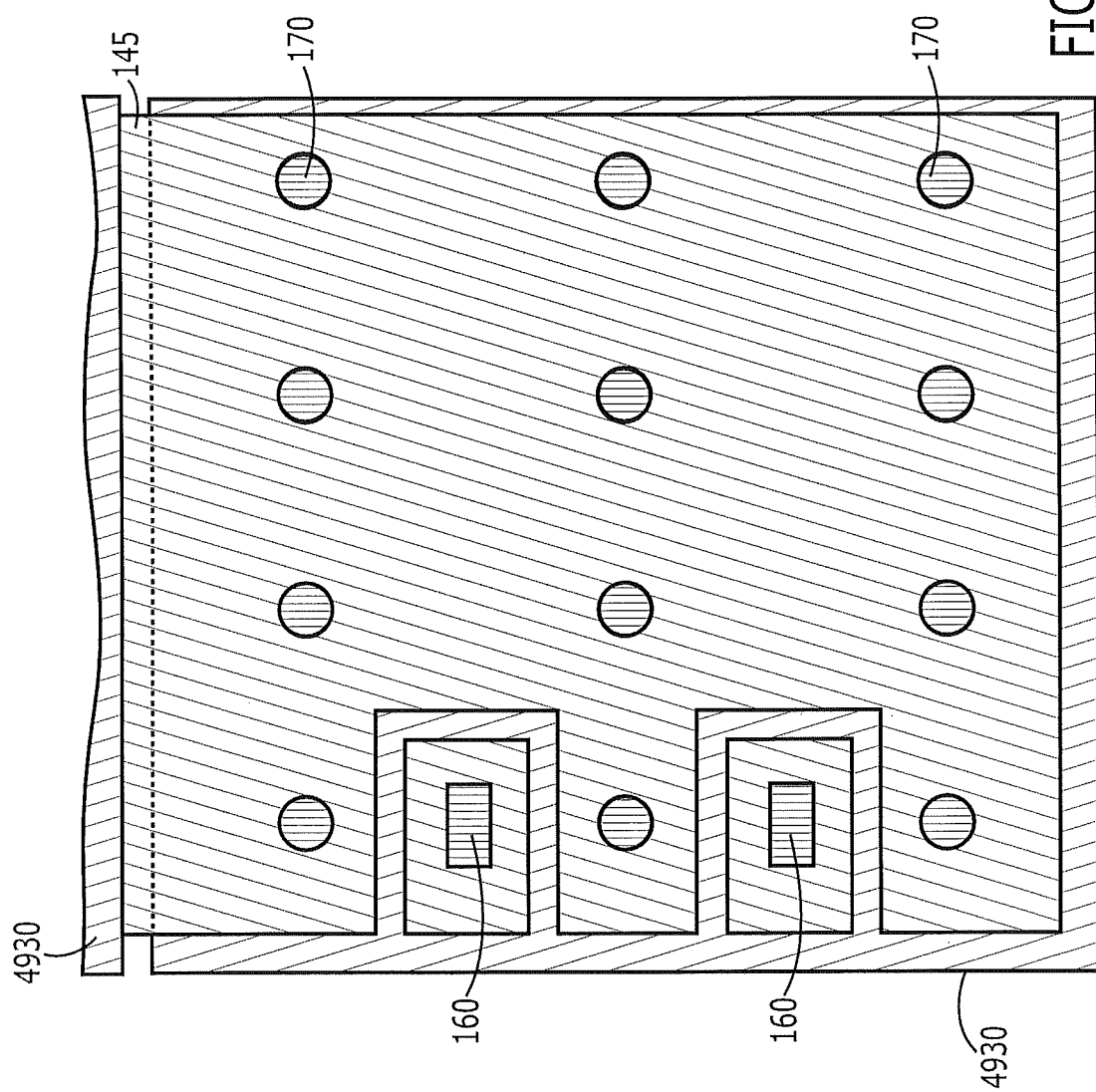

Additional discussion of various embodiments described herein will now be provided. In particular, the cross-sections of FIGS. 38-49 only illustrated a single anode contact 160 and a single cathode contact 170 for each LED die. However, in other embodiments, multiple anode contacts and/or multiple cathode contacts may be provided for a given LED die. For example, FIG. 50 illustrates a bottom view of an LED die 4930 of FIG. 49 that includes two anode contacts 160 that are of rectangular shape, and an array of twelve cathode contacts 170 that are circular in shape. Other numbers and shapes may be used in other embodiments. The internal interconnection layer 145 electrically contacts the cathode contacts 170 and also extends beyond the LED die 4930 as shown. The internal interconnection layer 145 also electrically connects the anode contacts 160, but does not electrically connect the anode contacts 160 to the cathode contacts 170, which would short the LED die 4930.

Figure 51:
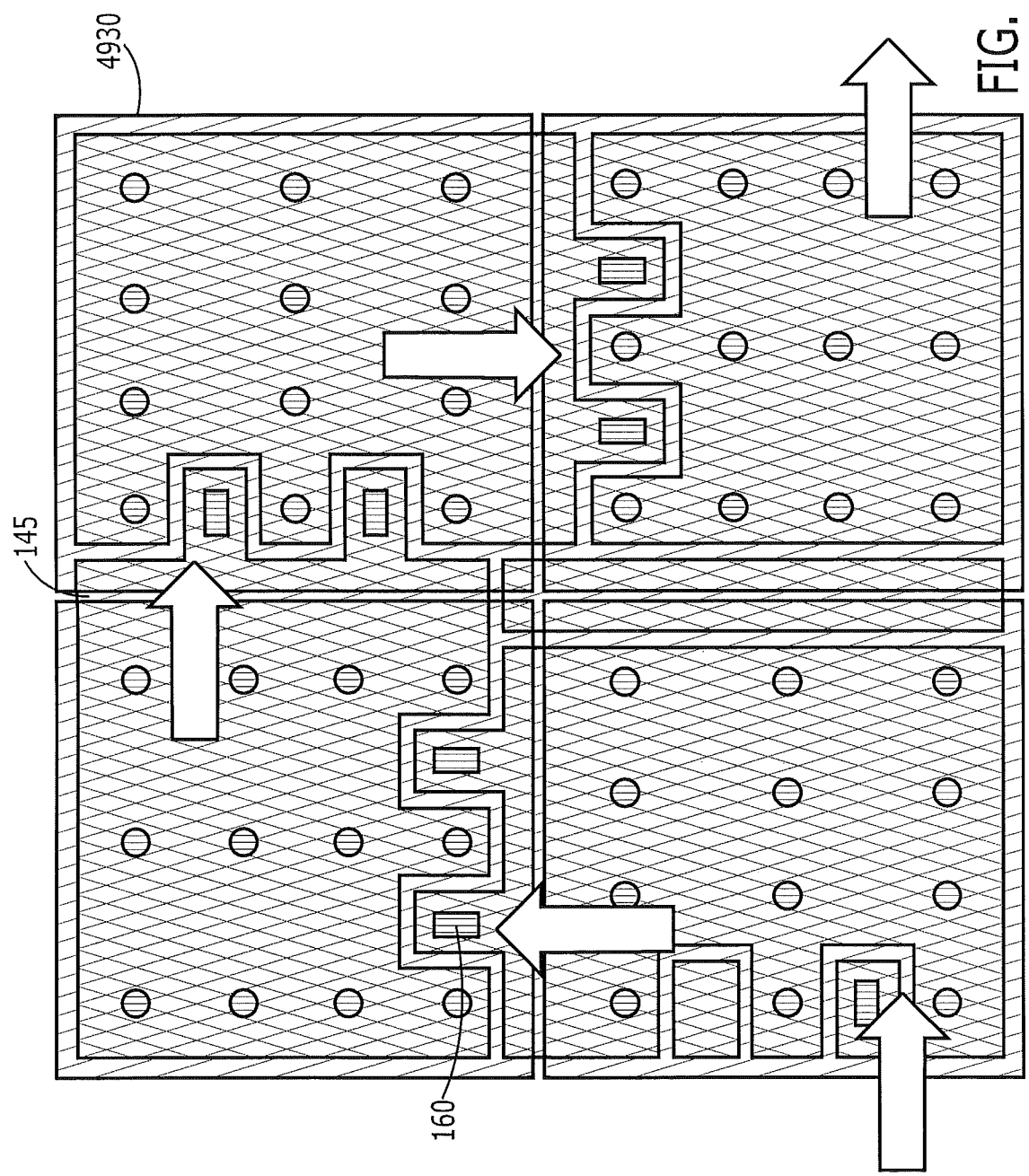

FIG. 51 illustrates four LED dies 4930 of FIG. 50 wired in series, as shown by the thick arrows 5110. FIG. 51 illustrates how the patterned internal interconnection layer 145 can selectively electrically connect the anodes and cathodes of four LED dies 4930 in series.

FIG. 52 is a plan view of a carrier die 4920 for FIG. 49, illustrating the thermal or neutral contact 2300, and the through vias 196 for n- and p-contacts.

Figure 53A:
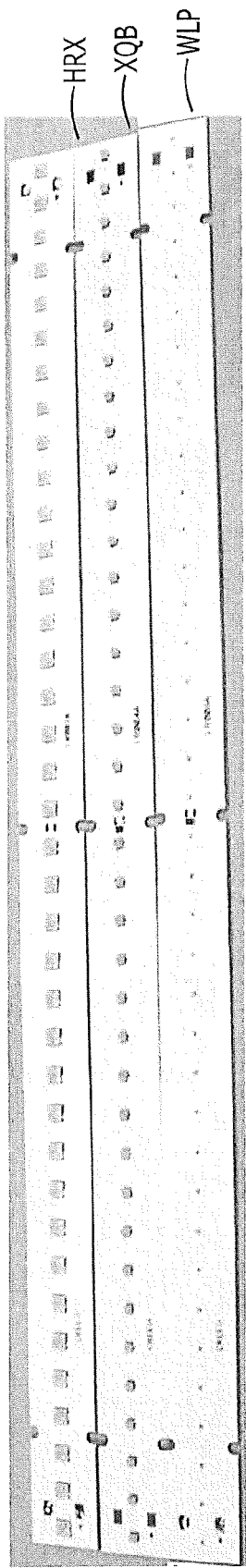
FIGS. 53A and 53B are photographs of LED chips on mounting boards according to various embodiments described herein.
Figure 53B:
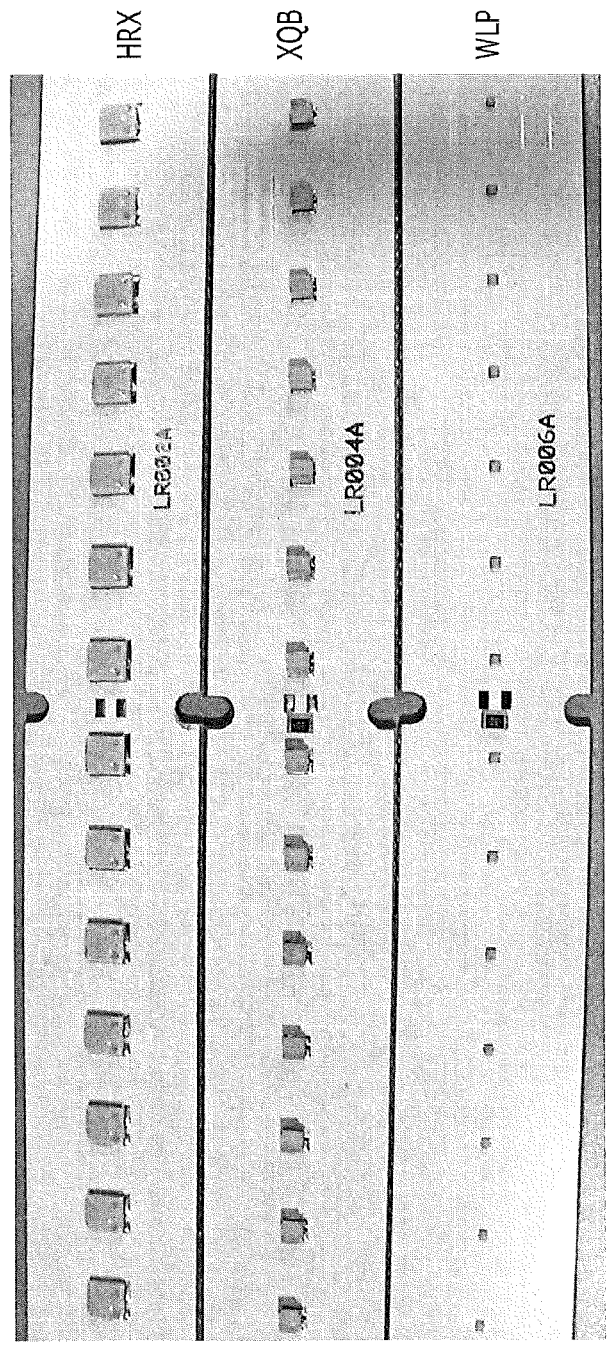

FIGS. 53A and 53B illustrate a series of 38 HRX, XQB and WLP LEDs mounted on a mounting board. Embodiments of FIGS. 53A and 53B may be configured, for example, as a replacement for a fluorescent tube.

In FIGS. 53A and 53B, the mounting boards are all of the same size of about 285 mm×15 mm, or about 4275 mm². An individual HRX LED has an area of about 3 mm×3 mm, or about 9 mm² and may comprise a single die that is about 355 μm×711 μm in size. An individual XQB LED has an area of about 1.6 mm×1.6 mm, or about 2.56 mm² and may comprise two dies connected in parallel, where each die is about 35 μm×470 μm in size. Various embodiments of HRX LEDs are described, for example, in application Ser. No. 13/755,993 to Hussell et al, filed Jan. 31, 2013, entitled Submount Based Surface Mount Device (SMD) Light Emitter Components and Methods, the disclosure of which is hereby incorporated herein by reference in its entirety as if set forth fully herein. Moreover, various embodiments of XQB LEDs are described, for example, in U.S. patent application Ser. No. 13/649,052 to Lowes et al., filed Oct. 10, 2012, entitled LED Package With Encapsulant Having Planar Surfaces, the disclosure of which is hereby incorporated herein by reference in its entirety as if set forth fully herein. A WLP LED fabricated according to any of the embodiments described herein, may have an area of about 0.7 mm×0.7 mm, or about 0.49 mm². As shown, each board includes 38 LEDs thereon. The individual LED area and the total LED area for 38 LEDs are shown in Table 1. The right hand column of Table 1 shows the percentage of the total board area taken up by the LEDs. As shown in Table 1, a remarkable decrease in the percentage of the board area taken up by the LEDs may be provided by WLP LEDs, according to various embodiments described herein.

TABLE 1

| LED | LED Area Individual | Total | % LED to Board |
|---|---|---|---|
| HRXS | 9 mm² | 342 mm² | 8% |
| XQB | 2.56 mm² | 97.28 mm² | 2% |
| WLP | 0.49 mm² | 18.62 mm² | 0.4% |

Accordingly, Table 1 illustrates an LED chip according to various embodiments described herein that may be mounted on a board that has an area of at least 1,000 mm² in some embodiments, at least 2,500 mm² in other embodiments, at least 4,000 mm² in other embodiments, and about 4,275 mm² in still other embodiments, wherein at least 30 LEDs, and in some embodiments 38 LEDs, take up less than 1% of the board area in some embodiments, less that 0.5% of the board area in other embodiments, and about 0.4% of the board area in yet other embodiments, and can provide a replacement for a fluorescent tube in some embodiments.

It will be understood that various embodiments of FIGS. 1-36 may also be combined with various embodiments of FIGS. 37-53. For example, the various protective layers 222, 222', 222" that were illustrated in FIGS. 19, 20 and 30A-30C, may be incorporated into embodiments of FIGS. 37-53. Moreover, an individual dome 2510, as was illustrated in FIGS. 25 and 32, may also be incorporated into any of the embodiments of FIGS. 37-53. In addition, macro- and/or microlenses 2610, as were illustrated in FIGS. 26 and 31, may also be incorporated into any of the embodiments of FIGS. 37-53. Thus, various lenses in the form of a cube, a dome, an overmold and/or a microlens may be provided in any of the embodiments described herein. Finally, any of the internal structures or manufacturing techniques of FIGS. 1-36 may be incorporated into embodiments of FIGS. 37-53 and vice versa. For example, the internal structure of an LED die, the internal interconnection structures, the substrate shaping, singulation, wavelength conversion layer configuration of FIGS. 37-53 may be incorporated into any of FIGS. 1-36, and LED fabrication, chip fabrication and module/fixture fabrication of FIGS. 1-36 may also be incorporated into embodiments of FIGS. 37-53. Finally, although FIGS. 1A-1U, 6, 9A-9B, 17-27 and 35 illustrated individual LED dies, these LED dies may be provided in a common substrate, as was illustrated in FIGS. 38-52 herein. Stated differently, there may be no need to singulate individual LED dies in embodiments of FIGS. 1-36, but, rather, a common substrate may be retained, as was illustrated in FIGS. 37-53.

The remaining portion of this DETAILED DESCRIPTION includes the detailed description of FIGS. 1-13C of application Ser. No. 13/790,369, except that the figures have been renumbered as FIGS. 54-66C herein.

Figure 54:
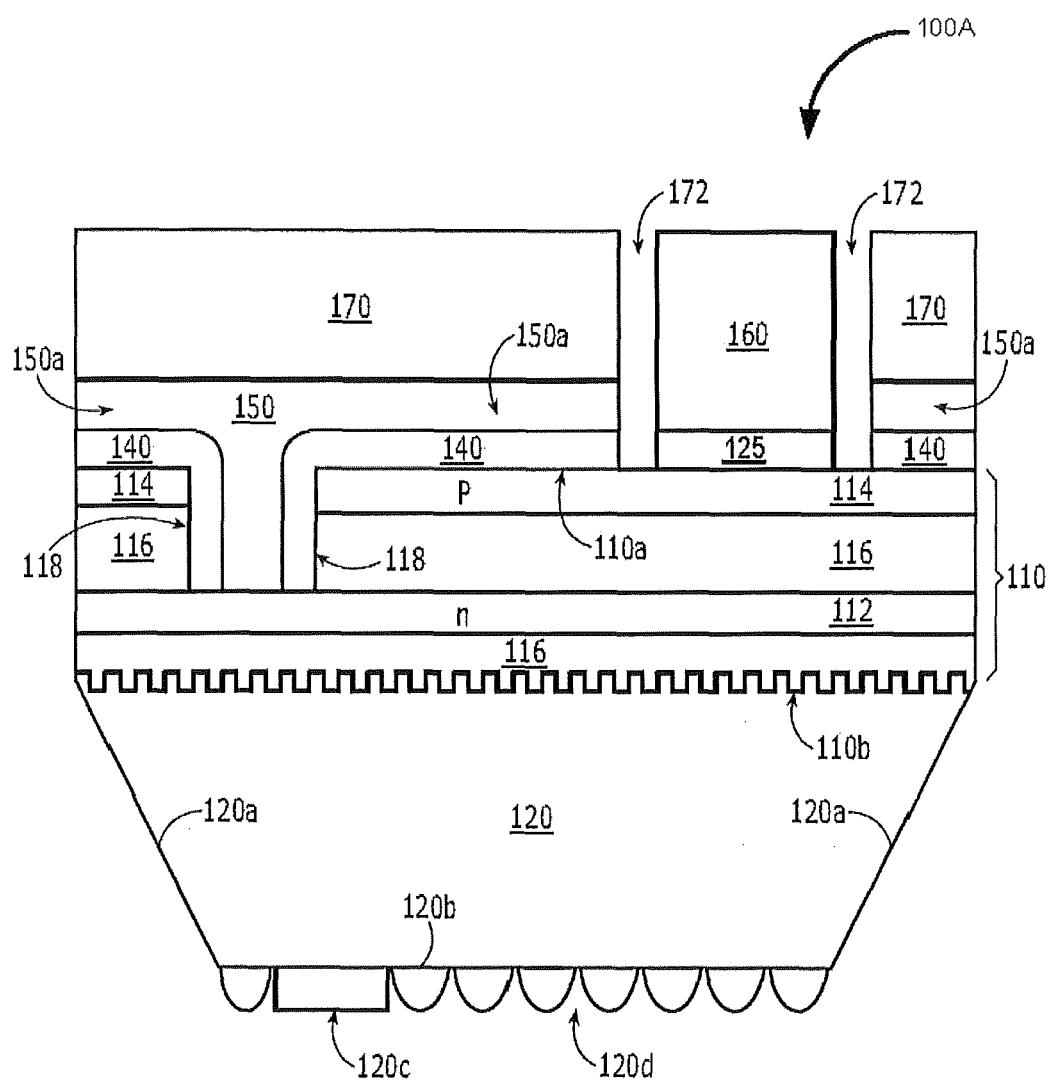
FIGS. 54 and 55 are cross-sectional view of light emitting diodes according to various embodiments described herein.

FIG. 54 is a cross-sectional view of a light emitting diode structure 100A according to various embodiments. Referring to FIG. 54, these light emitting diodes include a diode region 110 having first and second opposing faces 110a, 110b, respectively, and including therein an n-type layer 112 and a p-type layer 114. Other layers or regions 116 may be provided which may include quantum wells, buffer layers, etc., that need not be described herein. The diode region 110 also may be referred to herein as an "LED epi region", because it is typically formed epitaxially on a substrate 120. For example, a Group III-nitride based LED epi region 110 may be formed on a silicon carbide growth substrate 120. In some embodiments, as will be described below, the growth substrate 120 may be present in the finished product. In other embodiments, the growth substrate 120 may be removed.

Continuing with the description of FIG. 54, an anode contact 125, also referred to as a "p-contact", ohmically contacts the p-type layer 114 and extends on the first face 110a of the diode region 110. The anode contact 125 may extend to a greater or less extent on the p-type layer 114 than illustrated in FIG. 54. An insulating layer 140 also extends on the first face 110a outside the anode contact 125. The insulating layer 140 may include a transparent material, such as SiN and/or SiO₂. The insulating layer may also include a multilayer structure, such as a multi-layered stack of insulating materials. A reflective cathode contact 150, also referred to as an "n-contact" electrically contacts the n-type layer 112 and extends through the insulating layer 140 and onto the insulating layer 140 that is outside the anode contact 125. In some embodiments, the reflective cathode contact 150 may directly and ohmically contact the n-type layer 112. In other embodiments, however, a thin ohmic contact layer (not shown), such as a layer of titanium, may provide the actual ohmic contact to the n-type layer 112. The insulating layer 140 and the reflective cathode contact 150 can provide a hybrid reflective structure or "hybrid mirror", wherein the underlying insulating layer 140 provides an index refraction mismatch or index step to enhance the total internal reflection (TIR) from the reflective layer 150 compared to absence of the underlying insulating layer 140. It will also be understood that, in other embodiments, the insulating layer 140 may comprise multiple sublayers, such as oxide and nitride sublayers to provide, for example, a distributed Bragg reflector. Moreover, the reflective cathode contact 150 may also include a plurality of sublayers.

As also shown in FIG. 54, in some embodiments, a via 118 extends into the first face 110a to expose the n-type layer 112, and the insulating layer 140 extends into the via 118. Moreover, the reflective cathode contact 150 also extends on the insulating layer 140 into the via 118, to electrically, and in some embodiments ohmically, contact the n-type layer 112 that is exposed in the via 118.

An anode bond pad 160 is also provided that is electrically connected to the anode contact 125. A cathode bond pad 170 is also provided that is electrically connected to the reflective cathode contact 150. As shown, the anode and contact pads 160 and 170 extend on the first face 110a in closely spaced apart relation to one another, to define a gap 172 therebetween. The gap may be filled with an insulator as described below. In any embodiments illustrated herein, the gap 172 may occur at any desired position and is not limited to the position illustrated herein. In some embodiments, the cathode bond pad 170 may be made as large as possible, so that it can be directly coupled to a grounded heat sink for enhanced thermal dissipation in a flip-chip mounting configuration, without the need for an intervening electrically insulating layer that could reduce thermal efficiency.

As also shown in FIG. 54, a transparent substrate, such as a transparent silicon carbide growth substrate 120, may be included on the second face 110b of the diode region 110. The transparent substrate 120 may include beveled sidewalls 120a and may also include an outer face 120b that is remote from the diode region 110. As shown, the outer face 120b may be textured. The thickness of the substrate 120, the resistivity of the substrate, geometry of the sidewalls 120a and/or the texturing of the remote face 120b may be configured to enhance the far field emission of radiation from the diode region 110 through the substrate 120. The emission from the diode region 110 may take place directly from the diode region 110 through the substrate 120 and may also take place by reflection from the reflective cathode contact 150 back through the diode region 110 and through the substrate 120. In some embodiments, reflection may also take place from the anode contact 125, as will be described in detail below.

As also shown in FIG. 54, in some embodiments, when the transparent substrate 120 is sapphire, Patterned Sapphire Substrate (PSS) technology may be used to texture the interface between the sapphire substrate 120 and the diode region 110, as shown by the jagged interface between the substrate 120 and the second face 110b of the diode region 110. As is well known, PSS technology may provide texture features that may be, for example, about 3 μm in size on an about 5 μm pitch (feature to feature distance). Other sizes/pitches and/or random sizes/pitches may also be used. The use of PSS technology can enhance the extraction efficiency between the gallium nitride-based diode region 110 and the index mismatched sapphire substrate 120.

Accordingly, some embodiments of the invention can provide an LED that is suitable for flip-chip mounting (i.e., mounting opposite the orientation of FIG. 54), wherein the anode bond pad 160 and the cathode bond pad 170 are mounted on a supporting substrate, such as a printed circuit board or other wiring board, and emission of light takes place through the substrate 120 remote from the anode bond pad 160 and the cathode bond pad 170. Thus, a lateral LED may be provided wherein both the anode contact 125 and the cathode contact 150 extend on a given face of the diode region (i.e., the first face 110*a*), and emission takes place remote from the anode and cathode contacts 125 and 150, respectively, through the second face 110*b* of the diode region, and through the substrate 120. In other embodiments, the substrate may be removed so that emission takes place directly from the second face 110*b* of the diode region 110.

As was noted above, the geometry of the substrate 120 may be configured to provide a desired far field emission pattern, such as Lambertian emission. Moreover, texturing may take place on the sidewalls 120*a* and/or on the face 120*b* of the substrate 120. Many different configurations of texturing may be used including random texturing, microlenses, microarrays, scattering regions and/or other optical regions. According to some embodiments, the outer face 120*b* may be differently textured in a first portion 120*c* thereof than a second portion 120*d* thereof, so as to provide an orientation indicator for the light emitting diode. Thus, as shown in FIG. 54, an array of microlenses 120*d* may be provided except at a given area adjacent the transparent cathode contact, wherein a small bar 120*c* or other indicator, such as a "+" sign, may be provided. The different texturing on the remote face 120*b* of the substrate can provide an orientation indicator that can allow pick-and-place equipment to correctly orient the LED for packaging, even if the structure of the LED is not "visible" to the pick-and-place equipment through the textured substrate.

In some embodiments, the anode contact and/or the cathode contact can provide a reflective structure on the first face 110*a* that is configured to reflect substantially all light that emerges from the first face 110*a* back into the first face 110*a*. The reflective structure further includes the insulating layer 140 beneath the cathode contact 150 and extensions thereof 150*a*. In particular, in some embodiments, the reflective structure reflects the light that emerges from at least 90% of an area of the first face 110*a*. The reflective structure may comprise reflective materials that themselves reflect at least 90% of the light that impinges thereon. In some embodiments, the anode contact 125 may be a reflective anode contact that ohmically contacts the p-type layer 114. In these embodiments, the reflective structure may be provided by a reflective surface of the anode contact 125 that ohmically contacts the p-type layer 114, a reflective surface of the cathode contact 150 that ohmically contacts the n-type layer 112 and a reflective surface of extensions of the cathode contact, identified as 150*a* in FIG. 54, that extend onto the first face 110*a* between the via 118 and the anode contact 125, in combination with the insulating layer 140. In other embodiments, the anode contact 125, may be transparent, and the reflective cathode contact 150, specifically the extensions 150*a* of the reflective cathode contact 150, may extend onto the transparent anode contact 125 to provide a reflective structure in combination with the insulating layer 140. Thus, in some embodiments, the reflective cathode contact can extend to cover substantially all of the first face that is outside the anode contact with the reflective cathode contact. In other embodiments, the reflective cathode contact can cover substantially all of the first face that is outside the anode contact with the reflective cathode contact, and also can cover at least a portion of the anode contact with the reflective cathode contact. More detailed embodiments will be described below.

Accordingly, some embodiments may provide LEDs with a lateral flip-chip configuration. Some embodiments may provide dual mirrors on the p-type and n-type layers. Moreover, the n-type mirror may be an integrated n-contact mirror that can make electrical contact with at least one n-type layer of the LED epi, and can also extend over at least one p-type contact of the LED epi. The integrated n-contact mirror may include a material, such as aluminum, that is optically reflective to wavelengths generated by the LED epi. The transparent insulating layer and the reflective layer can provide a hybrid reflective structure or "hybrid mirror", wherein the underlying transparent insulating layer provides an index of refraction mismatch or index step to enhance the TIR from the diode region compared to absence of the underlying transparent insulating layer. Moreover, the light emitting face of the LED chip, opposite the mirror(s), may include a growth substrate. The growth substrate may further include a shaped surface, such as tapered sidewalls and/or texturing, for light extraction purposes. The amount of tapering and/or texturing may be related to the total thickness of the LED, including the growth substrate. The geometry of the substrate (e.g., thickness/sidewall bevels) and/or the texturing thereof may be adjusted to achieve desired far-field emission patterns. Moreover, since the substrate need not conduct current, it can have high resistivity so that it can be transparent.

LED chips according to various embodiments may be more rugged or robust than conventional LED chips. In particular, the only exposed surfaces of the LED chip may be solid p- or n-contact portions on one side, and the growth substrate on the other side. In contrast, conventional LED chips may need fragile wire bonds and may include exposed top and/or bottom portions of the LED epi.

Moreover, it has also been found, according to various embodiments, that the provision of a transparent insulating layer between the diode region and the reflective cathode contact may actually enhance the reflectivity from the diode region by providing an index mismatch or index step. Accordingly, as shown, for example, in FIG. 54, the insulating layer 140 can provide an integral optical element for the reflective cathode contact 150, in addition to providing desired electrical insulation for the LED. Moreover, the insulating layer 140 and the reflective cathode contact 150 can provide a hybrid mirror.

An explanation of the operation of the insulating layer 140 as part of a hybrid reflector will now be provided. In particular, LEDs typically include multiple layers of different materials. As a result, light emitted from the active region must typically pass through or across one or more of such layers before exiting the LED. Snell's law dictates that the photons will be refracted as they pass from one material to the next. The angles at which the photons will be refracted will depend upon the difference between the refractive indexes of the two materials and the angle of incidence at which the light strikes the interface.

In an LED, although some reflected light will still escape the LED at some other location, a certain percentage will be totally internally reflected, never escape the LED, and will thus functionally reduce the external efficiency of the LED. Although the individual reduction in the percentage of photons escaping may appear to be relatively small, the cumulative effect can be significant, and LEDs that are otherwise very similar can have distinctly different performance efficiencies resulting from even these small percentage losses.

Snell's law dictates that when light crosses an interface into a medium with a higher refractive index, the light bends towards the normal. Similarly, when light travels across an interface from a medium with a high refractive index to a medium with a lower refractive index, light bends away from the normal. At an angle defined as the critical angle, light traveling from a medium with a high refractive index to a medium with a lower refractive index will be refracted at an angle of 90°; i.e., parallel to the boundary. At any angle greater than the critical angle, an incident ray undergoes total internal reflection (TIR). The critical angle is thus a function of the ratio of the refractive indexes. If the light hits the interface at any angle larger than this critical angle, the light will not pass through to the second medium at all. Instead, the interface reflects the light back into the first medium, a process known as total internal reflection. The loss of light due to this total internal reflection is known as the critical angle loss, and is another factor that reduces the external efficiency of the LED.

Embodiments of a hybrid mirror described herein use index mismatching to enhance total internal reflection (TIR) based on Snell's law. In order to enhance TIR, it is desired to provide a large index change to a lower refractive index material relative to the GaN-based diode region. Thus, any light outside the escape cone angle given by Snell's law is internally reflected back into the diode region, and can have essentially no loss. The reflective cathode contact 150 and/or a reflective anode contact can then be used to reflect the fraction of the light impinging thereon from an omnidirectional light source. Accordingly, both the transparent insulating layer 150 and the reflective cathode contact act as a hybrid reflector according to various embodiments to enhance reflection of light emerging from the diode region back into the diode region.

Other embodiments of the invention can provide a reflective layer for a vertical LED. Thus, light emitting diodes according to various embodiments may also comprise a diode region including therein an n-type layer and a p-type layer, and a contact for one of the n-type layer or the p-type layer. The contact may comprise an insulating layer 140 on the one of the n-type layer or the p-type layer that has an index of refraction that is less than the one of the n-type layer or the p-type layer. A reflective layer 150 is provided that electrically contacts the one of the n-type layer or the p-type layer, and that extends on the transparent insulating layer. Accordingly, the insulating layer 140 can provide an integral optical element for a reflective layer 150 so as to provide a hybrid mirror that can improve the reflectivity of the reflective layer 150 compared to absence of the insulating layer 140, because the transparent insulating layer provides an index mismatch or index step to the diode region 110. In other embodiments, the reflective layer 150 can also electrically contact, and in some embodiments ohmically contact, the one of the n-type layer or the p-type layer, and may extend through the insulating layer 140 to make this contact. In still other embodiments, a second contact may be provided for the other of the n-type layer or the p-type layer. The second contact may comprise a second reflective layer that ohmically contacts the other of the n-type layer or the p-type layer. In other embodiments, the second contact may comprise a transparent conductive layer that ohmically contacts the other of the n-type layer or the p-type layer, and the insulating layer 140 and the reflective layer 150 can both extend onto the transparent conductive layer.

Moreover, various embodiments as described herein can also provide a diode region 110 having first and second opposing faces 110a, 110b, and including therein an n-type layer 112 and a p-type layer 114. A reflective anode contact 125 ohmically contacts the p-type layer and extends on the first face 110a. A reflective cathode contact 150 ohmically contacts the n-type layer and extends on the first face. The reflective anode contact 125 and the reflective cathode contact 150 are configured to reflect substantially all light that emerges from the first face 110a back into the first face 110a. Stated differently, the reflective cathode contact 150 can cover substantially all of the first face 110a that is outside the anode contact 125. Moreover, in other embodiments, the reflective cathode contact 150 can also cover at least a portion of the anode contact 125.

Figure 55:
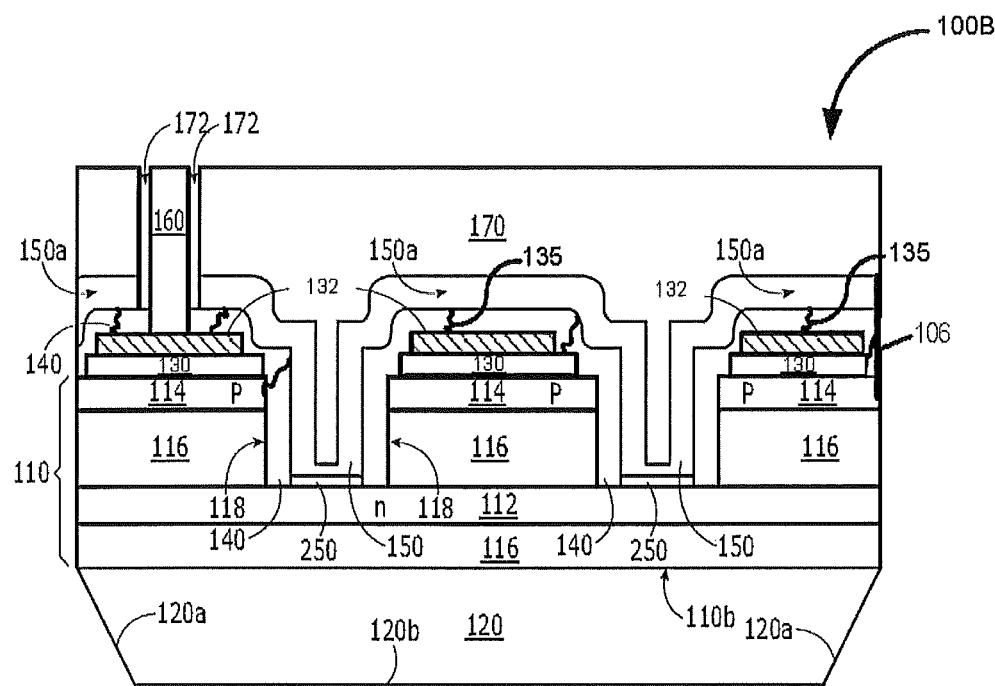

FIG. 55 is a cross-sectional view of an LED structure 100B according to other embodiments. In these embodiments, a reflective anode contact is provided in addition to a reflective cathode contact.

More specifically, in FIG. 55 a diode region 110 is provided as was described in connection with FIG. 1. A substrate 120 is also provided, although it need not be provided in other embodiments. The substrate 120 may be thinned relative to the thickness of the growth substrate. A reflective anode contact 130 is provided that ohmically contacts the p-type layer 114 and extends on the first face 110a. The reflective anode contact may include silver. In some embodiments, the reflective anode contact 130 may include a two-layer structure including, for example, about 5 Å of nickel (Ni) directly on the p-type layer 114 and about 1000 Å of silver (Ag) on the nickel, to thereby provide an "NiAg mirror" 130. The reflective anode contact 130 can reflect at least 90% of the visible light from the diode region 110 that impinges thereon. Other reflective layers that also provide an ohmic contact to p-type gallium nitride may be used in other embodiments. It will be understood that the reflectivity of the NiAg mirror is determined primarily by the Ag because only a very thin layer (in some embodiments less than about 10 Å) of Ni is used. Moreover, when annealed, this nickel may convert to nickel oxide to enhance the ohmic contact for the Ag to the p-type gallium nitride. Thus, the NiAg mirror 130 can have about the same reflectivity of Ag alone, but can provide a better contact and lower voltage to the p-type layer. In other embodiments, pure Ag may be used.

Surmounting the NiAg mirror 130 is a barrier layer 132 which may include sublayers comprising about 1000 Å of titanium tungsten (TiW), about 500 Å of platinum (Pt) and about 1000 Å of titanium tungsten (TiW). The titanium tungsten/platinum sublayers may repeat in multiple repetitions to provide a desired diffusion barrier. The diffusion barrier layer 132 generally is not reflective. Thus, the face of the NiAg mirror 130 that is directly on the p-type layer 114 provides a reflective structure.

Continuing with the description of FIG. 55, an insulating layer 140 is provided on the sidewalls of the via 118 and on the first face 110a outside the via 118. In some embodiments, as shown, the insulating layer 140 may also extend onto at least a portion of the NiAg mirror 130. In some embodiments, the insulating layer 140 may comprise about 1 μm of silicon nitride (SiN) and/or about 0.5 μm of silicon diode (SiO$_2$). The thickness of the transparent insulating layer may be configured to enhance the reflectivity from the reflective cathode contact 150, based on the operating wavelength of the LED and/or the index of refraction of the insulating layer, using techniques known to those skilled in the art. In particular, silicon dioxide may have an index of refraction of about 1.5 while SiN may have an index of refraction of about 2.0, both of which are less than the index of refraction of gallium nitride (about 2.5), so that an index mismatch or index step is provided by the insulating layer 140, which can actually enhance TIR from the diode region 110.

As also shown in FIG. 55, the reflective cathode contact 150 can ohmically contact the n-type layer 112, for example on the floor of the via 118 and can extend on the insulating layer 140 on the sidewall of the via 118, and may also extend onto the insulating layer 140 that is outside the via 118 as indicated by 150*a*. In some embodiments, the reflective cathode contact 150 may comprise about 1500 Å of aluminum. Thicker reflective cathode contacts also may be used. The hybrid reflector that includes the insulating layer 140 and the aluminum reflective cathode contact 150 can reflect at least 90% of the visible light from the diode region 110 that impinges thereon. In other embodiments, a separate ohmic contact layer 250 may be provided between the reflective cathode contact 150 and the n-type layer 112, to provide an ohmic contact to the n-type layer 112. In some embodiments, the ohmic contact layer 250 may comprise titanium, for example annealed titanium, or aluminum/titanium alloy It will be understood that the ohmic contact layer 250 may be used in any and all of the embodiments described herein between the reflective contact 150 and the n-type or p-type layer.

Finally, an anode bond pad 160 and a cathode bond pad 170 are provided. The anode bond pad 160 and the cathode bond pad 170 can include a stack of about 500 Å titanium (Ti), about 2000 Å nickel (Ni) and about 1-3 μm of 80/20 gold-tin (AuSn) alloy, to provide "TiNiAuSn pads". Other materials may be used, and not all of these layers may be used. For example, pure tin may be used as it has a lower melting point. Moreover, in other embodiments, a plating seed layer may be provided on the anode contact and on the reflective cathode contact, and at least a portion of the anode and/or cathode bond pads are plated on the seed layer. In still other embodiments, the reflective cathode contact 150 and/or the barrier layer 140 may provide the plating seed layer for plating the pads 160/170 thereon. The plated anode and cathode bond pads can also provide mechanical support and enhanced thermal efficiency.

Accordingly, embodiments of FIG. 55 may provide a reflective structure on the first face 110*a* that is configured to reflect substantially all light, for example, at least 90% of the light that emerges from the first face 110*a* back into the first face 110*a*. In embodiments of FIG. 55, the reflective structure comprises two different reflectors. More specifically, the reflective structure comprises a reflective surface of the anode contact 130 that ohmically contacts the p-type layer 114, a reflective surface of the cathode contact 150 that ohmically contacts the n-type layer 118 and a reflective surface of extensions 150*a* of the cathode contact 150 that extend between the reflective surface of the anode contact 130 that ohmically contacts the p-type layer 114 and the hybrid reflective surface of the cathode contact 150 in combination with the insulating layer 140. When viewed from the perspective of the diode region 110, substantially all the light that emerges from the diode region 110 into the anode and cathode contacts can be reflected back into the diode region. Thus, from an area standpoint, the reflective structure of FIG. 55 can reflect the light that emerges from at least 85% of the area of the first face, and in some embodiments, at least 90% of the area. In other words, at least 90% of the diode face can be covered by mirror. Moreover, since the reflective structure can comprise nickel-silver (anode contact 130) and aluminum (cathode contact 150), at least 90% of the light that impinges on the reflective structure may be reflected. In other words, the mirror may have at least 90% efficiency.

Other LED structures, such as the structures illustrated in U.S. Patent Publication No. 2009/0283787, the disclosure of which is incorporated herein by reference and which is assigned to the assignee of the present invention, included a barrier layer that surrounded the p-type ohmic contact and contacted the underlying p-type layer. Such a barrier layer formed a non-ohmic contact to the p-type layer and was optically absorbing, which caused some loss of light in the chip. Embodiments of the present invention protect the edges of the anode contact 130 with an insulating structure that forms a hybrid reflector with the cathode contact 150, which may increase the amount of light exiting the chip. As the barrier layer 130 is contained within the periphery of the reflective anode contact 130, it may not absorb light generated in the active region 116 of the LED chip, as it is hidden from the active region by the reflective anode contact 130.

When an LED chip structure as illustrated in FIG. 54 or 55 is flip-chip mounted onto a submount or other surface, mechanical force may be applied to the LED chip in a thermosonic or thermocompressive bonding process. In some bonding processes, such as a flux eutectic AuSn reflow attach process at 320° C., no external force may be applied to the chip. However, stress can be imparted to the LED chip due to mismatches in the coefficients of thermal expansion of various materials in the chip structure and the package substrate layers when the chip is bonded at high temperature. Even if a lower temperature mounting process is used, it may be desirable for an LED chip structure to be able to tolerate subsequent reflow temperatures of at least about, for example, 260° C. which may occur when the completed component is mounted onto a printed circuit board or other support substrate.

Many different bonding processes can impart mechanical stress to the LED chip, and in particular can impart mechanical stress to the insulating layer 140, potentially resulting in the formation of hairline cracks 135 in the insulating layer 140. In most locations, these hairline cracks 135 may not adversely affect the operation or reliability of the LED chip. However, if a hairline crack 135 occurs at a location where it extends from the anode contact 132 to an external surface of the chip, or to the cathode contact 150, then silver or other metal in the anode contact 130 can migrate through the hairline crack. This migration of metal can cause an electrical short to form between the anode contact 130 and the cathode contact 150, which can render the LED chip inoperable.

Figure 56:
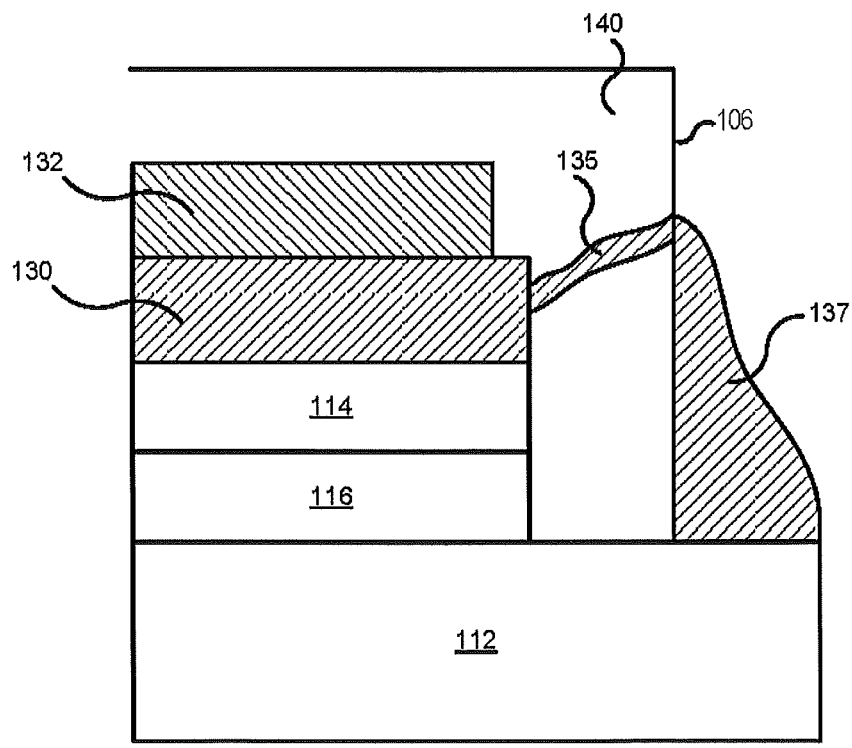
FIG. 56 is a detailed view of a portion of the LED structure shown in FIG. 55.

FIG. 56 is a detailed close-up view of a portion of the LED chip 100B shown in FIG. 55. As shown in FIG. 56, if a hairline crack 135 forms that extends from the anode contact 132 to an exterior surface 106 of the LED chip, silver or other metal in the anode contact 130 may migrate through the crack 135, and flow onto the outside of the chip. An unwanted external metal flow 137 may contact the n-type layer 112, which can also result in an undesirable electrical short circuit.

Silver migration may be exacerbated by the presence of moisture. Thus, for example, cracks occurring in the insulating layer 140 near an outer surface or edge surface of the LED chip structure may be more susceptible to the formation of electric short circuits due to silver migration.

Some embodiments of the present inventive concepts may mitigate the effect of cracks in the insulating layer 140 so that such cracks may not propagate entirely through the insulating layer 140, and/or may not provide a migration path in an area that is likely to result in an electrical short-circuit.

FIGS. 57A to 61B illustrate methods of forming an LED structure 100C including a crack-tolerant transparent insulating layer in accordance with some embodiments. In particular, FIGS. 57A, 58A, 59A, 60A, and 61A are plan views of intermediate LED device structures, and FIGS. 57B, 58B, 59B-59F, 60B and 61B are cross-sections of the intermediate LED device structures shown in FIGS. 57A, 58A, 59A, 60A, and 61A, respectively.

Figure 57A:
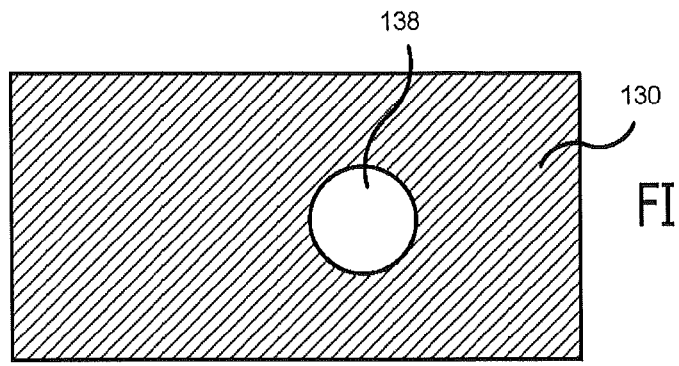
FIGS. 57A, 58A, 59A, 60A and 61A are plan views of intermediate LED device structures fabricated in accordance with some embodiments.
Figure 57B:
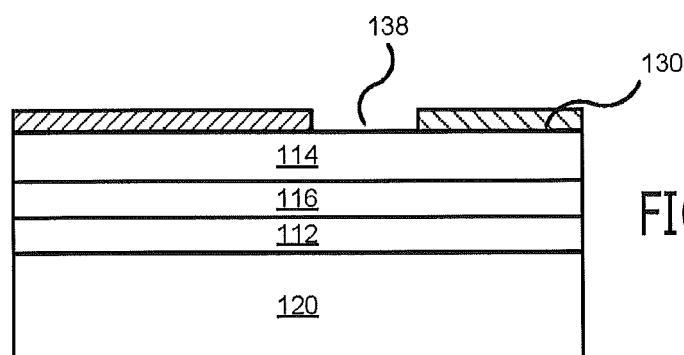
FIGS. 57B, 58B, 59B-59F, 60B and 61B are cross-sections of the intermediate LED device structures shown in FIGS. 57A, 58A, 59A, 60A, and 61A, respectively.

Referring to FIGS. 57A and 57B, a preliminary LED device structure includes an optional substrate 120, one or more n-type layers 112, an active region 116, and one or more p-type layers 114. The structure and composition of these layers is described in detail above and will not be repeated for brevity. The substrate 120 may include light extraction features as illustrated above in connection with FIG. 54. However, such features are omitted from the following figures for clarity.

For convenience, the active region 116 will be omitted from subsequent figures. However, it is understood that an active region will generally be present between the n-type layers 112 and the p-type layers 114.

Referring still to FIGS. 57A and 57B, a layer 130 of a reflective material, such as silver or nickel silver, is deposited on the upper surface of the p-type layers 114 as a reflective anode contact. The reflective layer 130 is patterned to form an aperture 138 in which the via 118 will be formed.

Figure 58A:
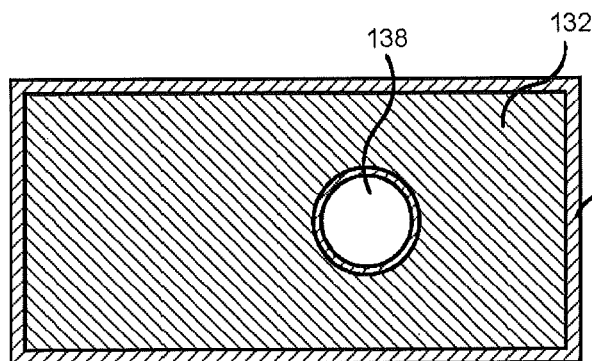
Figure 58B:
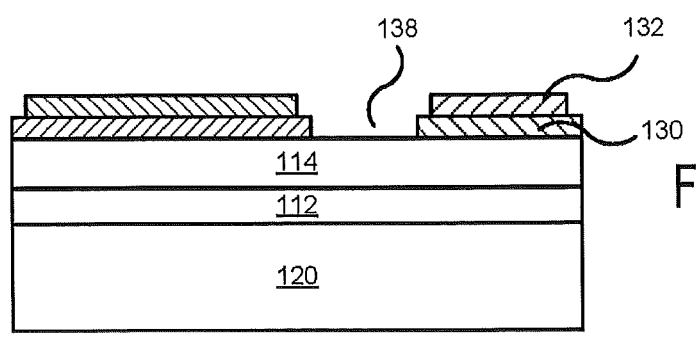

Referring to FIGS. 58A and 58B, a barrier layer 132 of, for example, titanium tungsten, tungsten, platinum or other suitable material is deposited on the reflective anode contact 130 and patterned to expose the aperture 138. The outer edges of the barrier layer 132 may be slightly recessed back from the peripheral edges of the reflective anode contact 130.

Figure 59A:
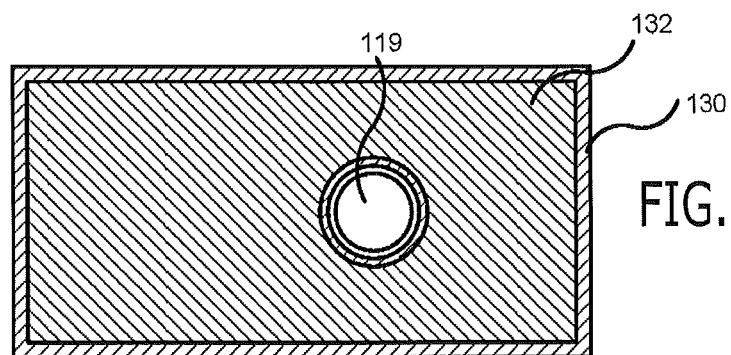
Figure 59B:
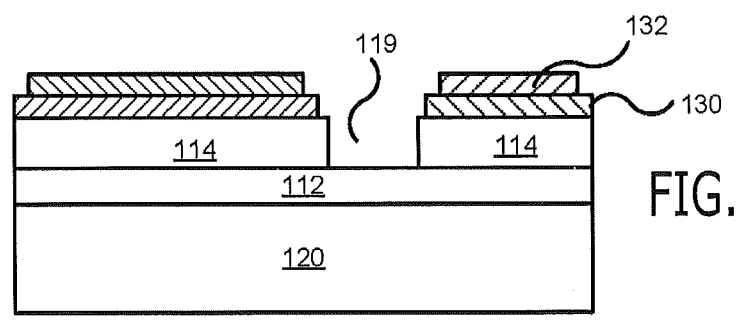

Referring to FIGS. 59A and 59B, a via 119 may be etched through the p-type layers 114 and the active region 116 (not shown) down to the n-type layers 112. A separate mask may be used or the reflective anode contact 130 and/or barrier layer 132 may be used as an etch mask to form the via 119.

Figure 59C:
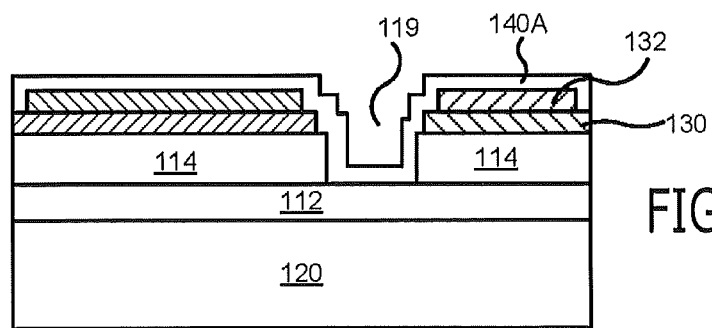

Referring to FIG. 59C, a base insulating layer 140A may be blanket-deposited over the structure to cover the exposed portions of the transparent anode contact 130 and the barrier layer 132. The insulating layer 140A may extend into the via 119 and onto exposed portions of the p-type layers 114, the active layers 116 (not shown) and the n-type layers 112. The base insulating layer 140A may include a dielectric material, such as SiN, SiO$_2$, etc., and may have a thickness of between about 250 nm and 1 micron, and in particular embodiments may have a thickness of about 500 nm.

Figure 59D:
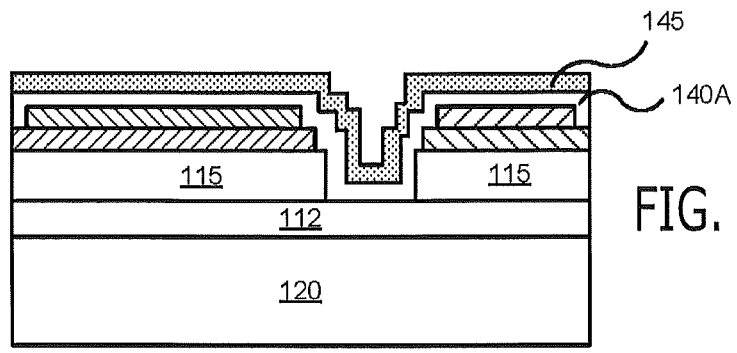

Referring to FIG. 59D, a crack reducing interlayer 145 is deposited over the base insulating layer 140A. In particular, the crack reducing interlayer 145 may include a material that is capable of reducing the propagation of cracks through the insulating layer. Thus, the crack reducing interlayer 145 may in some embodiments have a composition different than the insulating layer. While not wishing to be bound by a particular theory, it is presently believed that the crack reducing layer may stop cracks from propagating through the insulating layer when the crack reducing layer has a different fracture mode compared to the insulating layer. For example, silicon dioxide is characterized by having a brittle fracture mode, while metals typically have a ductile fracture mode. When a material has a ductile fracture mode, it undergoes plastic deformation before fracturing, while a material with a brittle fracture mode may not exhibit plastic deformation before fracturing. Providing a material with a ductile fracture mode as an interlayer within an insulating material having a brittle fracture mode may result in reduction of crack propagation, because the stress that causes cracks to propagate through the (brittle) insulating layer may not cause enough plastic deformation in the (ductile) interlayer to allow it to crack. Moreover, the cracks may themselves may provide some amount of strain relief to the insulating layer, which may reduce the amount of strain applied to the interlayer.

The crack reducing layer may also form an interface with the insulating layer that relieves stress in the structure when the crack propagates to the interface. That is, for example, slippage at the interface between the insulating layer and the crack reducing layer may result in stress relief at the interface, which may stop the propagation of cracks.

In some embodiments, the crack reducing interlayer 145 may include a material other than a dielectric material. In some embodiment, the crack reducing interlayer 145 may include a non-crystalline material, such as an amorphous material. The crack reducing interlayer 145 may include, for example, a metal such as aluminum (Al), titanium (Ti), tungsten (W), AlTi, AlTiW, TiW, or other metal. In some embodiments, the crack reducing interlayer 145 may include a polymer material, such as benzocyclobutene (BCB), polyimide, etc. In some embodiments, the polymer material may be a ductile polymer.

In order to withstand subsequent processing steps, the polymer may be a high temperature polymer, and in some embodiments may be able to tolerate temperatures up to about 300° C. or more.

The crack reducing interlayer 145 may have a thickness of about 10 nm to 1 micron. When the crack reducing interlayer 145 includes Al, the crack reducing interlayer 145 may have a thickness of about 150 nm.

In some embodiments, the crack reducing interlayer 145 may be fabricated to be thin enough as to be optically transparent. In other embodiments, the crack reducing interlayer 145 may be optically absorbing. For example, since the layer 130 may be reflective, light generated in the device may be reflected away from the crack reducing interlayer 145 and not absorbed thereby. In some embodiments, the crack reducing interlayer 145 may itself be reflective, such as when the crack reducing interlayer 145 comprises aluminum.

Figure 59E:
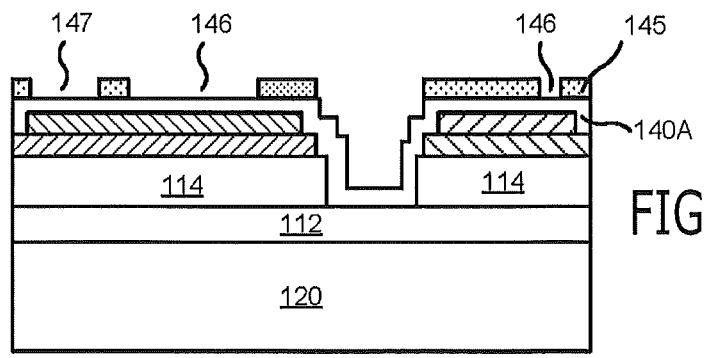
Figure 60A:
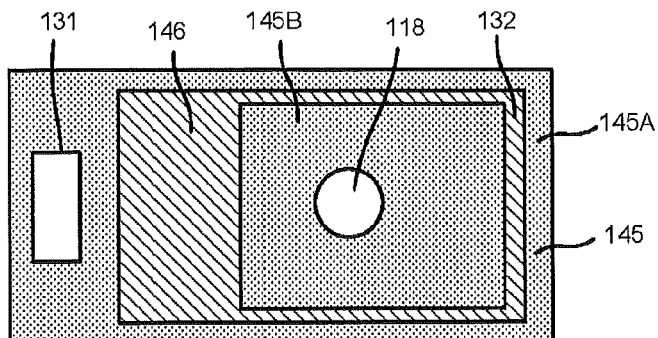

Referring to FIG. 59E, the crack reducing interlayer 145 may be patterned using, for example, photolithography, to form a gap or moat 146 that separates the crack reducing interlayer 145 into two separate portions 145A and 145B as shown in FIG. 60A and discussed in more detail below. The crack reducing interlayer 145 may also be patterned to form an aperture 147 therein that will be used to define a contact location for the anode contact of the device, as discussed in more detail below.

Figure 59F:
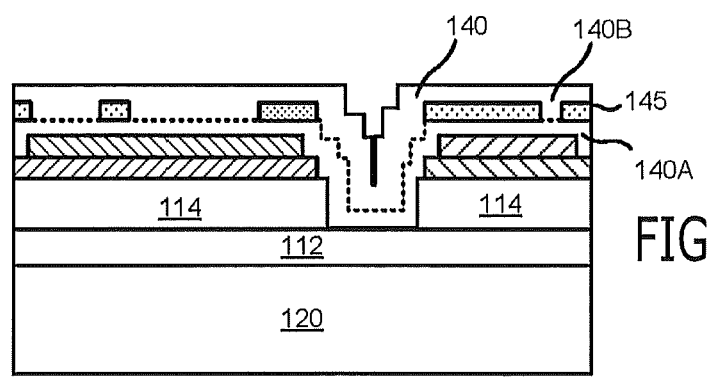

Referring to FIG. 59F, an upper insulating layer 140B may be blanket deposited over the structure. The upper insulating layer 140B may have the same composition or a different composition as the lower insulating layer 140A. The upper insulating layer 140B may include a dielectric material, such as SiN and/or SiO$_2$, and may have a thickness of about 250 nm to about 1 micron. In particular embodiments, the upper insulating layer 140B may include SiN, and may have a thickness of about 500 nm. In some embodiments, the thickness of the upper and lower insulating layers 140A, 140B may be selected based on the level of voltage that such layers may be required to withstand for electrostatic discharge protection. For example, if a portion of the crack reducing interlayer 145 is electrically connected to the cathode contact, the base insulating layer 140A may be required to withstand a voltage of at least about 50 V.

Figure 60B:
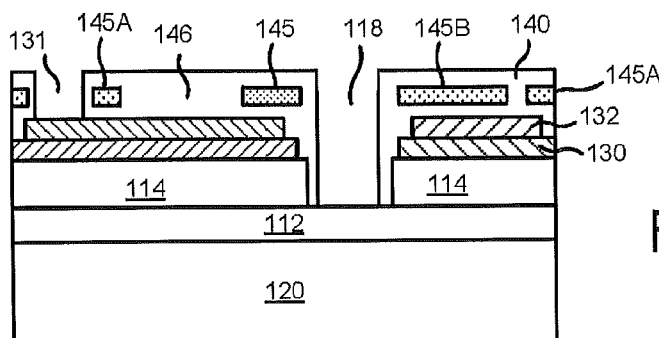
Figure 62:
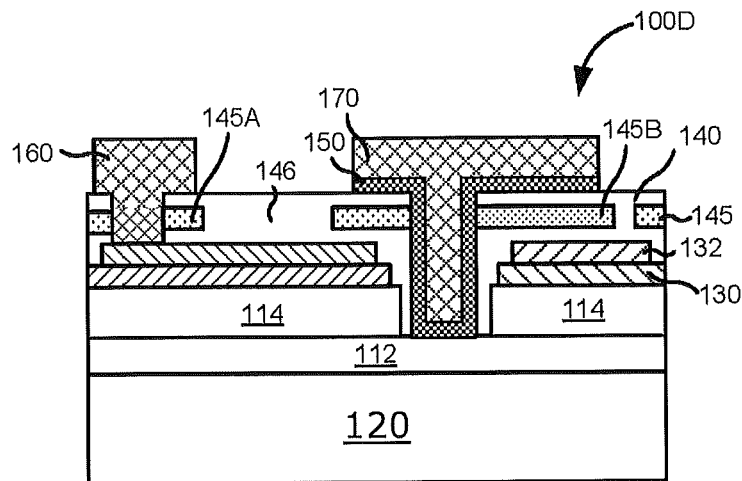
FIGS. 62, 63A, 63B and 64 are cross-sectional views of light emitting diodes according to various further embodiments described herein.

Referring to FIGS. 60A and 60B, the insulating layer 140 including the base insulating layer 140A, the crack reducing interlayer 145 and the upper insulating layer 140B may be patterned to open first and second vias 131 and 118 therein. The first via 131 extends through the insulating layer 140 to the barrier layer 132, while the second via 118 extends through the insulating layer 140 to the n-type layers 112. As shown in FIG. 60B, the crack reducing interlayer 145 may be spaced apart from the vias 131, 118 so that sidewalls of the crack reducing interlayer 145 are not exposed by the vias 131, 118. However, in other embodiments, one or both of the vias 131, 118 may expose portions of the crack reducing interlayer 145, as illustrated in FIG. 62, and discussed in more detail below.

Figure 61A:
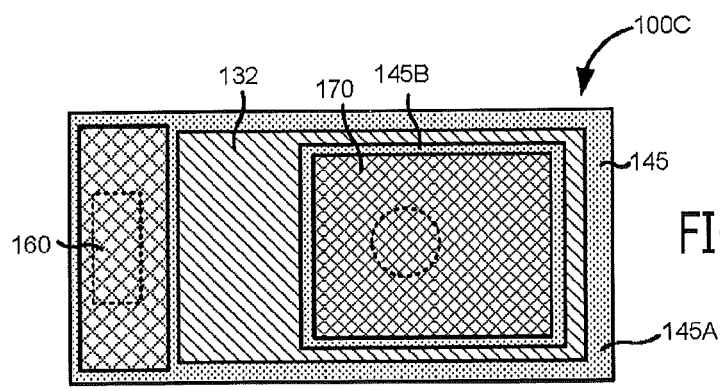
Figure 61B:
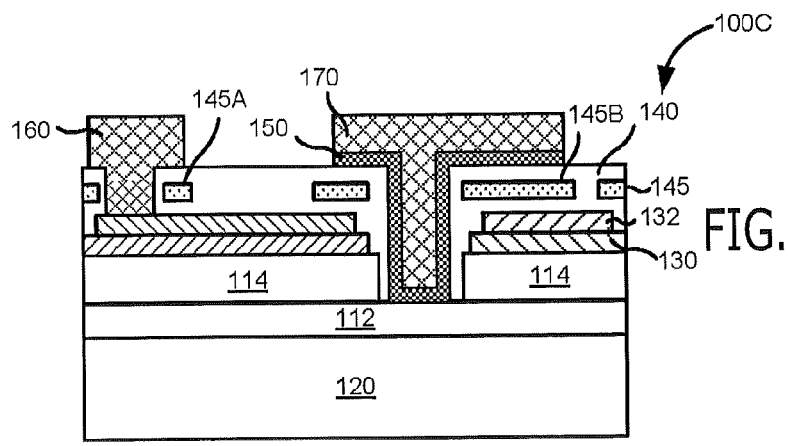

The gap or moat 146 that separates the crack reducing interlayer 145 into two separate portions 145A and 145B is illustrated in FIG. 60A Referring to FIGS. 61A and 61B, a reflective cathode contact 150 is formed within the second via 118, and may extend onto the insulating layer 140 over the p-type layers and over the crack reducing interlayer 145. A cathode bond pad 170 is formed on the reflective cathode contact 150, and an anode bond pad 160 is formed in the first via 131 to contact the barrier layer 132. Additional layers, such as adhesive or bonding layers may also be included. The outside edges of the anode bond pad 160 may be formed within the periphery of the first crack reducing interlayer portion 145A, and the outside edges of the reflective cathode contact 150 and the cathode bond pad 170 may be formed within the periphery of the second crack reducing interlayer portion 145B as best seen, for example, in the plan view of FIG. 61A.

The presence of the crack reducing interlayer 145 within the insulating layer 140 may prevent or reduce cracks that form in the insulating layer 140 from penetrating completely through the insulating layer 140 so as to form migration paths for metal in the device. That is, although cracks can still form in the insulating layer 140, such cracks may not lead to the formation of electrical short circuits that can damage the device. While not wishing to be bound by any particular theory, it is presently believed that the interface between the crack reducing interlayer 145 and the insulating layer 140 provides a mechanical discontinuity that can reduce the propagation of cracks through the insulating layer 140. Accordingly, any material that provides a suitable mechanical discontinuity with the insulating layer 140 may be suitable for use as the crack reducing interlayer 145, regardless of whether such material is electrically conductive or electrically insulating. The material of the crack reducing interlayer 145 may be transparent, reflective, or opaque.

In the mounting process, mechanical stress may be placed on the LED chip through the anode bond pad 160 and/or the cathode bond pad 170. Thus, cracks in the insulating layer 140 may tend to originate underneath these pads. Accordingly, a device according to some embodiments may be designed such that the anode bond pad 160 and the cathode bond pad 170 are formed within the periphery of the respective portions 145A, 145B of the crack reducing interlayer 145, so that any cracks that form in the upper portion 140B of the transparent insulating layer underneath the pads may be less likely to propagate through the insulating layer 140 to the barrier layer 132 or the reflective anode contact 130.

The respective portions 145A, 145B of the crack reducing interlayer 145 may be electrically isolated from one another by the gap 146 (FIG. 60B) to reduce the possibility of a short circuit.

FIG. 62 is a cross sectional view of an LED chip structure 100D in accordance with further embodiments. As shown therein, the portion 145A of the crack reducing interlayer 145 may contact the anode bond pad 160, while the portion 145B of the crack reducing interlayer 145 may contact the cathode bond pad 160 and/or the reflective cathode contact 150. Thus, in embodiments where the crack reducing interlayer 145 includes a conductive material such as aluminum, one or both of the portions 145A, 145B of the crack reducing interlayer 145 may be electrically active. However, as the portions 145A, 145B of the crack reducing interlayer 145 are isolated from one another by the gap or moat 146, such contact may not cause a short circuit.

Figure 63A:
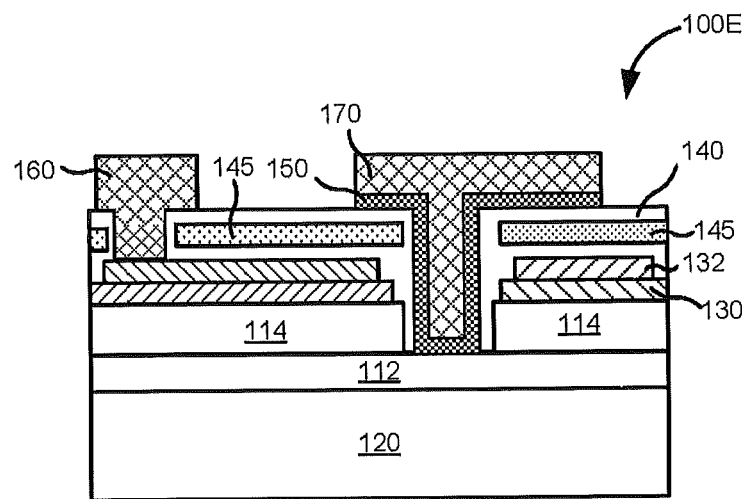

FIG. 63A is a cross sectional view of an LED chip structure 100E in accordance with further embodiments. In the embodiment shown in FIG. 63A, the crack reducing interlayer 145 does not include a gap. However, the crack reducing interlayer 145 is spaced apart from the anode and cathode contacts by portions of the insulating layer 140 so that it is electrically isolated (floating).

Figure 63B:
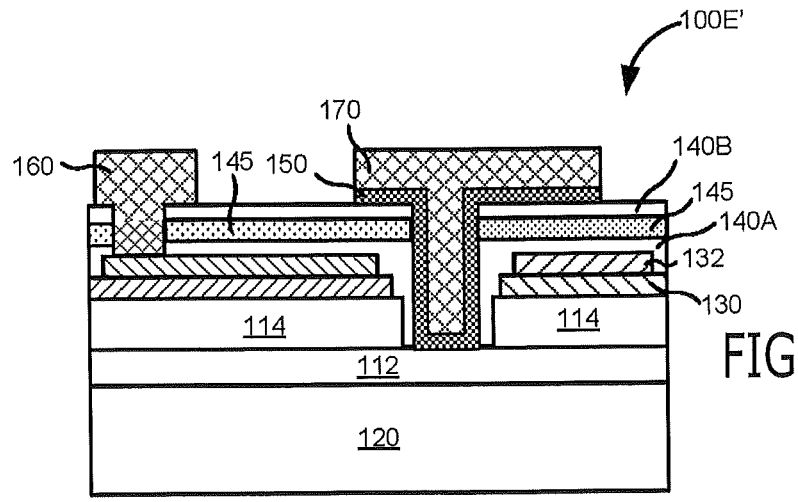

FIG. 63B is a cross sectional view of an LED chip structure 100E' in accordance with further embodiments. In the embodiment shown in FIG. 63B, the crack reducing interlayer 145 does not include a gap and is not spaced apart from the anode and cathode contacts of the device by portions of the insulating layer 140. In the embodiments of FIG. 63B, the crack reducing interlayer 145 may be an electrically insulating material, such as BCB, and the insulating layer 140 may thereby have structure including three distinct layers 140A, 145 and 140B.

Figure 64:
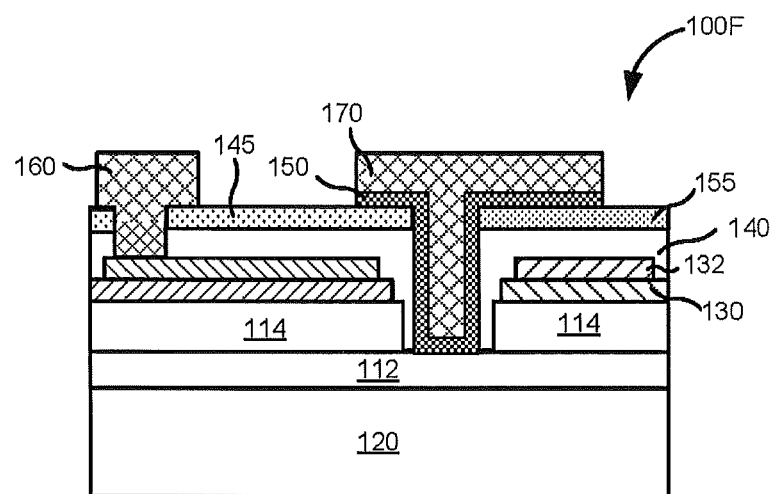

FIG. 64 is a cross sectional view of an LED chip structure 100F in accordance with further embodiments. In the embodiment shown in FIG. 64, a crack reducing layer 155 is on the insulating layer 140 between the insulating layer 140 and the bond pads 160, 170. In the embodiments illustrated in FIG. 64, the crack reducing layer 155 may be formed of an electrically insulating material, such as a polymer.

Figure 65A:
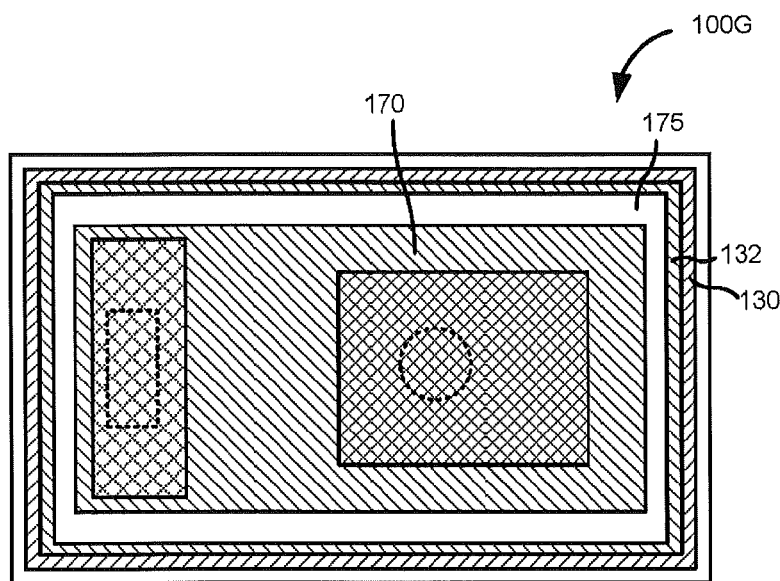
FIG. 65A is a plan view of an LED structure according to some further embodiments described herein.
Figure 65B:
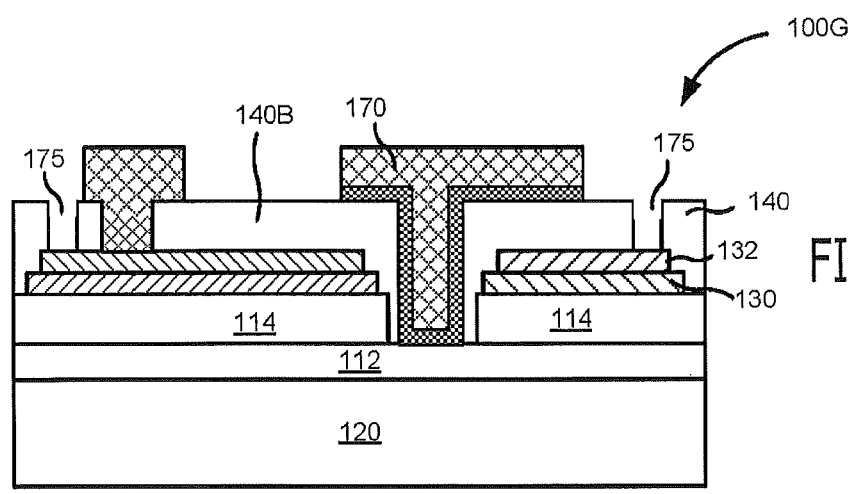
FIGS. 65B and 65C are cross-sectional views of the LED structure of FIG. 65A according to various embodiments described herein.

FIGS. 65A and 65B are a plan view and a cross sectional view, respectively, of an LED device structure 100G that has a crack-tolerant transparent insulating layer according to further embodiments. The LED structure shown in FIGS. 65A and 65B includes an optional substrate 120, n-type layers 112, p-type layers 114, a reflective anode contact 130, a barrier layer 132, an insulating layer 140, an anode bond pad 160 and a cathode bond pad 170.

In the LED structure shown in FIGS. 65A and 65B, the portion 140A of the insulating layer 140 near the peripheral edges of the chip are mechanically isolated from the portions of the insulating layer 140 underneath the anode bond pad 160 and the cathode bond pad 170 by a trench 175 that extends around the anode bond pad 160 and the cathode bond pad 170. The trench 175 extends through the insulating layer 140 to the barrier layer 132.

Peripheral portions 140A of the insulating layer 140 remain on and protect the external edges of the reflective anode contact 130. However, any cracks that may develop underneath the anode bond pad 160 and/or cathode bond pad 170 may not propagate to the external edges of the reflective anode contact that are most susceptible to moisture-assisted metal migration. Accordingly, cracks that form in the insulating layer 140 underneath the anode bond pad 160 and/or cathode bond pad 170 may not result in undesirable short circuits due to metal migration.

An optional second passivation layer including about 150 nm of SiN may be deposited on the structure to cover the portions of the barrier layer 132 exposed by the trench 175.

Figure 65C:
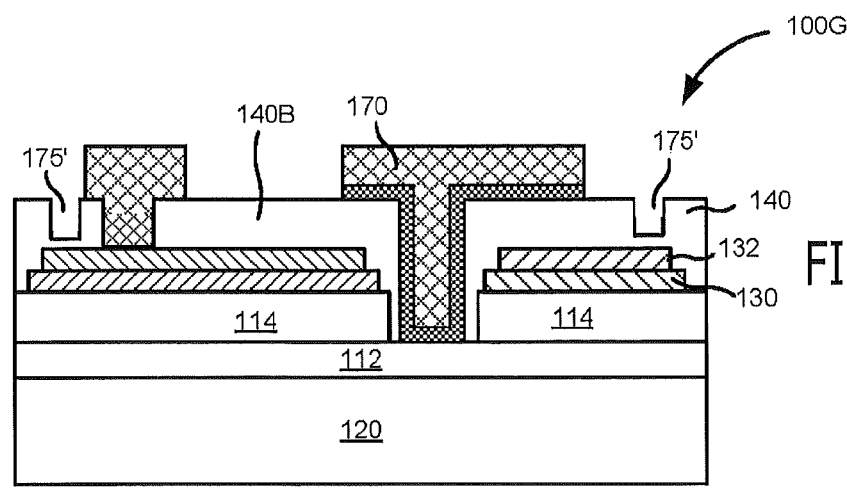

FIG. 65C is a cross sectional view of a device structure 100G' in accordance with further embodiments. The device structure 100G' is similar to the device structure 100G shown in FIG. 65B, except that the trench 175' does not extend completely through the insulating layer 140 to contact the barrier layer 132. Even though the trench 175' does not extend completely through the insulating layer 140, the trench 175' may still be effective to block a significant number of cracks from propagating to the edge of the structure and causing failures, while still providing protection to the entire upper surface of the barrier layer 132. Thus, the trench 175' may not need to provide physical complete separation of the insulating layer 140 to be effective.

Figure 66A:
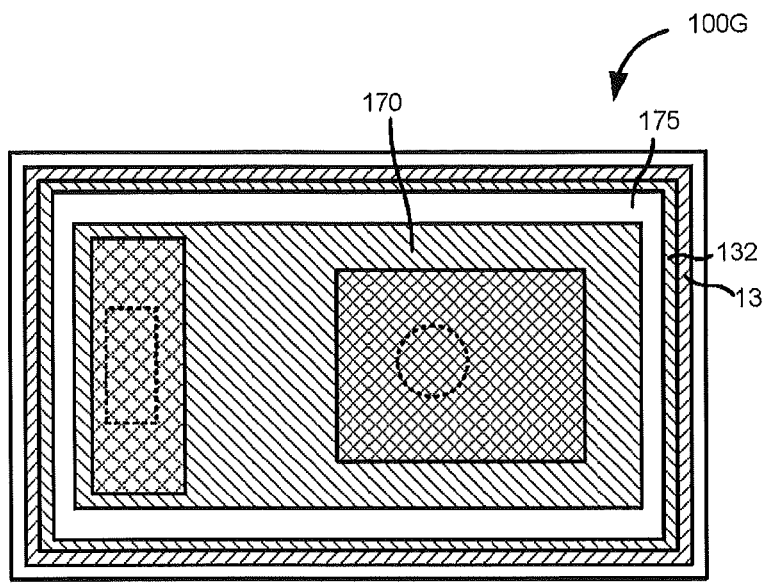
FIG. 66A is a plan view of an LED structure according to some further embodiments described herein.
Figure 66B:
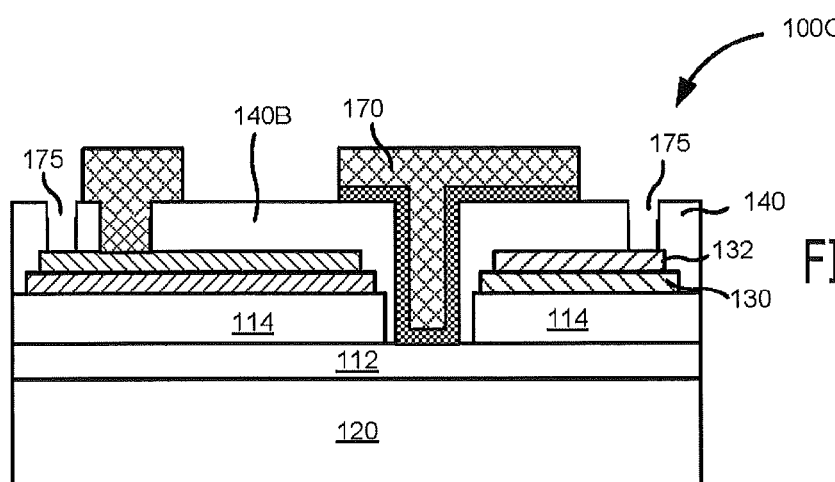
FIGS. 66B and 66C are cross-sectional views of the LED structure of FIG. 66A according to various embodiments described herein.

Reference is now made to FIGS. 66A and 66B, which are a plan view and a cross sectional view respectively of an LED device structure 100H that has a crack-tolerant insulating layer according to still further embodiments. The LED structure 100H includes both a trench 175 for mechanically isolating peripheral portions 140A of an insulating layer 140 as well as an crack reducing interlayer 145 within the insulating layer 140 for preventing or reducing the propagation of cracks through the insulating layer 140. The combination of both an crack reducing interlayer 145 and a trench 175 may further reduce the possibility of unwanted metal migration in the structure.

Figure 66C:
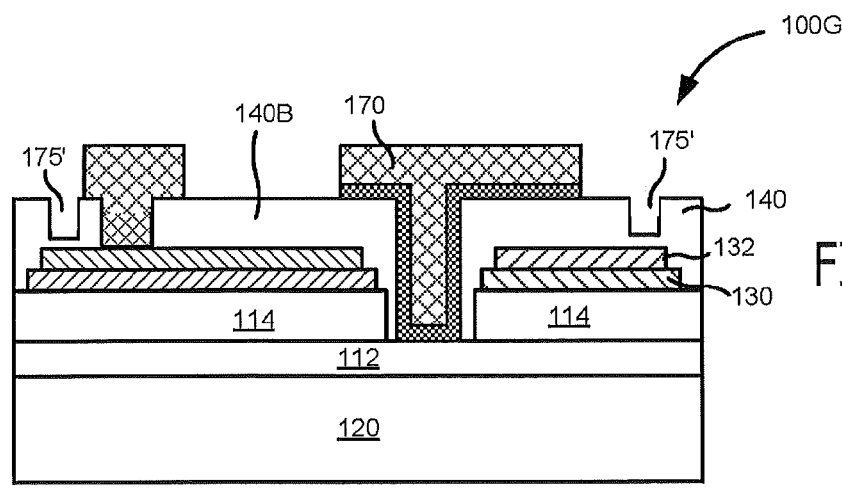

FIG. 66C is a cross sectional view of an LED structure 100H' according to still further embodiments. In the LED structure 100H', the crack reducing interlayer 145 is set back from the sidewalls of the trench 175. That is, the crack reducing interlayer 145 is insulated from the sidewalls of the trench 175 by portions of the insulating layer 140.

Various embodiments have been described herein in connection with operational flowcharts including flowchart blocks. It should be noted that in some alternate embodiments, the functions/acts noted in the blocks may occur out of the order noted in the flowcharts unless expressly stated to the contrary herein. For example, two blocks shown in succession may in fact be executed substantially concurrently or the blocks may sometimes be executed in the reverse order, depending upon the functionality/acts involved, unless expressly stated to the contrary herein. Moreover, the functionality of a given block of the flowcharts may be separated into multiple blocks and/or the functionality of two or more blocks may be at least partially integrated. Finally, other blocks may be added/inserted between the blocks that are illustrated.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the specification, there have been disclosed embodiments of the invention and, although specific terms are employed, they are used in a generic and descriptive sense only and not for purposes of limitation, the scope of the invention being set forth in the following claims.

What is claimed is:

1. A Light Emitting Diode (LED) chip, comprising:
   an LED substrate including a plurality of LED dies, a respective LED die including an anode and a cathode;
   a patterned internal interconnection layer that is internal to the plurality of LED dies and that is configured to selectively electrically connect the anodes and cathodes of the plurality of LED dies in series and/or in parallel internal to the plurality of LED dies;
   an LED die anode contact that is electrically connected to at least one of the anodes; and
   an LED die cathode contact that is electrically connected to at least one of the cathodes,
   wherein the patterned internal interconnection layer that is internal to the plurality of LED dies includes a first patterned internal interconnection layer face and a second patterned internal interconnection layer face that is opposite the first patterned internal interconnection layer face,
   wherein each of the plurality of LED dies includes a first layer that is on the first patterned internal interconnection layer face opposite the second patterned internal interconnection layer face, and a second layer that is on the second patterned internal interconnection layer face opposite the first patterned internal interconnection layer face,
   wherein the LED die anode contact penetrates through the first and second layers, penetrates through the first patterned internal interconnection layer face, penetrates through the second patterned internal interconnection layer face, electrically connects to the patterned internal interconnection layer and electrically connects to the at least one of the anodes, and
   wherein the LED die cathode contact penetrates through the first and second layers, penetrates through the first patterned internal interconnection layer face, penetrates through the second patterned internal interconnection layer face, electrically connects to the patterned internal interconnection layer and electrically connects to the at least one of the cathodes.

2. The LED chip according to claim 1 wherein the first and second layers comprise first and second insulating layers, respectively, and the patterned internal interconnection layer comprises a patterned internal metal layer.

3. The LED chip according to claim 1 further comprising:
   a carrier die having first and second opposing faces, the carrier die having a first anode contact and a first cathode contact on the first face and a second anode contact and a second cathode contact on the second face, the carrier die being joined to the LED substrate so that the plurality of LED dies are adjacent the first face, the first anode contact is electrically connected to the LED die anode contact and the first cathode contact is electrically connected to the LED die cathode contact.

4. The LED chip according to claim 3 wherein the LED substrate includes beveled sidewalls between adjacent LED dies.

5. The LED chip according to claim 4 wherein the LED substrate includes a beveled edge at a periphery thereof.

6. The LED chip according to claim 4 further comprising a wavelength conversion material layer on the LED substrate remote from the carrier die, and extending onto the beveled sidewalls between adjacent LED dies, the wavelength conversion material layer including opposing surfaces that both conform to the beveled sidewalls between adjacent LED dies.

7. The LED chip according to claim 5 further comprising a wavelength conversion material layer on the LED substrate remote from the carrier die, and extending onto the beveled sidewalls between adjacent LED dies and onto the beveled edge at the periphery of the LED substrate, the wavelength conversion material layer including opposing surfaces that both conform to the beveled sidewalls between adjacent LED dies and to the beveled edge at the periphery of the LED substrate.

8. The LED chip according to claim 7 wherein the wavelength conversion material layer further extends onto a sidewall of the LED die at the periphery of the LED substrate.

9. The LED chip according to claim 3 further comprising:
a mounting substrate on the second face of the carrier die and electrically connected to the second anode contact and the second cathode contact.

10. The LED chip according to claim 3 in combination with:
a light fixture housing in which the carrier die is mounted to provide a light fixture.

11. The LED chip according to claim 3 wherein the carrier die further comprises at least one thermal contact on the first and/or second face.

12. The LED chip according to claim 3 wherein the carrier die comprises silicon.

13. The LED chip according to claim 3 wherein the carrier die comprises an internal reflector between the first and second faces thereof.

14. The LED chip according to claim 1 wherein the patterned internal interconnection layer comprises:
a crack reducing layer that is configured to reduce propagation of cracks between the first and second layers; and
a crack reducing layer extension that extends from the crack reducing layer to selectively electrically connect the anodes and cathodes of the plurality of LED dies in series and/or in parallel internal to the plurality of LED dies.

15. A Light Emitting Diode (LED) chip, comprising:
a plurality of LED dies in a common substrate, a respective one of which includes an anode contact and a cathode contact on a face thereof;
a carrier die having first and second opposing faces, a plurality of internal contacts on the first face and an external anode contact and an external cathode contact on the second face, wherein the plurality of LED dies in the common substrate includes a patterned internal interconnection layer that is internal to the plurality of LED dies and that is configured to electrically connect the anode and cathode contacts of the plurality of LED dies in series and/or in parallel internal to the plurality of LED dies;

the plurality of LED dies and the carrier die being joined to one another so that the anode and cathode contacts of the LED dies are adjacent the first face of the carrier die and the anode and cathode contacts of the plurality of LED dies are connected in series and/or in parallel, wherein the patterned internal interconnection layer that is internal to the plurality of LED dies includes a first patterned internal interconnection layer face and a second patterned internal interconnection layer face that is opposite the first patterned internal interconnection layer face, wherein each of the plurality of LED dies includes a first layer that is on the first patterned internal interconnection layer face opposite the second patterned internal interconnection layer face, and a second layer that is on the second patterned internal interconnection layer face opposite the first patterned internal interconnection layer face, wherein the anode contact penetrates through the first and second layers, penetrates through the first patterned internal interconnection layer face, penetrates through the second patterned internal interconnection layer face and electrically connects to the patterned internal interconnection layer, and wherein the cathode contact penetrates through the first and second layers, penetrates through the first patterned internal interconnection layer face, penetrates through the second patterned internal interconnection layer face and electrically connects to the patterned internal interconnection layer.

16. The LED chip according to claim 15 wherein the patterned internal interconnection layer comprises:
a crack reducing layer that is configured to reduce propagation of cracks between the first and second layers; and
a crack reducing layer extension that extends from the crack reducing layer to selectively electrically connect the anodes and cathodes of the plurality of LED dies in series and/or in parallel internal to the plurality of LED dies.

* * * * *